US012660646B2

(12) United States Patent
Hou et al.

(10) Patent No.: US 12,660,646 B2
(45) Date of Patent: Jun. 16, 2026

(54) SEMICONDUCTOR PACKAGE AND METHOD OF FORMING THE SAME

(71) Applicant: Taiwan Semiconductor Manufacturing Co., Ltd., Hsinchu (TW)

(72) Inventors: Hao-Cheng Hou, Hsinchu (TW); Tsung-Ding Wang, Tainan (TW); Jung Wei Cheng, Hsinchu (TW); Yu-Min Liang, Zhongli City (TW); Chien-Hsun Lee, Chu-tung Town (TW); Shang-Yun Hou, Jubei City (TW); Wei-Yu Chen, Hsinchu (TW); Collin Jordon Fleshman, Hsinchu (TW); Kuo-Lung Pan, Hsinchu (TW); Shu-Rong Chun, Hsinchu (TW); Sheng-Chi Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 479 days.

(21) Appl. No.: 18/151,583

(22) Filed: Jan. 9, 2023

(65) Prior Publication Data

US 2023/0307375 A1 Sep. 28, 2023

Related U.S. Application Data

(60) Provisional application No. 63/375,440, filed on Sep. 13, 2022, provisional application No. 63/322,852, filed on Mar. 23, 2022.

(51) Int. Cl.
*H01L 23/31* (2006.01)
*H01L 21/56* (2006.01)
(Continued)

(52) U.S. Cl.
CPC ........ *H01L 23/5385* (2013.01); *H01L 21/561* (2013.01); *H01L 23/3121* (2013.01);
(Continued)

(58) Field of Classification Search
CPC .............. H01L 23/5385; H01L 21/561; H01L 23/3121; H01L 23/481
See application file for complete search history.

(56) References Cited

U.S. PATENT DOCUMENTS 8,361,842 B2 1/2013 Yu et al.
8,680,647 B2 3/2014 Yu et al.
(Continued)

FOREIGN PATENT DOCUMENTS

KR 20200027419 A 3/2020
KR 20210133106 A 11/2021
(Continued)

*Primary Examiner* — Thao P Le
(74) *Attorney, Agent, or Firm* — Slater Matsil, LLP

(57) ABSTRACT

A method includes forming a composite package substrate. The formation of the composite package substrate includes encapsulating an interconnect die in an encapsulant, with the interconnect die including a plurality of through-vias therein, and forming a first plurality of redistribution lines (RDLs) and a second plurality of RDLs on opposite sides of the interconnect die. The method further includes bonding an organic package substrate to the composite package substrate, and bonding a first package component and a second package component to the first plurality of RDLs. The first package component and the second package component are electrically interconnected through the interconnect die and the first plurality of RDLs.

20 Claims, 78 Drawing Sheets

(51) Int. Cl.

| | |
|---|---|
| *H01L 23/00* | (2006.01) |
| *H01L 23/48* | (2006.01) |
| *H01L 23/538* | (2006.01) |
| *H01L 25/00* | (2006.01) |
| *H01L 25/18* | (2023.01) |
| *H10B 80/00* | (2023.01) |

(52) U.S. Cl.
CPC .......... *H01L 23/481* (2013.01); *H01L 23/562* (2013.01); *H01L 24/19* (2013.01); *H01L 24/20* (2013.01); *H01L 25/18* (2013.01); *H01L 25/50* (2013.01); *H10B 80/00* (2023.02); *H01L 24/16* (2013.01); *H01L 24/29* (2013.01); *H01L 24/32* (2013.01); *H01L 24/73* (2013.01); *H01L 2224/16227* (2013.01); *H01L 2224/19* (2013.01); *H01L 2224/211* (2013.01); *H01L 2224/2929* (2013.01); *H01L 2224/29386* (2013.01); *H01L 2224/32225* (2013.01); *H01L 2224/73204* (2013.01); *H01L 2924/0503* (2013.01); *H01L 2924/05432* (2013.01); *H01L 2924/05442* (2013.01); *H01L 2924/0665* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,653,442 B2 * | 5/2017 | Yu | H01L 21/4853 |
| 10,115,647 B2 * | 10/2018 | Huang | H01L 23/49827 |
| 10,720,401 B2 * | 7/2020 | Ting | H01L 21/4857 |
| 11,094,635 B2 | 8/2021 | Chang et al. | |
| 11,355,463 B2 | 6/2022 | Wu et al. | |
| 11,955,442 B2 | 4/2024 | Wu et al. | |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2016/0197037 A1 | 7/2016 | Starkston et al. | |
| 2017/0110407 A1 | 4/2017 | Chaware et al. | |
| 2019/0109122 A1 | 4/2019 | Ong et al. | |
| 2020/0043853 A1 | 2/2020 | Kim et al. | |
| 2020/0402816 A1 * | 12/2020 | Lin | H01L 23/5389 |
| 2021/0020574 A1 | 1/2021 | Yu et al. | |
| 2021/0193579 A1 | 6/2021 | Ganesan et al. | |
| 2021/0313271 A1 | 10/2021 | Tsai et al. | |
| 2021/0366863 A1 | 11/2021 | Wu et al. | |
| 2023/0307375 A1 * | 9/2023 | Hou | H01L 23/5385 |
| 2023/0343765 A1 * | 10/2023 | Jeng | H01L 21/4857 |
| 2024/0071847 A1 * | 2/2024 | Liao | H01L 23/053 |
| 2024/0071849 A1 * | 2/2024 | Chen | H01L 23/49816 |
| 2024/0162166 A1 * | 5/2024 | Huang | H01L 23/3736 |
| 2024/0234273 A1 * | 7/2024 | Liu | H01L 23/3128 |
| 2024/0274590 A1 * | 8/2024 | Yu | H01L 23/5384 |

FOREIGN PATENT DOCUMENTS

| | | |
|---|---|---|
| KR | 20210143633 A | 11/2021 |
| TW | 202139402 A | 10/2021 |

* cited by examiner

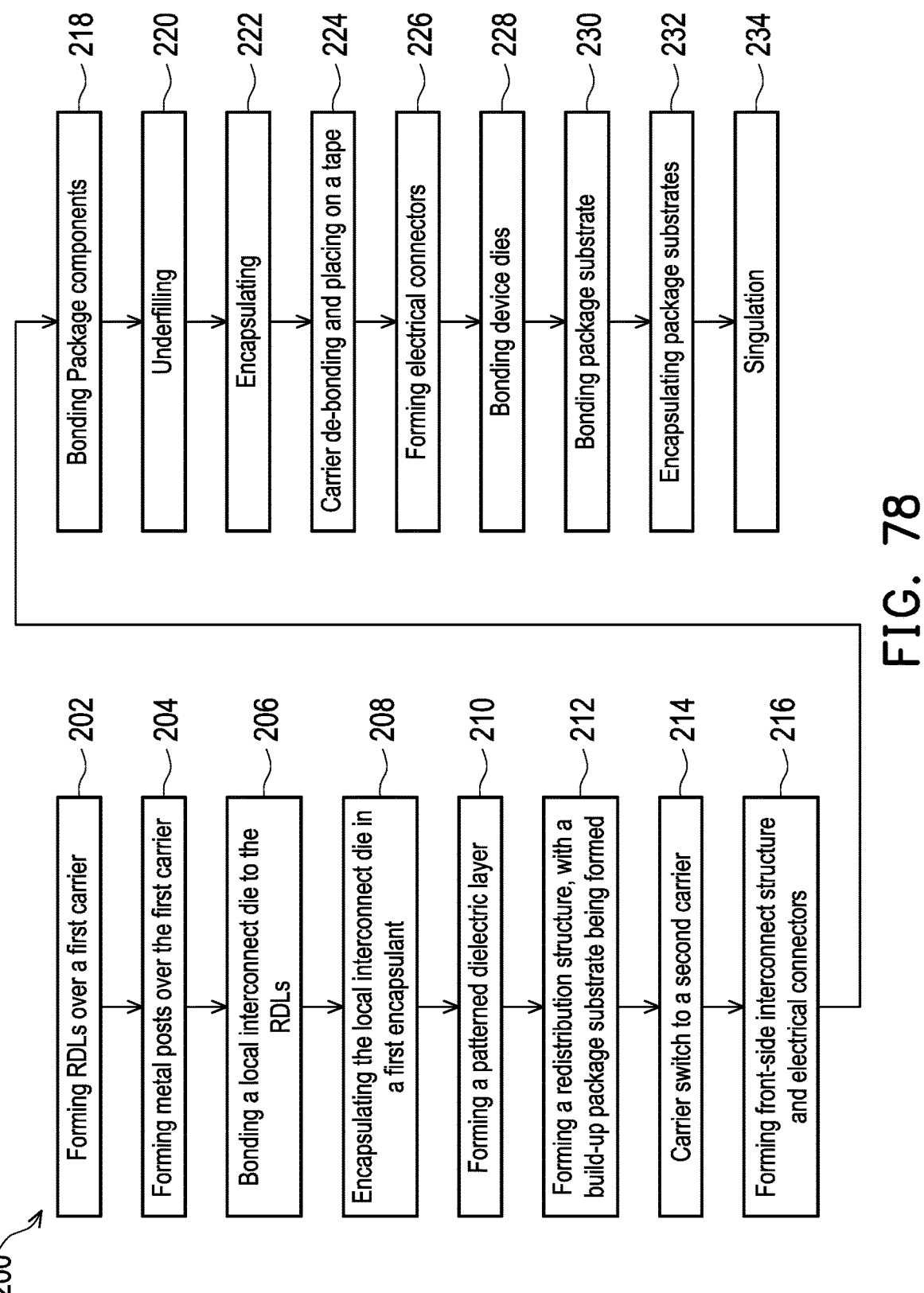

202 Forming RDLs over a first carrier

204 Forming metal posts over the first carrier

206 Bonding a local interconnect die to the RDLs

208 Encapsulating the local interconnect die in a first encapsulant

210 Forming a patterned dielectric layer

212 Forming a redistribution structure, with a build-up package substrate being formed 214 Carrier switch to a second carrier 216 Forming front-side interconnect structure and electrical connectors 218 Bonding Package components 220 Underfilling 222 Encapsulating 224 Carrier de-bonding and placing on a tape 226 Forming electrical connectors 228 Bonding device dies 230 Bonding package substrate 232 Encapsulating package substrates 234 Singulation

SEMICONDUCTOR PACKAGE AND METHOD OF FORMING THE SAME

PRIORITY CLAIM AND CROSS-REFERENCE

This application claims the benefit of U.S. Provisional Application No. 63/375,440, filed on Sep. 13, 2022, and entitled "Semiconductor Package and Method of Forming the Same," and U.S. Provisional Application No. 63/322,852, filed on Mar. 23, 2022, and entitled "Semiconductor Package," which applications are incorporated herein by reference. This application also is correlated to U.S. patent application Ser. No. 17/806,329, filed on Jun. 10, 2022, and entitled "Semiconductor Package and Method of Forming the Same".

BACKGROUND

Integrated circuits are having increasingly more functions. In order to integrate more functions together, a plurality of device dies are manufactured, and are packaged together in a packaging process(es). The plurality of device dies are electrically interconnected so that they may work together. With the increase in the size and complexity in the packages, warpages was also increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 78 illustrates a process flow for forming a package in accordance with some embodiments.

DETAILED DESCRIPTION

Figure 1:
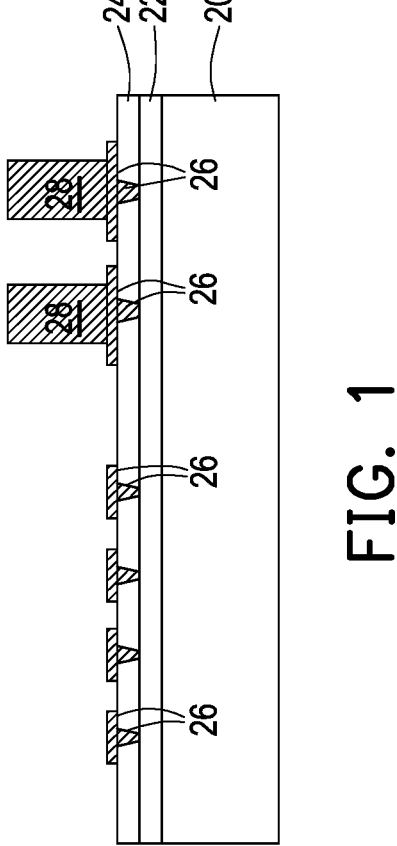
FIGS. 1-16 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A packaging process and the resulting packages are provided. In accordance with some embodiments, an Integrated Fan-Out (InFO) package substrate (also referred to as a composite package substrate) is formed, with a Local Silicon Interconnect (LSI) die embedded therein. The InFO package substrate may be a wafer-level package component including a plurality of identical InFO package substrates therein. The InFO package substrate is built layer-by-layer, and extends laterally beyond the edges of the respective underlying device dies. The InFO package substrate may be bonded with another package component such as an organic package substrate. Discrete package components such as device dies, High-Bandwidth Memories (HBMs), Chip-on-Wafer packages, and the like may be bonded directly to the InFO package substrate. Since the LSI die is built in the InFO package substrate, rather than being embedded in a Chip-on-Wafer-on-Substrate package that are bonded on a package substrate, the warpage of the resulting package is reduced, and the manufacturing yield is improved. The Chip-on-Wafer-on-Substrate package may include discrete device dies bonded to a wafer, and then the wafer is sawed to form discrete Chip-on-Wafer packages, which are then bonded to package substrates to form the Chip-on-Wafer-on-Substrate packages. This enables the formation of super large packages (for example, with 6× reticle or beyond). The insertion loss is also reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 17 illustrate the cross-sectional views of intermediate stages in the formation of a package including an LSI die in accordance with some embodiments. The corresponding processes are also reflected schematically in the process flow 200 as shown in FIG. 78.

Referring to FIG. 1, carrier 20 is provided, and release film 22 is coated on carrier 20. Carrier 20 is formed of a transparent material, and may be a glass carrier, a ceramic carrier, or the like. Release film 22 may be formed of a Light-To-Heat-Conversion (LTHC) coating material. Release film 22 may be applied onto carrier 20 through coating. In accordance with some embodiments, the LTHC coating material is capable of being decomposed under the heat of light/radiation (such as laser), and hence can release carrier 20 from the structure formed thereon.

In accordance with some embodiments, as shown in FIG. 1, dielectric layer 24 is formed on release film 22. Dielectric layer 24 may be formed of or comprise a polymer, which may be a photo-sensitive polymer such as polybenzoxazole (PBO), polyimide, benzocyclobutene (BCB), or the like.

Redistribution Lines (RDLs) 26 are then formed. RDLs 26 include via portions extending into dielectric layer 24, and trace portions over dielectric layer 24. The respective process is illustrated as process 202 in the process flow 200 as shown in FIG. 78. The formation of RDLs 26 may include patterning dielectric layer 24 to form openings (occupied by the via portions), and depositing a metal seed layer. The metal seed layer includes some portions over dielectric layer 24, and some portions extending into dielectric layer 24. In accordance with some embodiments, the metal seed layer includes a titanium layer and a copper layer over the titanium layer. The metal seed layer may be formed, for example, using Physical Vapor Deposition (PVD), Chemical Vapor Deposition (CVD), or the like. Next, a patterned plating mask (not shown) is applied and patterned, with openings formed therein, through which some portions of metal seed layer are exposed. The patterned plating mask may include a photoresist. A metallic material is then deposited on the exposed portions of the metal seed layer, followed by the removal of the plating mask to expose the underlying portions of the metal seed layer. The metallic material may include Cu, Al, Ti, W, Au, or the like. The exposed portions of the metal seed layer are then removed, leaving RDLs 26. It is appreciated that although the via portions and the trace portions of RDLs 26 are illustrated as having interfaces therebetween, there may not be interfaces when the above-recited processes are adopted.

After the formation of RDLs 26, metal posts 28 may be formed. The respective process is illustrated as process 204 in the process flow 200 as shown in FIG. 78. It is appreciated that although one RDL layer is shown as an example, more layers (such as 2, 3, 4 or more layers) of RDLs 28, depend in the routing requirement. The formation of metal posts 28 may include depositing a metal seed layer over RDLs 26, and forming a patterned plating mask, through which some portions of the metal seed layer are exposed. A plating process is then performed to plate a metallic material into the openings in the plating mask. The plating mask is then removed, followed by the etching of the exposed portions of the metal seed layer to form metal posts 28.

Figure 2:
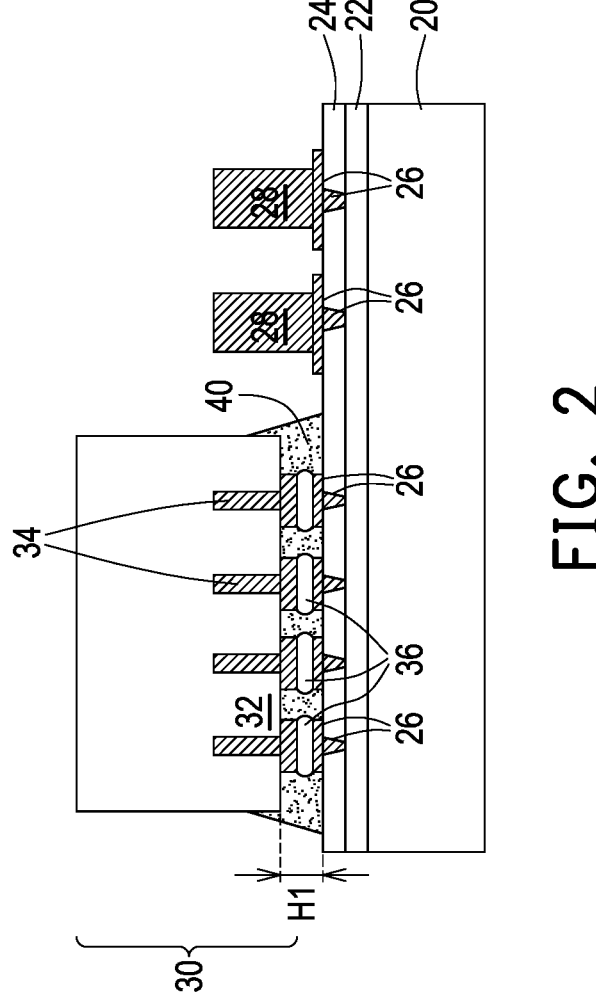
Figure 28:
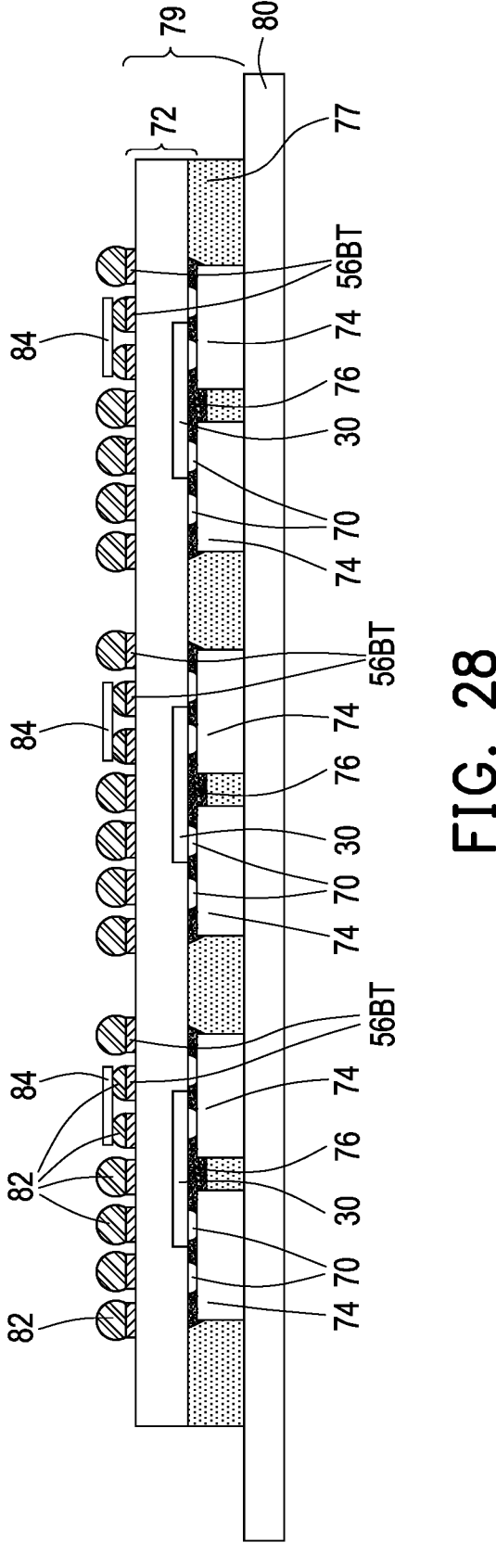

FIG. 2 illustrates the bonding of LSI die 30 to RDLs 26. The respective process is illustrated as process 206 in the process flow 200 as shown in FIG. 78. Although one LSI die 30 is illustrated, there may be a plurality of LSI dies 30 being bonded. The plurality of LSI dies 30 may have the identical structure or different structures. LSI die 30 is illustrated schematically, and the detailed structure is shown in FIG. 28 in accordance with some embodiments.

Figure 77:
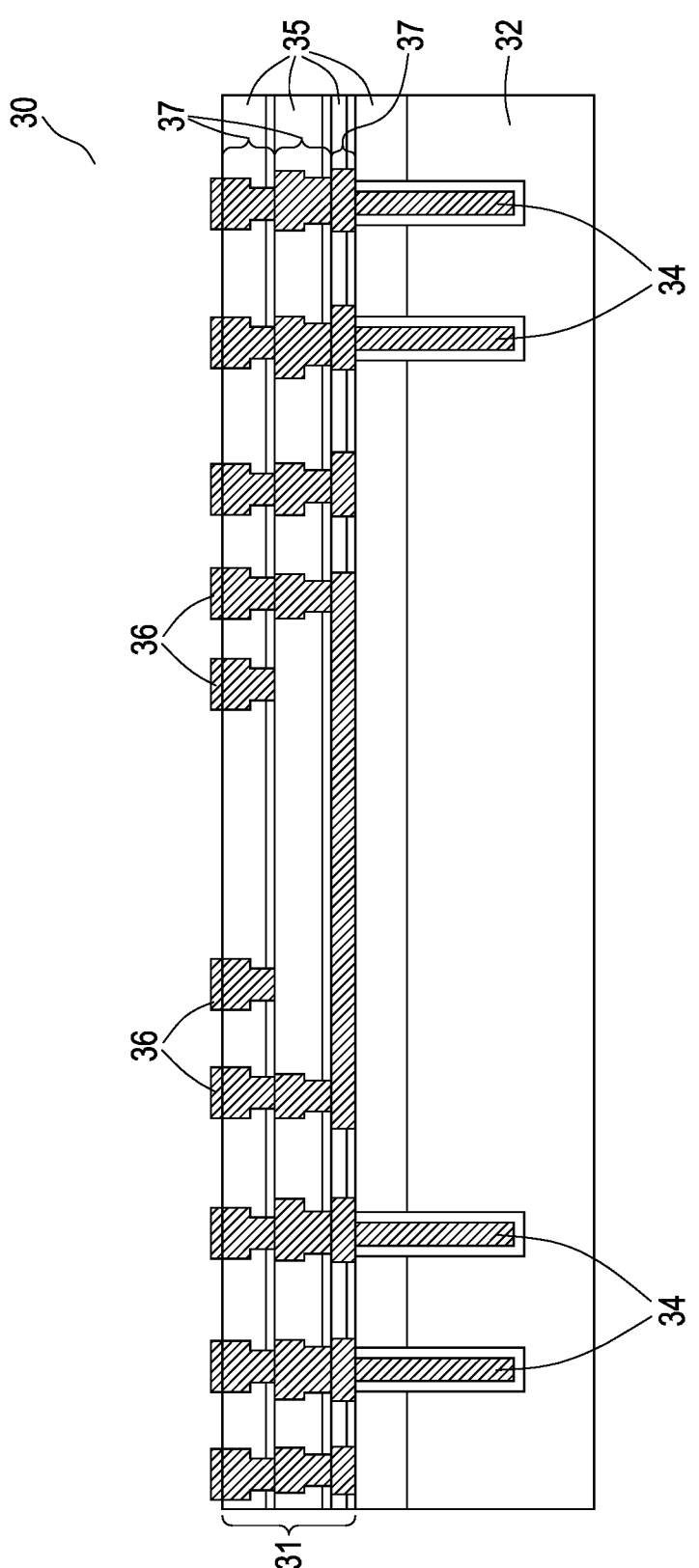
FIG. 77 illustrates the cross-sectional view of an interconnect die in accordance with some embodiments.

FIG. 77 illustrates an example LSI die 30 in accordance with some embodiments. LSI die 30 includes substrate 32, which may be a semiconductor substrate such as a silicon substrate. Substrate 32 may also be a dielectric substrate, which is formed of a dielectric material such as silicon oxide, silicon nitride, or the like. In accordance with some embodiments, through-vias 34 are formed to extend into substrate 32. Accordingly, through-vias 34 are shown using dashed lines to indicate that through-vias 34 may or may not be formed.

In accordance with some embodiments, LSI die 30 is free from active devices such as transistors and diodes therein. LSI die 30 may or may not be free from passive devices such as capacitors, transformers, inductors, resistors, and the like. In accordance with alternative embodiments of the present disclosure, LSI die 30 include some active devices and/or passive devices (not shown), and the active devices may be formed at the top surfaces of semiconductor substrate 32.

LSI die 30 further includes interconnect structure 31 over substrate 32. Interconnect structure 31 further includes dielectric layers 35 and metal lines and vias 37 in the dielectric layers. The dielectric layers 35 may include Inter-Metal Dielectric (IMD) layers. In accordance with some embodiments, some of the dielectric layers 35 (such as lower dielectric layers 35) are formed of low-k dielectric materials having dielectric constant values (k-value) lower than 3.8, and the k-values may be lower than about 3.0 or about 2.5. The low-k dielectric layers 35 may be formed of a carbon-containing low-k dielectric material, Hydrogen SilsesQui-oxane (HSQ), MethylSilsesQuioxane (MSQ), or the like. The formation of metal lines and vias 37 may include single damascene and dual damascene processes. Electrical connectors 36, which may be or may include metal pillars or metal pads (and may or may not include solder regions), are formed at the surface of LSI die 30.

Referring back to FIG. 2, in accordance with some embodiments, the bonding of LSI die 30 to RDLs 26 may be through solder bonding or metal-to-metal direct bonding. For example, the bonding may be performed through solder regions 38. After the bonding, underfill 40 is dispensed into the gap between LSI die 30 and the underlying RDLs 26. The gap may have height H1 in the range between about 80 μm and about 10 μm. In accordance with some embodiments, underfill 40 may include a base material 40A (FIG. 76), which may include a polymer, a resin, an epoxy, and/or the like, and filler particles 40B in the base material 40A. The filler particles 40B may be dielectric particles of silica, alumina, boron nitride, or the like, and may have spherical shapes.

Figure 17:
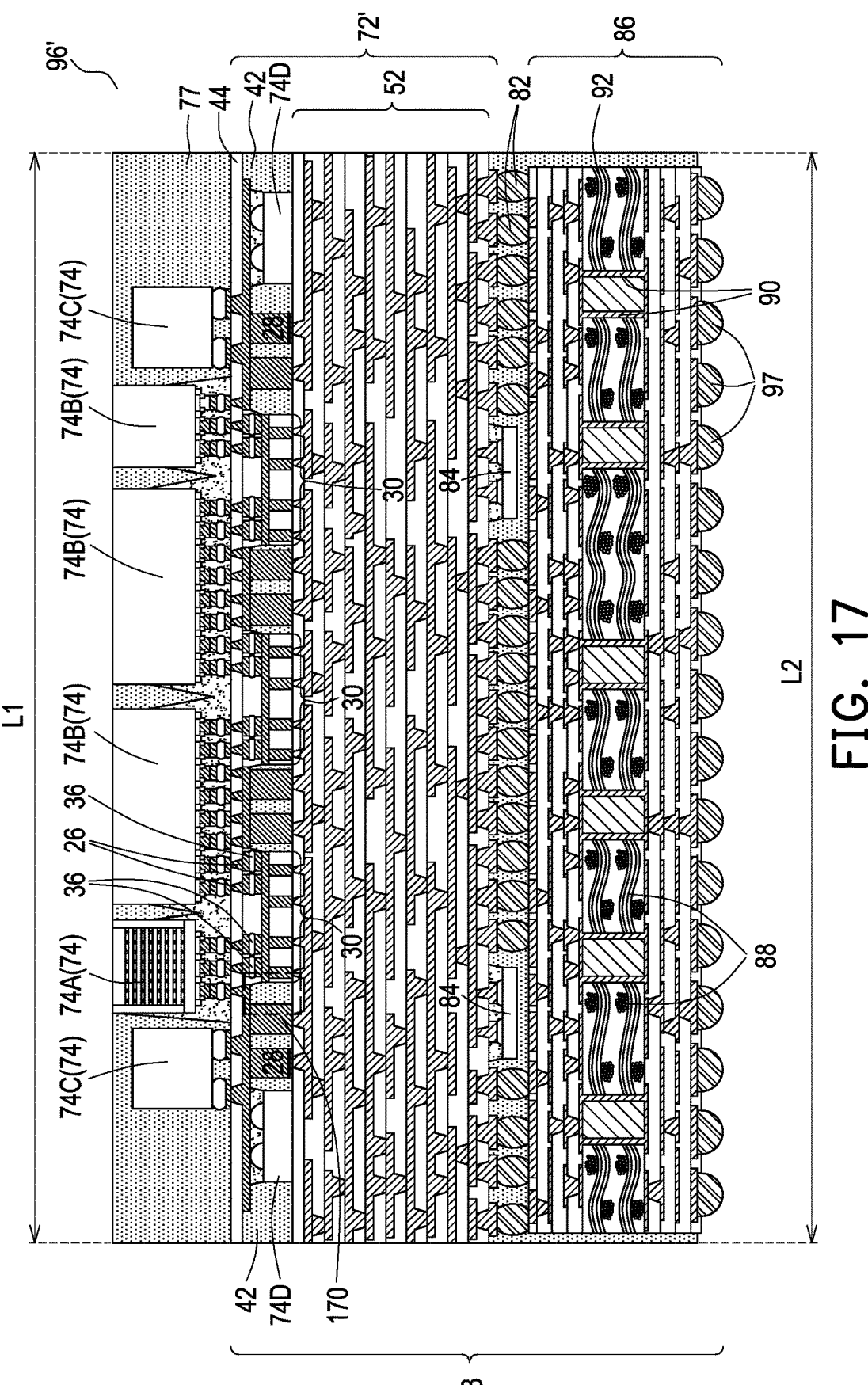
FIG. 17 illustrates a cross-sectional view of a package in accordance with some embodiments.

In accordance with some embodiments, in addition to LSI die 30, additional device dies may also be bonded to RDLs 26. For example, FIG. 17 illustrates device dies 74D that are also bonded. In accordance with some embodiments, device dies 74D are IPDs, which may include capacitors, inductors, resistors, or the like therein. In accordance with alternative embodiments, there is no device die that includes either active devices and/or passive devices bonded. The bottom surfaces of device dies 74D may be in contact with dielectric layer 44 (which is formed in the process shown in FIG. 5), or may be spaced apart from dielectric layer 44 by some portions of encapsulant 42.

Figure 3:
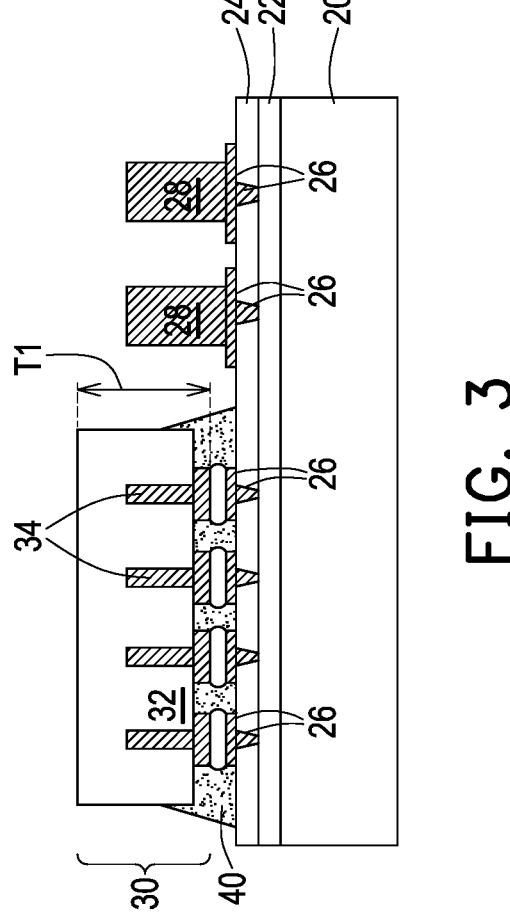

Referring to FIG. 3, a thinning process is performed to thin substrate 32 in LSI die 30. The remaining substrate 32 may have thickness T1 smaller than about 200 μm. Thickness T1 may also be in the range between about 100 μm and about 200 μm. The thinning process may reduce the aspect ratio of the gaps between neighboring LSI dies 30 and metal posts 28.

Figure 4:
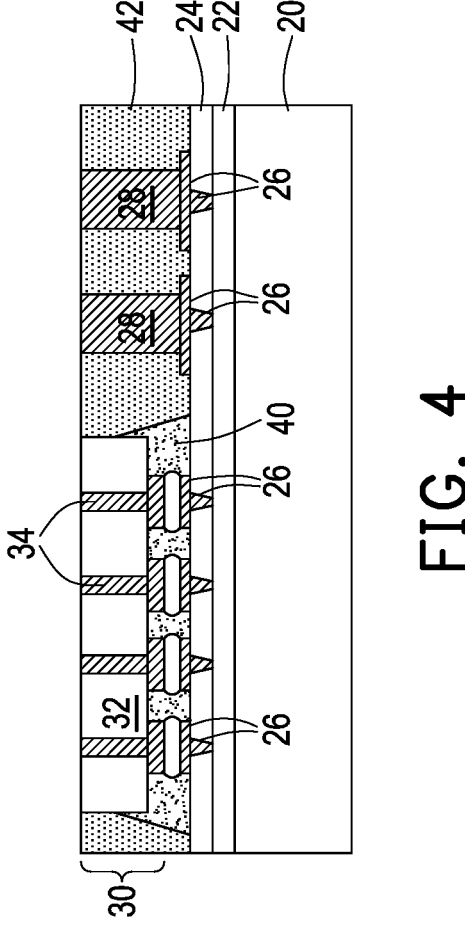

Next, encapsulant 42 is dispensed to encapsulate LSI die 30 and metal posts 28 therein, as shown in FIG. 4. The respective process is illustrated as process 208 in the process flow 200 as shown in FIG. 78. Encapsulant 42 fills the gaps between neighboring metal posts 28 and the gaps between metal posts 28 and LSI die 30. Encapsulant 42 may include a molding compound, a molding underfill, an epoxy, and/or a resin. When the encapsulation is finished, the top surface of encapsulant 42 is higher than the top ends of metal posts 28 and the top surfaces of LSI die 30. Encapsulant 42 may include a base material 42A (FIG. 76), which may be a polymer, a resin, an epoxy, or the like, and filler particles 42B in the base material. The filler particles 42B may be dielectric particles of silica, alumina, boron nitride, or the like, and may have spherical shapes.

A planarization process such as a Chemical Mechanical Polish (CMP) process or a mechanical grinding process is then performed to thin encapsulant 42 and LSI die 30, until metal posts 28 are revealed. The resulting structure is shown in FIG. 4. Metal posts 28 are alternatively referred to as through-vias 28 hereinafter since they penetrate through encapsulant 42. Through-vias 34 in LSI die 30 are also revealed by the planarization process.

Figure 5:
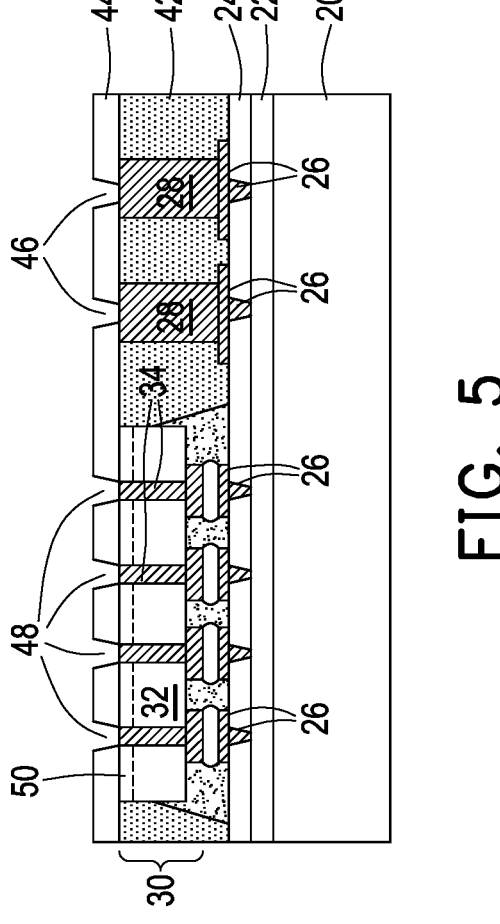

FIG. 5 illustrates the formation of patterned dielectric layer 44 in accordance with some embodiments. The respective process is illustrated as process 210 in the process flow 200 as shown in FIG. 78. Dielectric layer 44 may be or may comprise an organic material such as a polymer, which may be a photo-sensitive polymer such as PBO, polyimide, or the like. Dielectric layer 44 may also be formed of or comprise an inorganic material such as silicon oxide, silicon nitride, or the like.

Dielectric layer 44 is patterned to form openings 46, with through-vias 28 being exposed through openings 46. Openings 48 are also formed to reveal through-vias 34. Also, dielectric layer 50 may be (or may not be) formed in LSI die 30, with dielectric layer 50 contacting the back surface of semiconductor substrate 32. Through-vias 34 penetrate through dielectric layer 50. Dielectric layer 50 may be formed of or comprise silicon oxide, silicon nitride, or the like. The formation process may include, before the formation of dielectric layer 44 and after the planarization to reveal through-vias 34, recessing the semiconductor substrate 32 of LSI die 30 to form a recess, filling the recess with dielectric layer 50, and then performing another planarization process to reveal through-vias 34 again.

Figure 6:
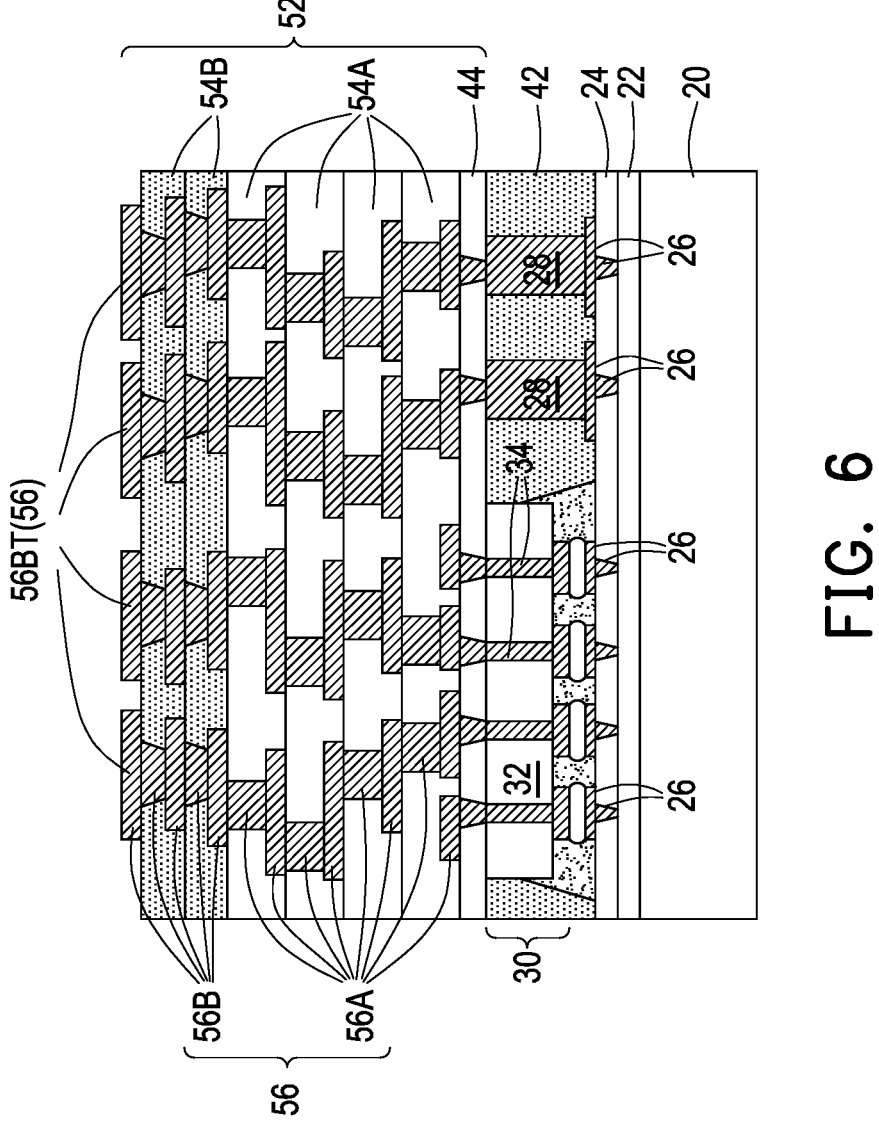

FIG. 6 illustrates the formation of redistribution structure 52 over LSI die 30. The respective process is illustrated as process 212 in the process flow 200 as shown in FIG. 78. In accordance with some embodiments, redistribution structure 52 includes dielectric layers 54A and dielectric layers 54B over dielectric layers 54A. Dielectric layers 54A and dielectric layers 54B may be formed of different materials and have different thicknesses. For example, each of the dielectric layers 54A may be thicker than any of the dielectric layers 54B. In accordance with some embodiments, dielectric layers 54A are formed of a non-photo-sensitive material such as molding compound, molding underfill, silicon oxide, silicon nitride, or the like. Dielectric layers 54B, on the other hand, may be formed of a photo-sensitive material(s) such as PBO, polyimide, BCB, or the like. In accordance with alternative embodiments, both of dielectric layers 54A and 54B are formed of photo-sensitive material(s).

RDLs 56A are formed in dielectric layers 54A, and RDLs 56B are formed in dielectric layers 54B. In accordance with some embodiments, RDLs 56A are thicker and/or wider than RDLs 56B, and may be used for long-range electrical routing, while RDLs 56B may be used for short-range electrical routing. RDLs 56A and 56B are electrically connected to through-vias 28 and through-vias 34. Some surface conductive features 56BT are formed, which may be parts of RDLs 56B, or may be separately formed Under-Bump Metallurgies (UBMs).

In accordance with some embodiments, RDLs 56A and 56B are electrically connected to RDLs 26 through both of through-vias 28 and through-vias 34. In accordance with alternative embodiments, through-vias 28 are not formed. Accordingly, all of the connection of RDLs 56A and 56B to RDLs 26 are made through through-vias 34 in LSI die 30. Since through-vias 34 may be formed using the processes for forming device dies, through-vias 34 may be made smaller than through-vias 28. Accordingly, by forming more/larger LSI die 30 (and hence forming more through-vias 34) to occupy the chip area that will otherwise be occupied by through-vias 28, more electrical interconnections can be formed. In accordance with alternative embodiments, the number of through-vias 28 is minimized, and all signals are transmitted through through-vias 34, while through-vias 28 may be used only for power transmission such as VDD and VSS.

Figure 7:
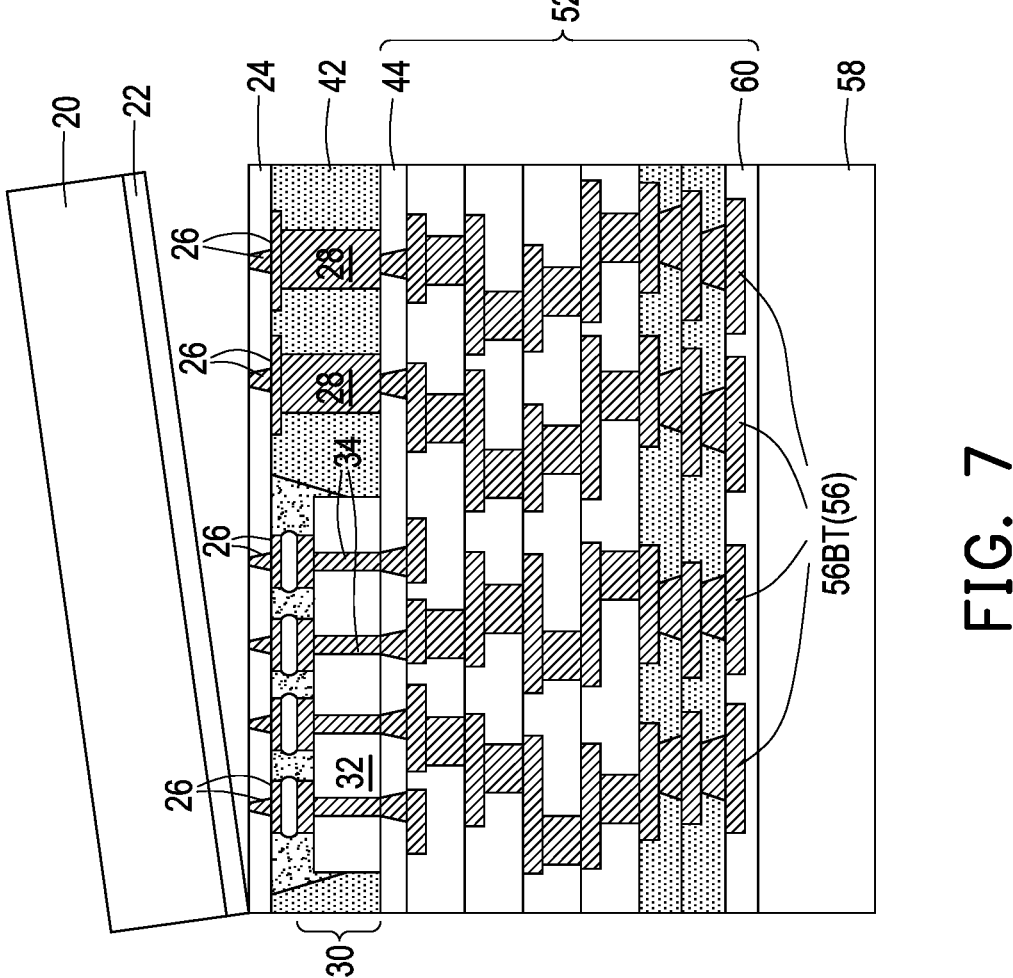

In a subsequent process, as show in FIG. 7, a carrier-switch process is performed. The respective process is illustrated as process 214 in the process flow 200 as shown in FIG. 78. In the carrier-switch process, redistribution structure 52 is first attached to carrier 58 through release film 60. Carrier 58 is formed of a transparent material, and may be a glass carrier, a ceramic carrier, or the like. Release film 60 may be formed of an LTHC coating material. Carrier 20 is then de-bonded from redistribution structure 52. In the de-bonding process, a light beam (which may be a laser beam) is projected on release film 22, and the light beam penetrates through the transparent carrier 20. Release film 22 is thus decomposed. Carrier 20 may be lifted off from release film 22, and hence redistribution structure 52 (along with LSI die 30) is de-bonded (demounted) from carrier 20.

Figure 8:
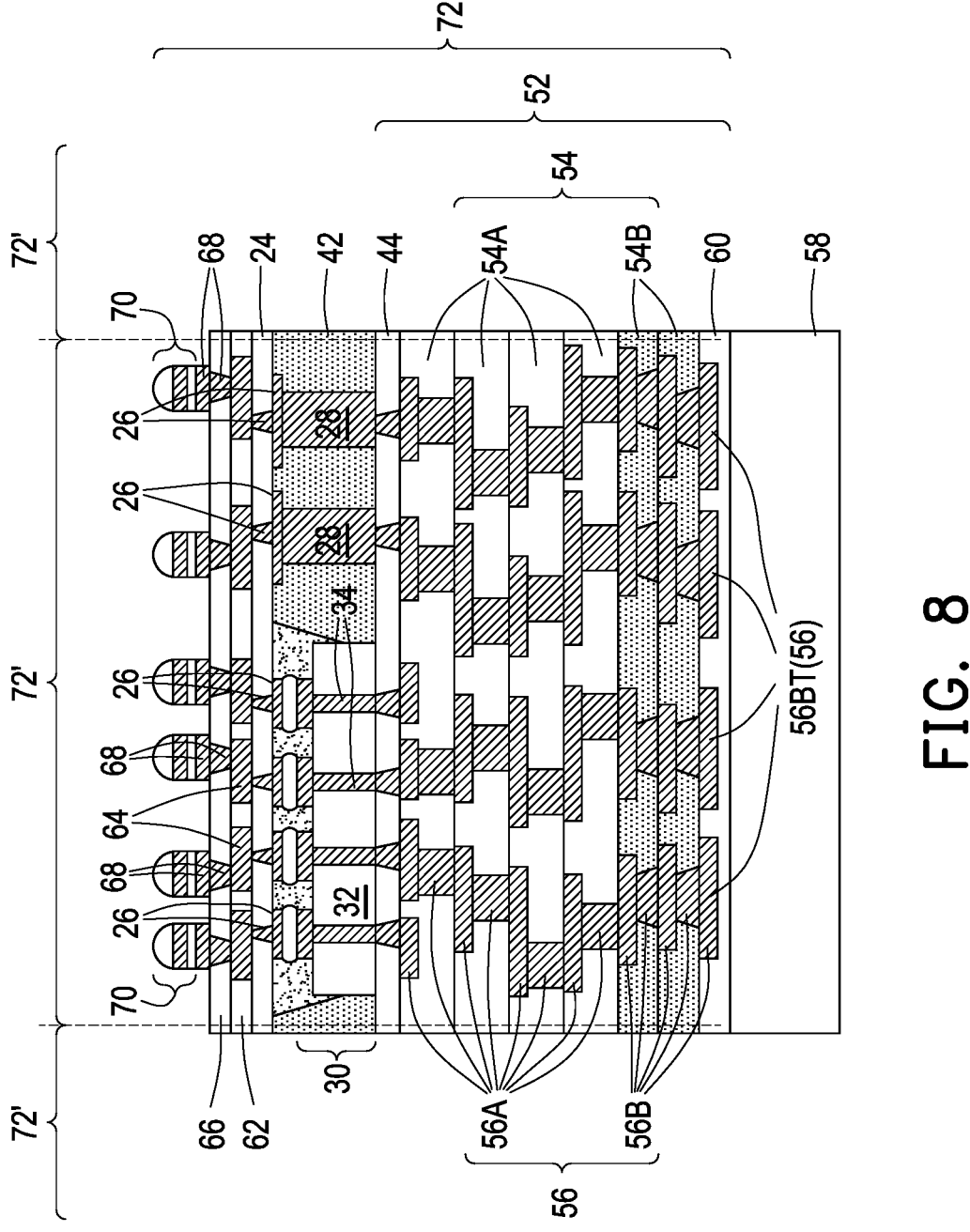

FIG. 8 illustrates the formation of a front-side interconnect structure and electrical connectors, which are overlying and connecting to redistribution structure 52. The respective process is illustrated as process 216 in the process flow 200 as shown in FIG. 78. The front-side interconnect structure includes dielectric layer(s) 62 and RDLs 64 in dielectric layers 62. In accordance with some embodiments, dielectric layer 62 is formed of or comprises a polymer such as PBO, polyimide, BCB, or the like. The formation process includes coating dielectric layer 62 in a flowable form, and then curing dielectric layer 62. In accordance with alternative embodiments of the present disclosure, dielectric layers 62 is formed of an inorganic dielectric material such as silicon nitride, silicon oxide, or the like. The formation method may include CVD, Atomic Layer Deposition (ALD), Plasma- Enhanced Chemical Vapor Deposition (PECVD), or another applicable deposition method. The formation of RDLs 64 may be similar to the formation of RDLs 26, and the details are not repeated herein.

FIG. 8 further illustrates the formation of dielectric layer 66, UBMs 68, and electrical connectors 70 in accordance with some embodiments. Dielectric layer 66 may also be formed of a polymer such as polyimide, PBO, or the like. UBMs 68 extend into dielectric layer 66. To form UBMs 68, openings are formed in dielectric layer 66 to expose the underlying metal pads, which are parts of RDLs 64. UBMs 68 are then formed through a deposition process such as a PVD process. UBMs 68 may be formed of or comprise nickel, copper, titanium, or multi-layers thereof.

Electrical connectors 70 are then formed on UBMs 68. The respective process is also illustrated as process 216 in the process flow 200 as shown in FIG. 78. The formation of electrical connectors 70 may include placing solder balls on the exposed portions of UBMs 68, and then reflowing the solder balls, and hence electrical connectors 70 are solder regions. In accordance with alternative embodiments of the present disclosure, the formation of electrical connectors 70 includes performing a plating process to form solder layers, and then reflowing the solder layers. Electrical connectors 70 may also include non-solder metal pillars, or may have composite structures including metal pillars and solder caps over the non-solder metal pillars, which may also be formed through plating. Throughout the description, the structure over release film 60 is referred to as InFO package substrate 72. InFO package substrate 72 may be a wafer-level package component including a plurality of identical InFO package substrates 72' therein.

Figure 9:
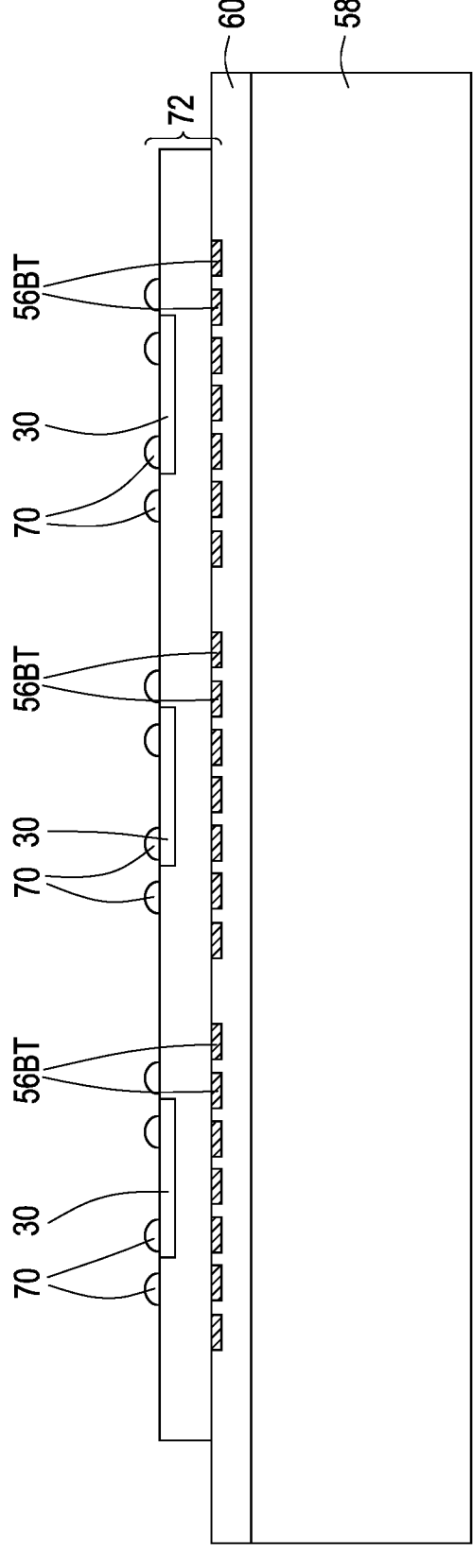

FIGS. 9 through 16 illustrate the formation of packages by bonding package components to the opposite sides of InFO package substrate 72. In these figures, the details of InFO package substrate 72 are not shown, while the details may be found referring to the preceding figures. The surface conductive features 56BT, LSI dies 30, and electrical connectors 70 are illustrated schematically to illustrate the front side (the side having electrical connectors 70) and the back side (the side having conductive features 56BT) of InFO package substrate 72. FIG. 9 illustrates the simplified view of the structure shown in FIG. 8, with the details in InFO package substrate 72 not shown.

Figure 10:
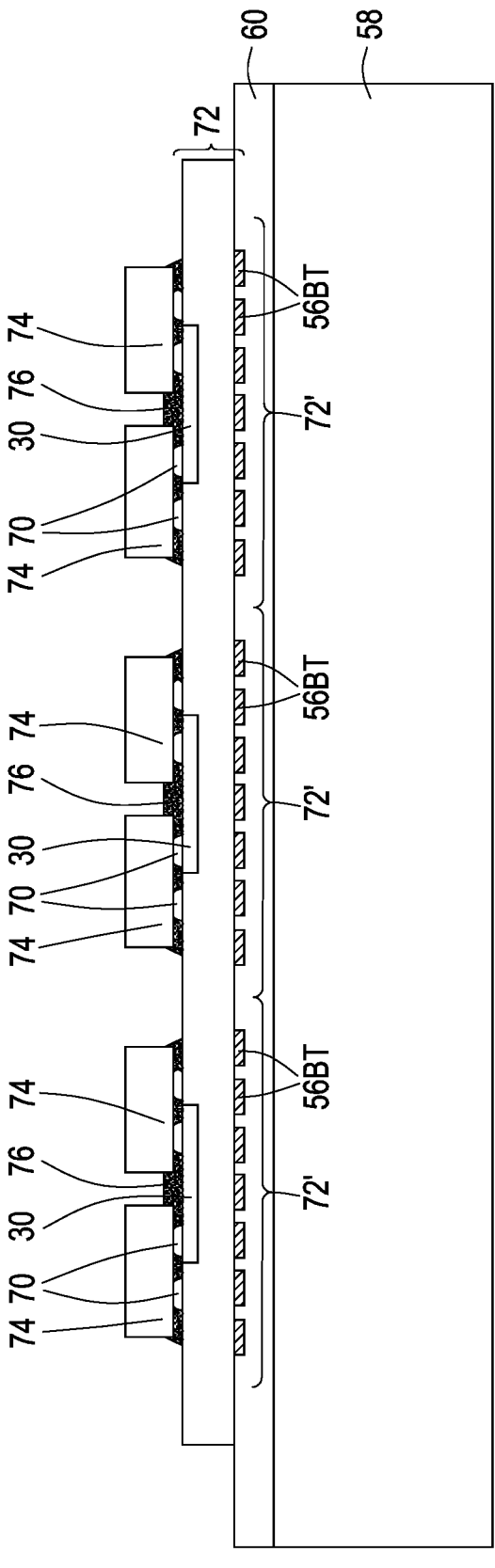

Referring to FIG. 10, a plurality of package components 74 are bonded to InFO package substrate 72. The respective process is illustrated as process 218 in the process flow 200 as shown in FIG. 78. In accordance with some embodiments, package components 74 include logic dies, which may be Central Processing Unit (CPU) dies, Graphic Processing Unit (GPU) dies, mobile application dies, Micro Control Unit (MCU) dies, input-output (IO) dies, BaseBand (BB) dies, Application processor (AP) dies, or the like, or combinations thereof. Package components 74 may also include a memory die(s) such as Dynamic Random-Access Memory (DRAM) dies, Static Random-Access Memory (SRAM) dies, or the like. The memory dies may be discrete memory dies, or may be in the form of a die stack that includes a plurality of stacked memory dies. Package components 74 may also include System-on-Chip (SOC) dies. Furthermore, package components 74 may also include Integrated Passive Device (IPD) dies, which may include passive devices therein. The passive devices may include capacitors, resistors, inductors, and/or the like.

Next, underfill 76 is dispensed into the gaps between package components 74 and the underlying InFO package substrate 72'. The respective process is illustrated as process 220 in the process flow 200 as shown in FIG. 78. In accordance with some embodiments, a plurality of stiffener rings 102 (not shown in FIG. 10, refer to FIG. 37) may be adhered to InFO package substrate 72' through adhesive films 104 (also shown in FIG. 37), with each of plurality of stiffener rings 102 encircling one group of package components 74. Each of the stiffener rings 102 is over one of InFO package substrates 72'. The stiffener rings 102 have the function of reducing the warpage of the resulting packages. In accordance with alternative embodiments, no stiffener ring is attached at this time.

Figure 11:
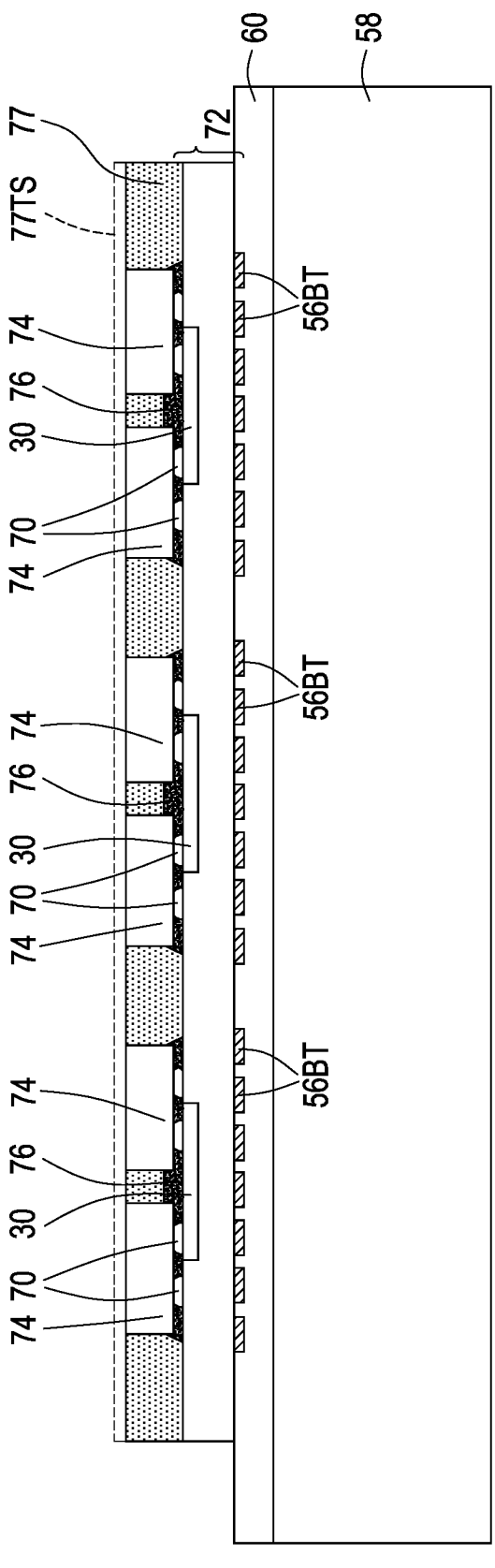

Referring to FIG. 11, package components 74 are encapsulated in encapsulant 77. The respective process is illustrated as process 222 in the process flow 200 as shown in FIG. 78. Encapsulant 77 may be or may include a molding compound, a molding underfill, an epoxy, a resin, and/or the like. Encapsulant 77 may include a base material, which may be a polymer, a resin, an epoxy, or the like, and filler particles in the base material. The filler particles may be dielectric particles of silica, alumina, boron nitride, or the like, and may have spherical shapes. Encapsulant 77 fills the gaps between neighboring package components 74. In accordance with alternative embodiments, underfill 76 is not dispended, and encapsulant 77 also fills the gaps between InFO package substrate 72 and the overlying package components 74. The corresponding encapsulant 77 may be a molding underfill in accordance with these embodiments.

A planarization process is then performed to level the top surface of encapsulant 77. In accordance with some embodiments, after the planarization process, the back surfaces of some or all of package components 74, which back surfaces may also be the backs surface of the respective semiconductor substrates in package components 74, are revealed. In accordance with alternative embodiments, after the planarization process, a layer of encapsulant 77 is left to cover package components 74, and a dashed line 77TS is shown to represent the top surface of the corresponding encapsulant 77.

Next, a carrier de-bonding process is performed. The respective process is illustrated as process 224 in the process flow 200 as shown in FIG. 78. InFO package substrate 72 is de-bonded (demounted) from carrier 58. The de-bonding may be performed, for example, by projecting a light beam (which may be a laser beam) on release film 60, and the light beam penetrates through the transparent carrier 58. Release film 60 is thus decomposed. Carrier 58 is lifted off from release film 60, and hence InFO package substrate 72 is de-bonded (demounted) from carrier 58.

Figure 12:
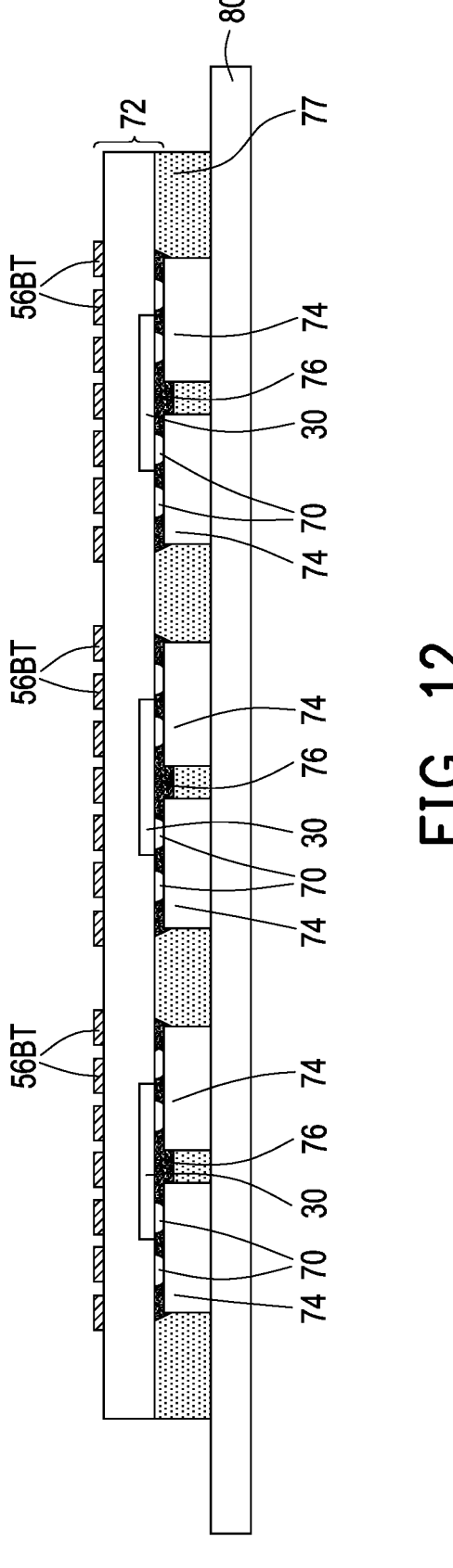

InFO package substrate 72 is then placed on tape 80, which may be fixed on a frame (not shown). The resulting structure is shown in FIG. 12. The respective process is also illustrated as process 224 in the process flow 200 as shown in FIG. 78. The back surfaces of package components 74 face toward, and may be in contact with, tape 80. Conductive features 56BT are exposed.

Figure 13:
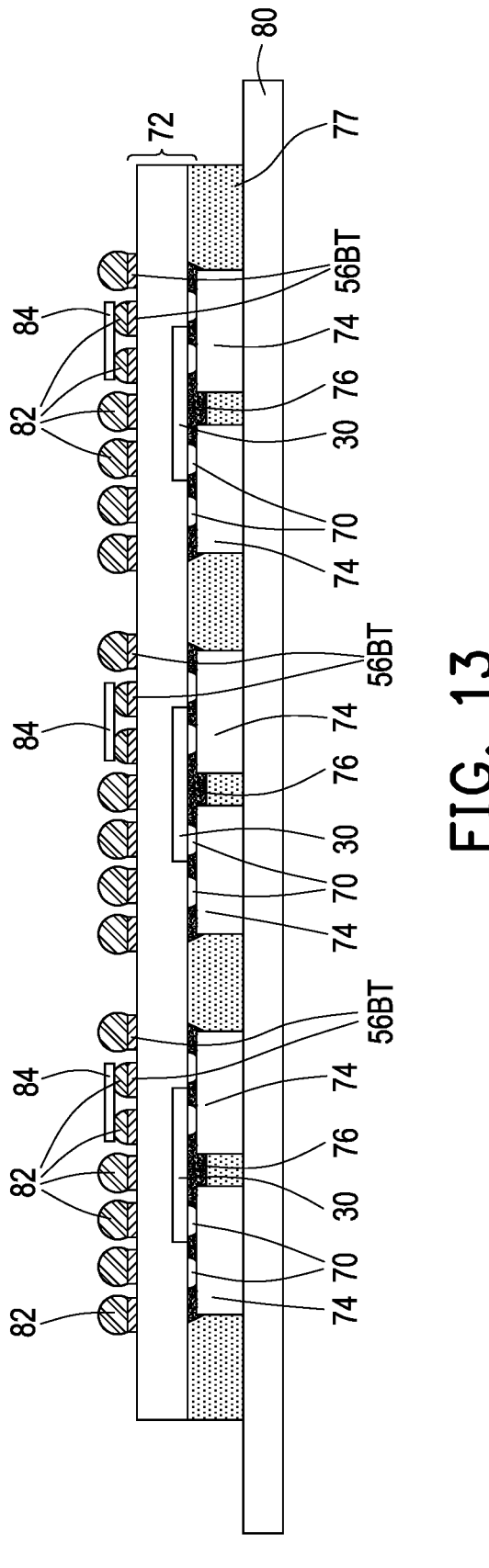

Referring to FIG. 13, electrical connectors 82 such as solder regions are formed on conductive features 56BT, which may be metal pads, metal pillars, UBMs, or the like. The respective process is illustrated as process 226 in the process flow 200 as shown in FIG. 78. Solder regions 82 are reflowed. Next, device dies 84 are bonded to InFO package substrate 72 through some of solder regions 82. The respective process is illustrated as process 228 in the process flow 200 as shown in FIG. 78. In accordance with some embodiments, device dies 84 are IPD dies, which may include independent passive devices such as capacitors, resistors, inductors, and/or the like therein. In accordance with alternative embodiments, device dies 84 may include active devices.

Figure 14:
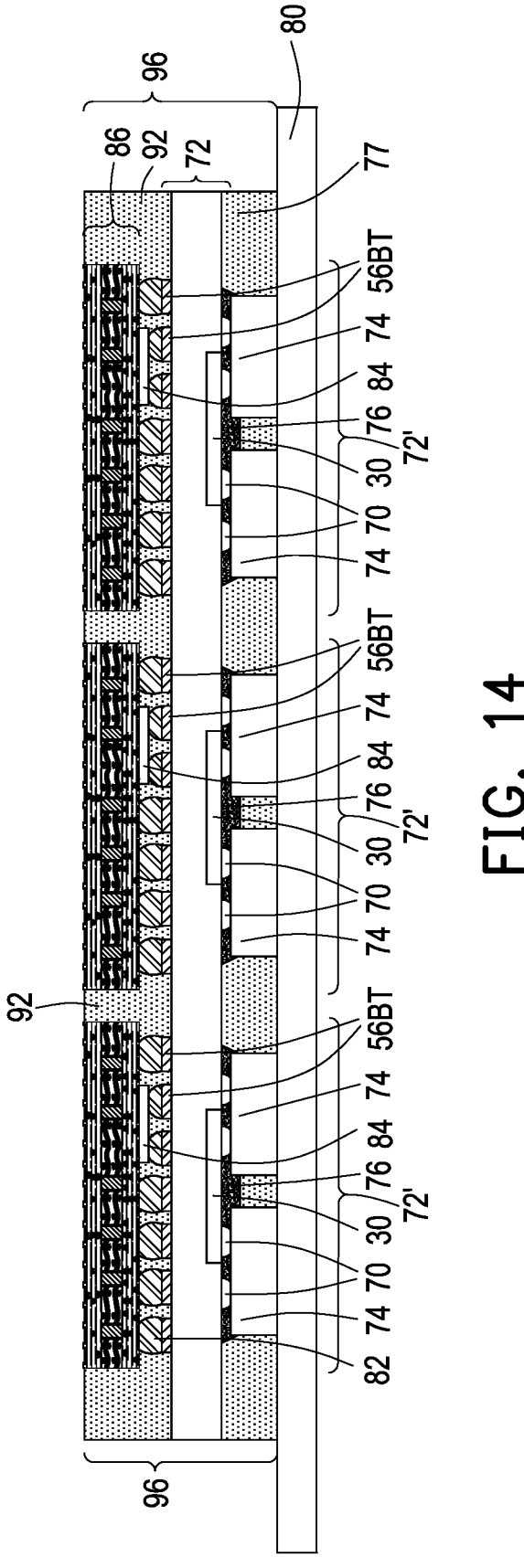

FIG. 14 illustrates the bonding of package substrates 86 to the InFO package substrates 72' in InFO package substrate 72 therein. The respective process is illustrated as process 230 in the process flow 200 as shown in FIG. 78. Package substrates 86 may include organic dielectric layers, and may be referred to as organic package substrates. Package substrates 86 may be cored package substrates including dielectric cores, or may be core-less package substrates that do not have cores therein. For example, package substrates 86 may include dielectric core 88 (refer to FIG. 17 for details), and Plating Through-Holes (PTHs, which are conductive pipes) 90 therein. In accordance with some embodiments, package substrates 86 are discrete package substrate. In accordance with alternative embodiments, package substrates 86 are in an un-sawed wafer-level package substrate, and are bonded to InFO package substrate 72 through wafer-to-wafer bonding. Package substrates 86 are free from active devices such as transistors and diodes therein, and may be free from passive devices such as capacitors, inductors, resistors, and the like. The bonding may be achieved through solder regions 82. The back surfaces (the illustrated top surfaces) of device dies 84 may be spaced apart from, or may be in contact with, the corresponding underlying package substrates 86.

Further referring to FIG. 14, encapsulant 92 is dispensed to encapsulate package substrates 86 therein. The respective process is illustrated as process 232 in the process flow 200 as shown in FIG. 78. Encapsulant 92 fills the gaps between neighboring package substrates 86. Encapsulant 92 may include a molding underfill, which is also filled into the gaps between InFO package substrate 72 and the overlying package substrates 86. In accordance with alternative embodiments, an underfill (not shown) may be dispensed to fill the gaps between InFO package substrate 72 and the overlying package substrates 86 first, followed by the dispensing of encapsulant 92, which may include a molding compound. Encapsulant 92 may include a base material, which may be or may include a polymer, a resin, an epoxy, or the like, and filler particles in the base material. The filler particles may be dielectric particles of silica, alumina, boron nitride, or the like, and may have spherical shapes. Throughout the description, the structure over tape 80 is referred to as reconstructed wafer 96.

Figure 15:
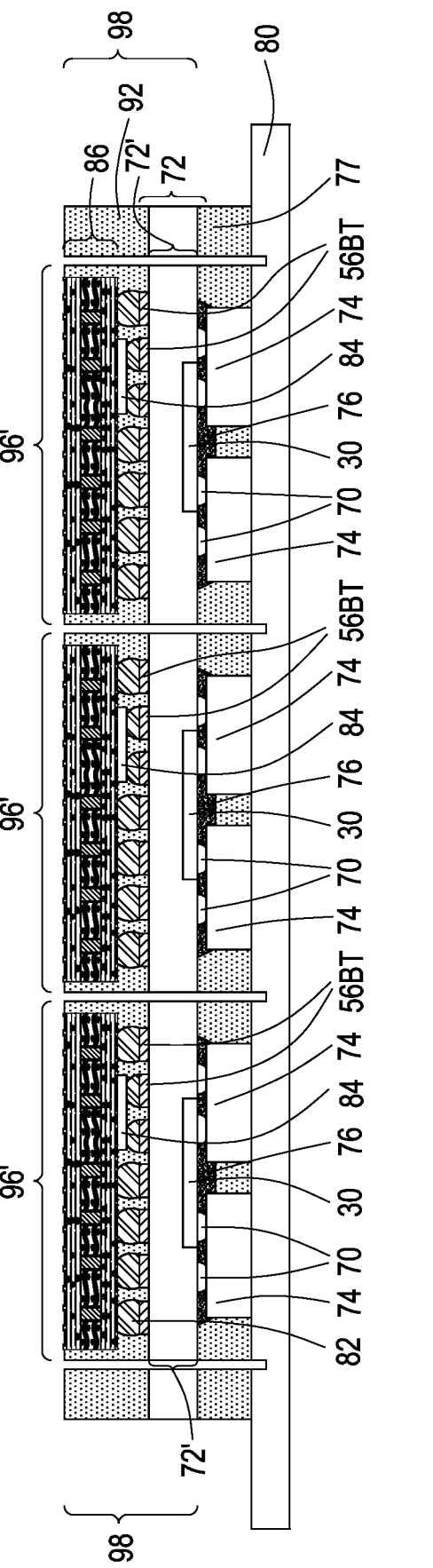

FIG. 15 illustrates a singulation process for separating reconstructed wafer 96 into discrete packages 96'. The respective process is illustrated as process 234 in the process flow 200 as shown in FIG. 78. Throughout the description, InFO package substrates 72' and the respective overlying package substrates 86 are collectively referred to as compound package substrates 98 since they include two types of package substrates, InFO package substrates 72' and package substrates 86. The InFO package substrates 72' and the corresponding package substrates 86 in combination function as integrated package substrates. The singulation process may be performed using a blade cut, or through a laser ablation process. In each of packages 96', encapsulant 92 may include portions contacting the opposite sidewalls of package substrate 86 in accordance with some embodiments. Encapsulant 92 may also fully encircle package substrate 86 in accordance with some embodiments.

Figure 16:
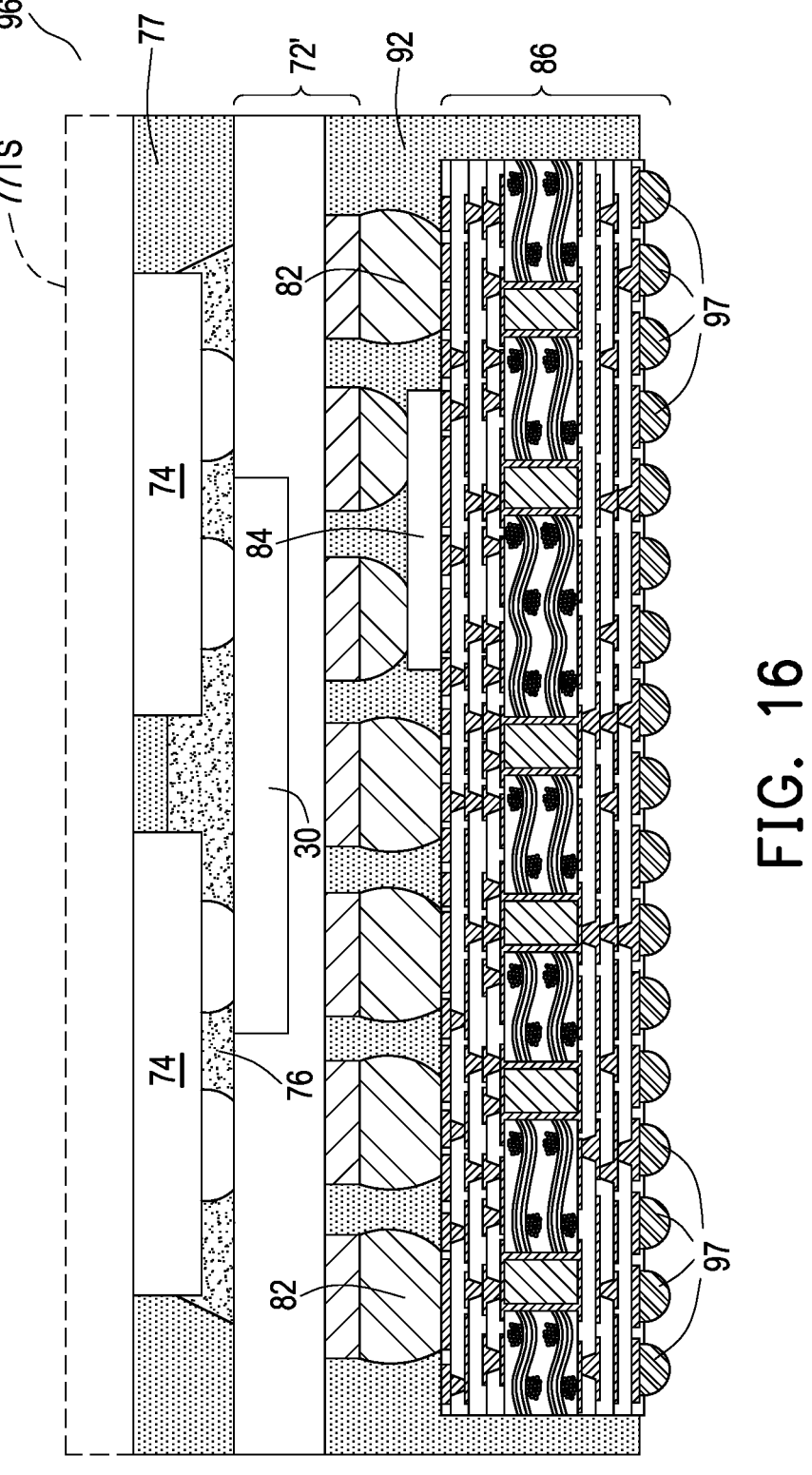

FIG. 16 illustrates one of packages 96' in accordance with some embodiments. As shown in FIG. 16, solder regions 97 are formed on package 96'. Solder regions 97 may be electrically connected to solder regions 82 and InFO package substrate 72', and may be electrically connected to package components 74.

FIG. 17 illustrates a detailed view of the package 96' as shown in FIG. 16 in accordance with some embodiments. In package 96', compound package substrate 98 includes InFO package substrate 72' and package substrate 86 bonded to each other. IPD dies 84 may be bonded between InFO package substrate 72' and package substrate 86. Package substrate 86 is encapsulated in encapsulant 92. Alternatively stated, a part of compound package substrate 98 is encapsulated in encapsulant 92, while another part (InFO package substrate 72') of compound package substrate 98 is outside of encapsulant 92.

In accordance with some embodiments, the package components 74 include HBM 74A, packages 74B (which may also be or include device dies), and IPD dies 74C. Each of HBM 74A, packages 74B, and IPD dies 74C may be bonded to InFO package substrate 72' directly.

In accordance with some embodiments, LSI dies 30 are embedded in the InFO package substrate 72'. LSI dies 30 are used to electrically interconnect the features overlying LSI dies 30 and the features underlying LSI dies 30. LSI dies 30 may also be used to electrically and signally interconnect package components 74. Embedding LSI dies 30 inside InFO package substrate 72' has some advantageous features. For example, if LSI dies 30 are built outside of InFO package substrate 72', LSI die 30 will be built in a package that includes an interposer for LSI dies 30 to bond thereon, so that the corresponding package components 74 that are to be interconnected by LSI die 30 can be bonded to the interposer. The package components 74 that are to be electrically interconnected through the LSI dies 30 will be at the same level, and in the same package. The package including the LSI dies 30 and the interconnected package components 74 thus will have a large size and occupy a larger chip area. When this large package is bonded to an underlying package substrate, the warpage of the resulting package will be increased. The manufacturing yield of the resulting package will be degraded due to the significant warpage of the large package components.

As a comparison, when LSI dies 30 are built in InFO package substrate 72' in accordance with some embodiments of the present disclosure, each of package components 74 (including 74A, 74B, and 74C), which may be as discrete device dies and/or small packages, may be bonded to the underlying InFO package substrate 72' directly. For example, FIG. 17 illustrates that there are five discrete and small package components 74 individually bonded to InFO package substrate 72'. Since the individual package components 74 are small, the bonding yield is high.

As also shown in FIG. 17, LSI dies 30 have their upper sides bonded to the front-side RDLs 26 through solder regions 36. The bottom sides of LSI dies 30, on the other hand, are joined to the underlying conductive features through solder-free joints.

In accordance with some embodiments, as shown in FIG. 17, the singulation process (FIG. 15) is performed by cutting through the middle parts of the portions of encapsulant 92 between neighboring package substrates 86, with no package substrate 86 being cut-through. As a result, in package 96', the remaining encapsulant 92 may form a full ring fully encapsulating package substrate 86. In accordance with these embodiments, the sidewalls/edges of package substrate 86 are laterally recessed from the respective sidewalls/edges of the overlying package substrate 72' and encapsulant 77. Also, InFO package substrate 72' has lateral dimension (length or width) L1, and package substrate 86 has lateral dimension (length or width) L2 smaller than lateral dimension L1.

FIGS. 18 through 21 illustrate the cross-sectional views of intermediate stages in the formation of a package in accordance with some embodiments. These embodiments are similar to the embodiments in FIGS. 1 through 17, except that in the final package 96', encapsulant 92 has been removed from the sidewalls of package substrate 86. Unless specified otherwise, the materials and the formation processes of the components in these embodiments (and the embodiments in FIGS. 22 through 75) are essentially the same as the like components denoted by like reference numerals in the preceding embodiments shown in FIGS. 1 through 17. The details regarding the formation process and the materials of the components shown in FIGS. 18 through 21 (and the embodiments in FIGS. 22 through 75) may thus be found in the discussion of the preceding embodiments.

Figure 18:
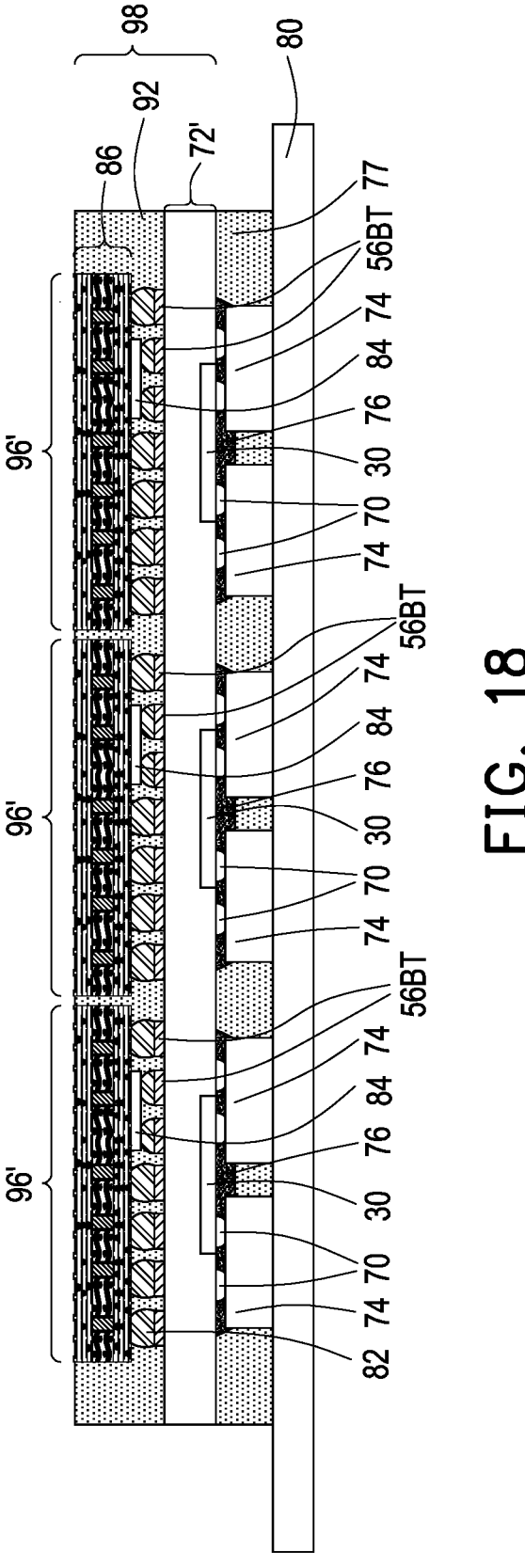
FIGS. 18-21 illustrate the cross-sectional views of intermediate stages in the formation of a package in accordance with some embodiments.
Figure 19:
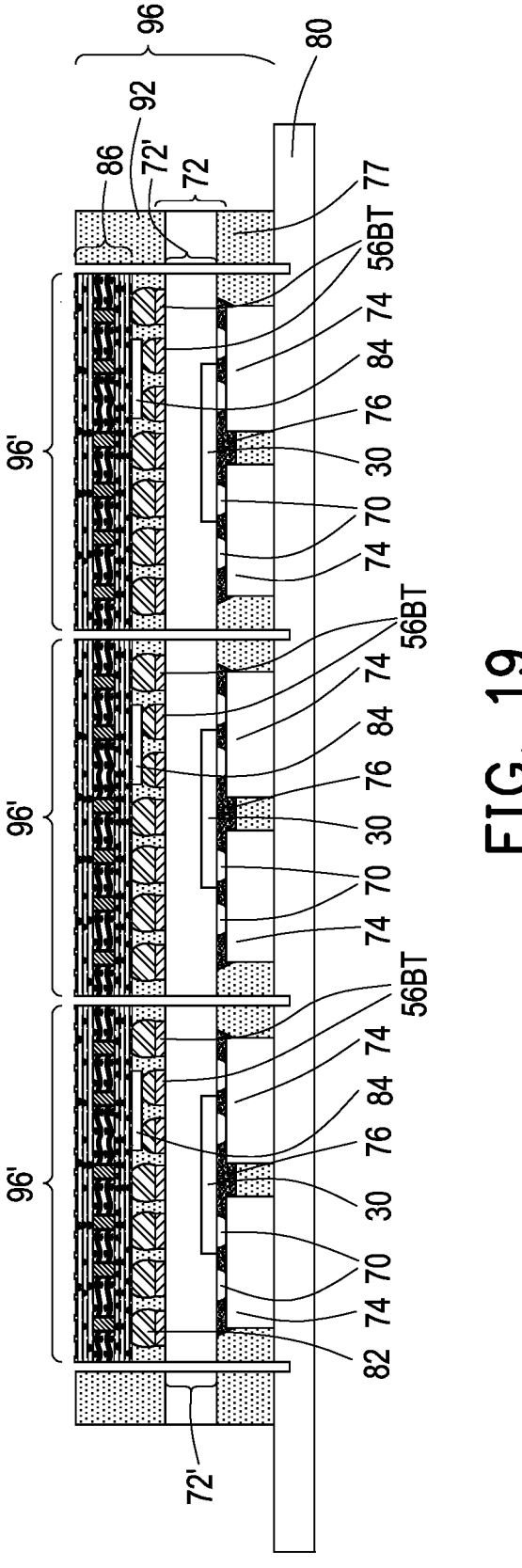

The initial processes of these embodiments are essentially the same as shown in FIGS. 1 through 14. FIG. 18 illustrates the resulting reconstructed wafer 96, which is on tape 80. The illustrated reconstructed wafer 96 may be the same as the structure shown in FIG. 14. The spacings between neighboring package substrates 86 may be small, and may be smaller than in the reconstructed wafer 96 as shown in FIG. 14. Next, referring to FIG. 19, a singulation process is performed. In accordance with some embodiments, in the singulation process, package substrates 86 are sawed through, and the edge portions of package substrates 86 may be removed along with encapsulant 92. As a result, the portions of encapsulant 92 between neighboring package substrates 86 are removed, and the sidewalls of the resulting package substrates 86 are exposed.

Figure 20:
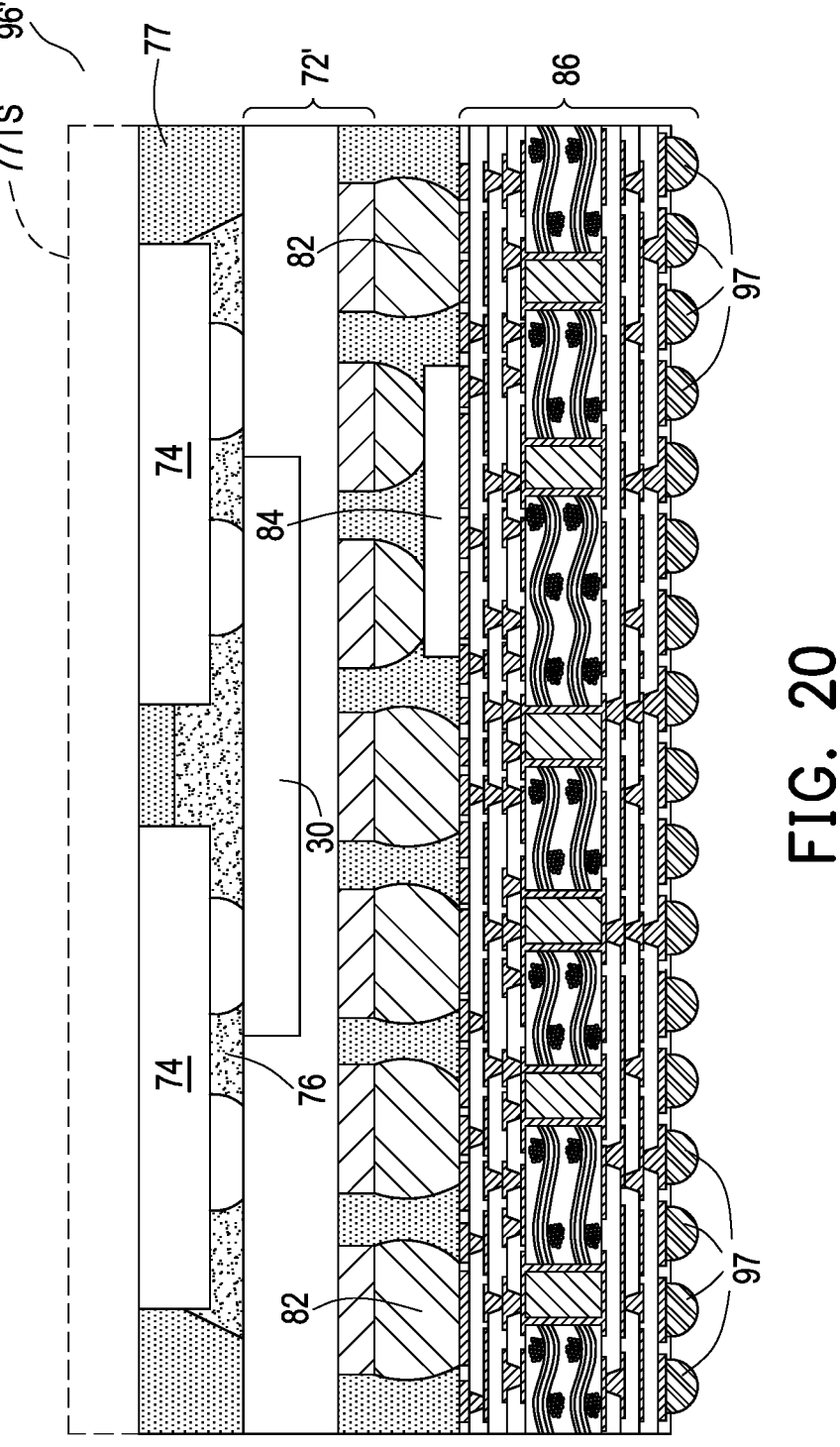
Figure 21:
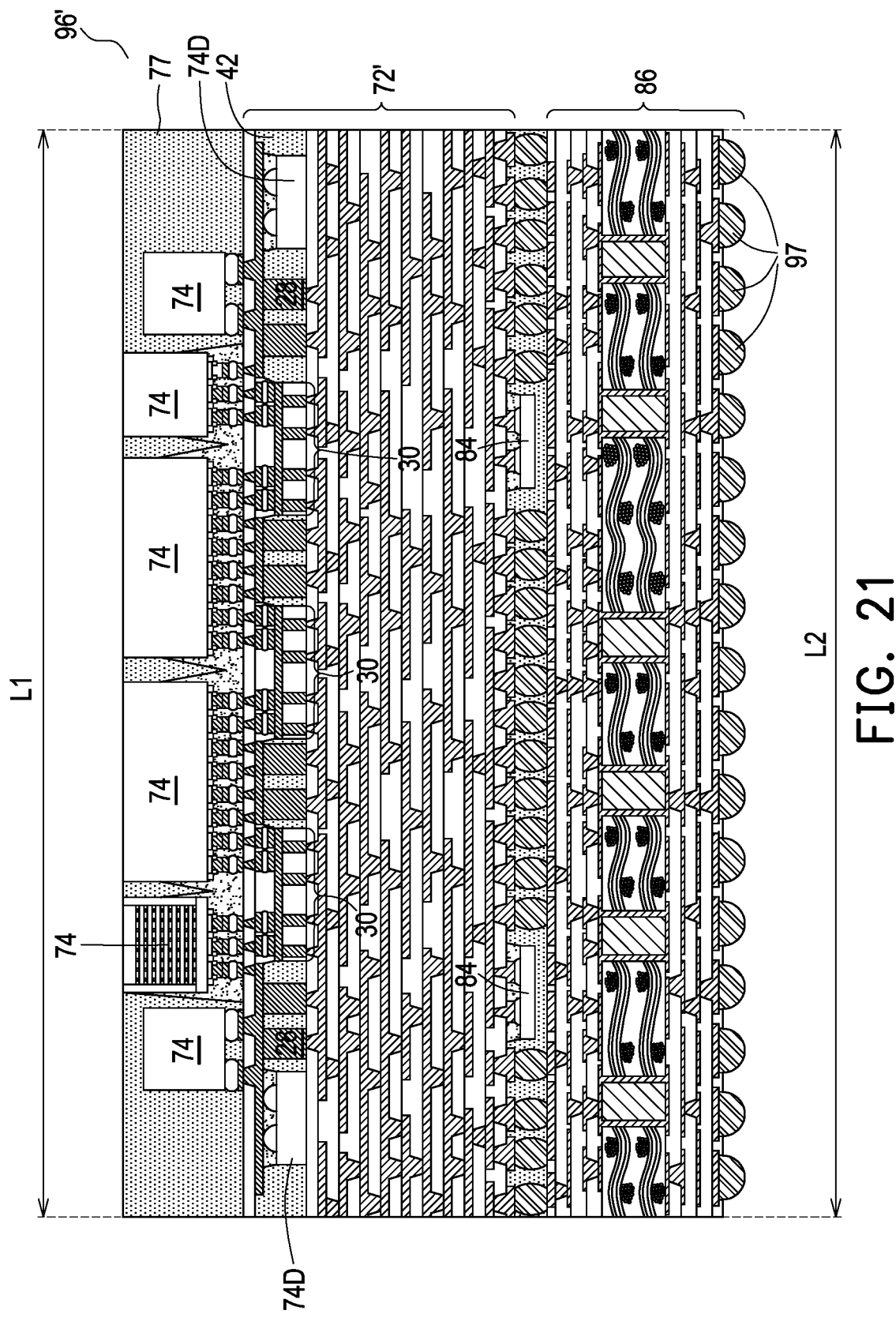

FIG. 20 illustrates a resulting package 96' sawed from reconstructed wafer 96 in accordance with some embodiments. The detailed structure of InFO package substrate 72' and the corresponding package 96' are shown in FIG. 21. In accordance with some embodiments, as shown in FIGS. 20 and 21, all parts of encapsulant 92 encircling a package substrate 86 are removed. Accordingly, all sidewalls of a package substrate 86 in package 96' are exposed, and the exposed (four) sidewalls may form a full ring. No portion of encapsulant 92 is left on the sidewalls of package substrate 86. In accordance with these embodiments, the edges of package substrate 86 are vertically aligned to the respective edges of package substrate 72', encapsulant 77, and encapsulant 42. Also, InFO package substrate 72' has lateral dimension L1, and package substrate 86 has lateral dimension L2 equal to the lateral dimension L1.

In accordance with alternative embodiments, due to process variations, some parts of encapsulant 92 encircling a package substrate 86 are removed, while some other parts may be left on the sidewalls of package substrate 86. For example, the portion of encapsulant 92 on a first sidewall (such as the left sidewall) of package substrate 86 may be removed, and the first sidewall of package substrate 86 is exposed. A second sidewall (such as the right sidewall) of package substrate 86, however, may have a remaining portion of package substrate 86 thereon.

Figure 22:
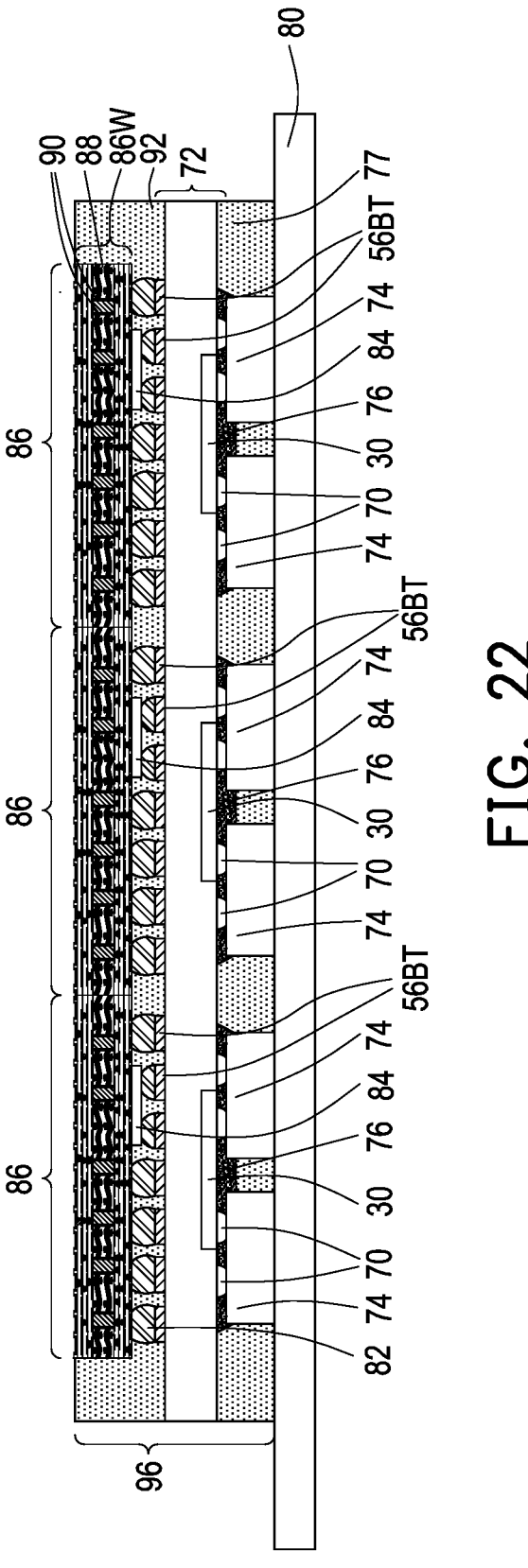
FIGS. 22-23 illustrate the cross-sectional views of intermediate stages in the formation of a package in accordance with some embodiments.
Figure 23:
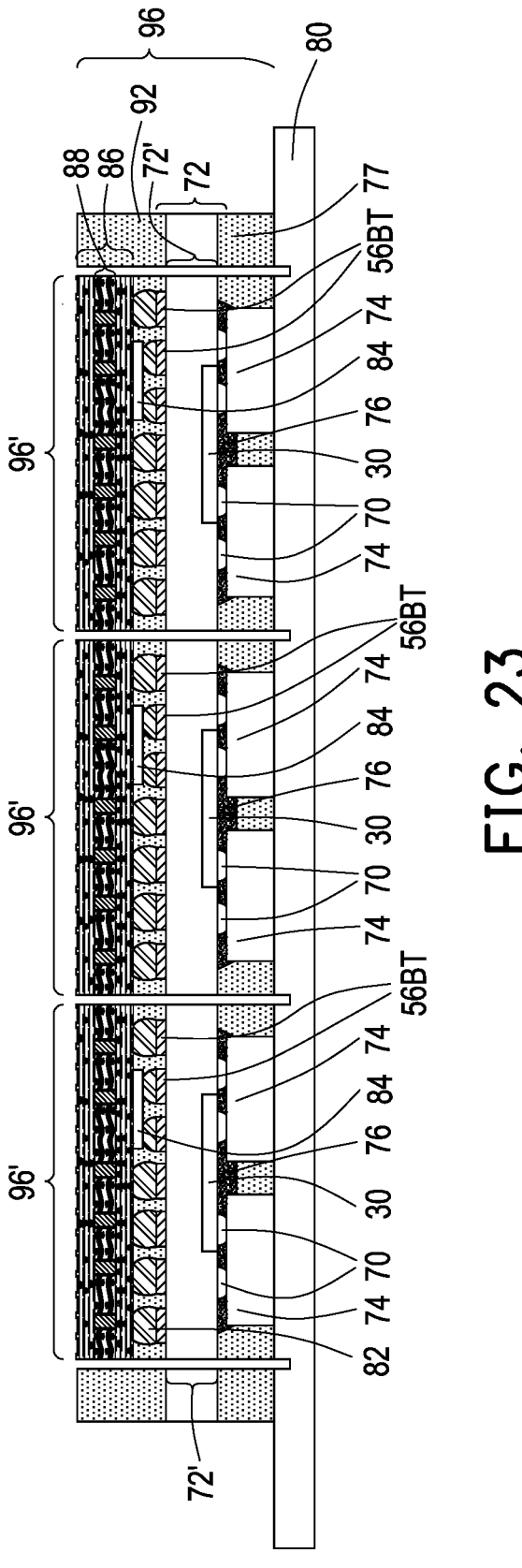

FIGS. 22 and 23 illustrate the cross-sectional views of intermediate stages in the formation of a package in accordance with alternative embodiments of the present disclosure. These embodiments are similar to the embodiments in FIGS. 1 through 17, except that a wafer-level package substrate, rather than discrete package substrates, is bonded to InFO package substrate 72 first, and the wafer-level package substrate is sawed into discrete package substrates.

The initial processes of these embodiments are essentially the same as shown in FIGS. 1 through 13. Next, as shown in FIG. 22, wafer-level package substrate 86W is bonded to InFO package substrate 72. Wafer-level package substrate 86W may be a wafer or a package substrate strip including a plurality of package substrates 86. Similar to the discrete package substrates 86 as discussed in previous embodiments, the package substrates 86 in wafer-level package substrate 86W may also include organic dielectric layers, and are sometimes referred to as organic package substrates. For example, wafer-level package substrate 86W may include dielectric core 88 (also refer to FIG. 17), and PTHs (conductive pipes) 90 therein. The dielectric core 88 and the overlying and the underlying dielectric layers may continuously extend into each of package substrates 86, with no breaks and no interfaces separating the portions of the dielectrics in different package substrates 86. Wafer-level package substrate 86W is free from active devices such as transistors and diodes therein, and is free from passive devices such as capacitors therein. Also, the package substrates 86 in wafer-level package substrate 86W are identical to each other.

Further referring to FIG. 22, encapsulant 92 is dispensed to encapsulate wafer-level package substrate 86W therein. Encapsulant 92 may include a molding compound, and may or may not include an underfill. Reconstructed wafer 96 is thus formed.

FIG. 23 illustrates a singulation process for separating reconstructed wafer 96 into discrete packages 96'. In the singulation process, the portions of wafer-level package substrate 86W connecting neighboring package substrates 86 are cut-through to separate package substrates 86 from each other. The singulation process may be performed using a blade, or performed through a laser ablation process.

The resulting package 96' is essentially the same as what is shown in FIG. 21. In accordance with these embodiments, all sidewalls of a package substrate 86 in a package 96' are exposed, and the exposed sidewalls may form a full ring. No portion of encapsulant 92 is left on the sidewalls of package substrate 86. In accordance with these embodiments, the edges of package substrate 86 are vertically aligned to the respective edges of package substrate 72', encapsulant 77, and encapsulant 42. Also, InFO package substrate 72' has lateral dimension L1, and package substrate 86 has lateral dimension L2 equal to the lateral dimension L1.

FIGS. 24 through 31 illustrate the cross-sectional views of intermediate stages in the formation of a package in accordance with some embodiments of the present disclosure. These embodiments are similar to the embodiments in FIGS. 1 through 17, except that an InFO package substrate 72 and the corresponding encapsulant 77 are sawed apart first to form packages, and then the packages are bonded to package substrates 86, either through die-to-wafer bonding or die-to-die bonding. As a comparison, in preceding embodiments, InFO package substrate 72 and the corresponding encapsulant 77 are sawed after, rather than before, bonding to package substrates 86.

Figure 24:
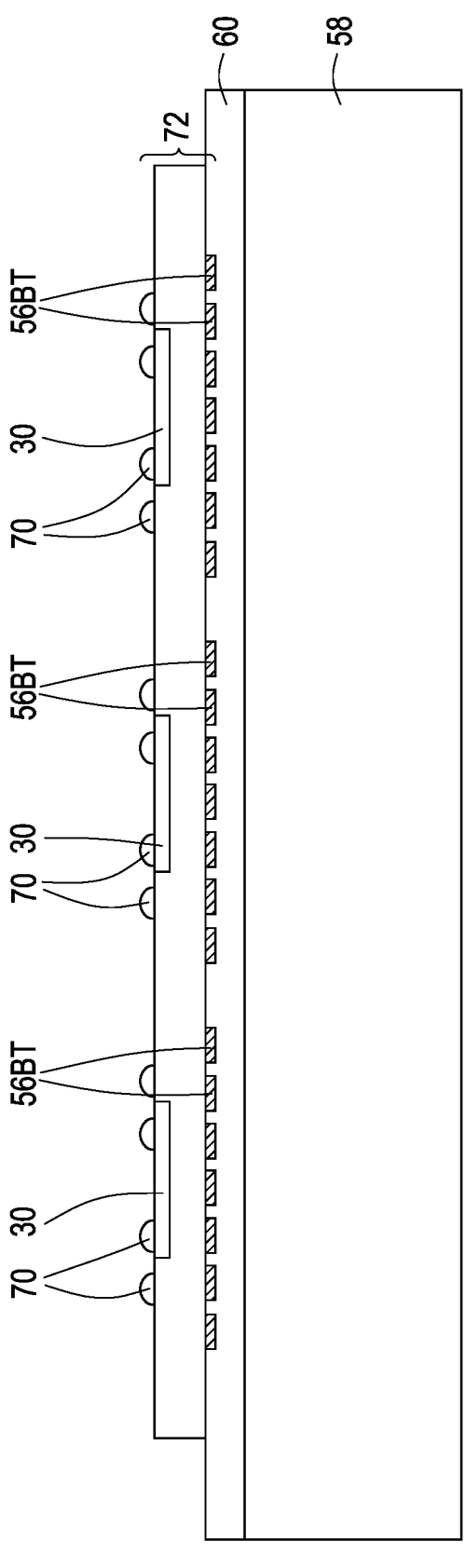
FIGS. 24-31 illustrate the cross-sectional views of intermediate stages in the formation of a package in accordance with some embodiments.

The initial processes of these embodiments are essentially the same as shown in FIGS. 1 through 8, wherein InFO package substrate 72 is formed. FIG. 24 illustrates a simplified view of the structure shown in FIG. 8, and the detailed structures of InFO package substrate 72 are not shown. InFO package substrate 72 is over carrier 58. The details may be found referring to FIG. 8 as an example. The surface conductive features 56BT, LSI dies 30, and electrical connectors 70 are shown schematically to illustrate the front side (the side having electrical connectors 70) and the back side (the side having conductive features 56BT) of InFO package substrate 72.

Figure 25:
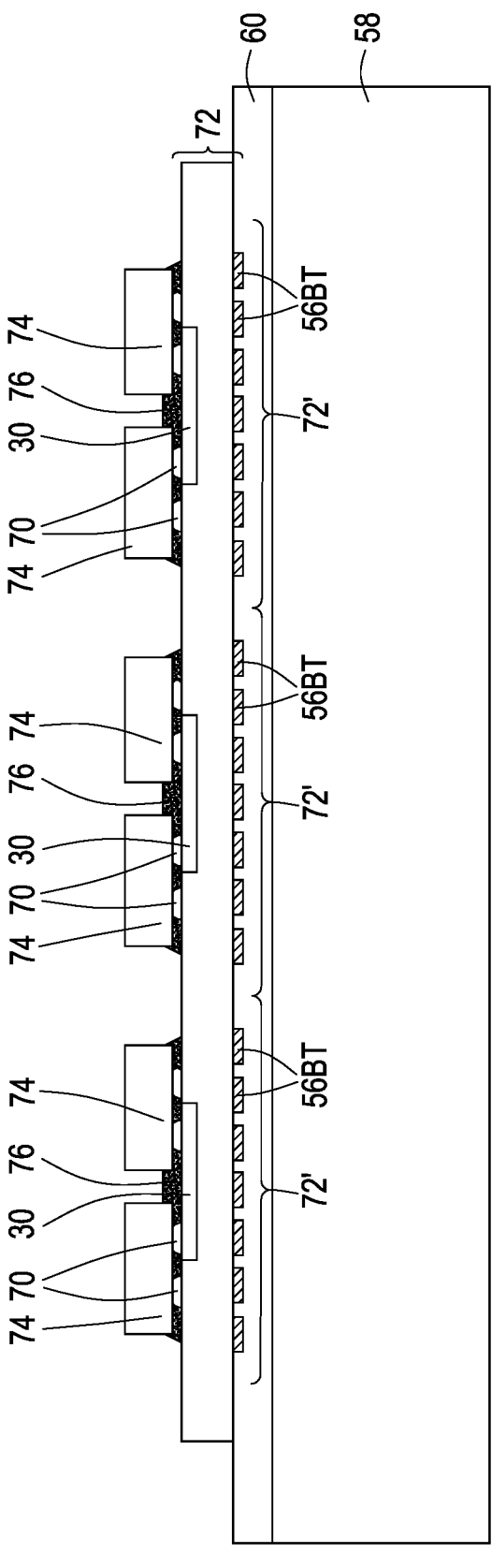

Referring to FIG. 25, a plurality of package components 74 are bonded to InFO package substrate 72. Although two package components 74 are shown as being in a group, each group may include more or fewer package components 74. Next, underfill 76 is dispensed into the gaps between package components 74 and the underlying InFO package substrate 72'. The underfill dispensed to different groups of package components 74 are separated from each other.

Figure 26:
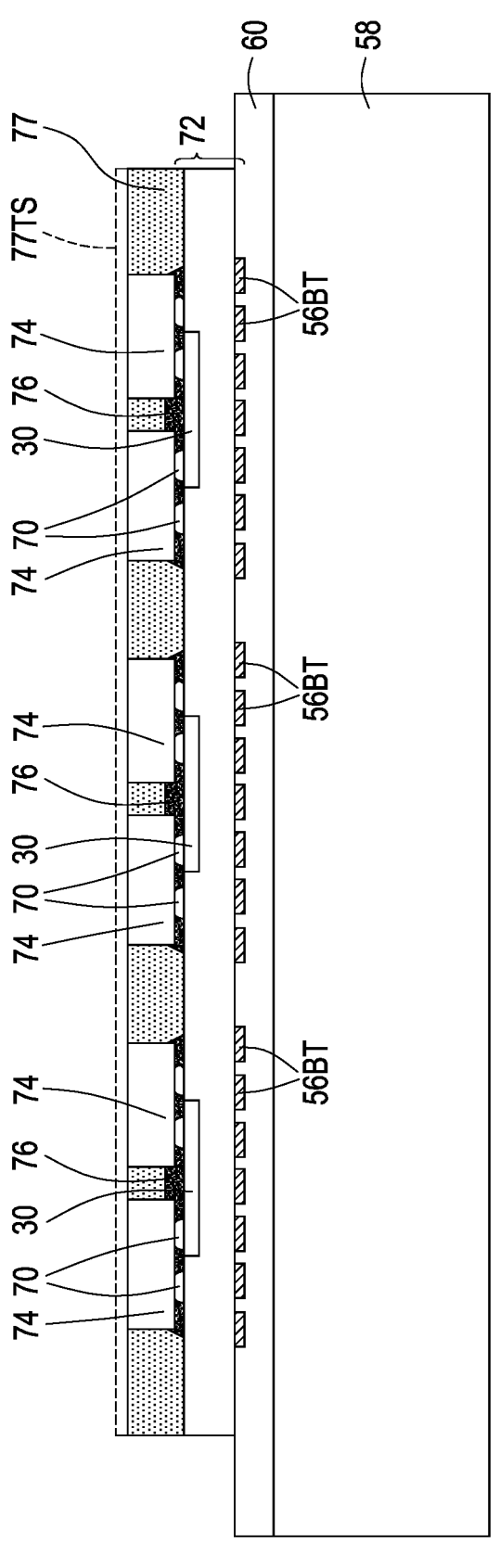

Next, referring to FIG. 26, package components 74 are encapsulated in encapsulant 77, which may include a molding compound, an underfill, or the like. A planarization process is then performed to level the top surface of encapsulant 77. The resulting encapsulant 77 may have its top surface level with some or all of package components 74. In accordance with alternative embodiments, encapsulant 77 may have its top surface 77TS higher than the top surfaces of package components 74.

Figure 27:
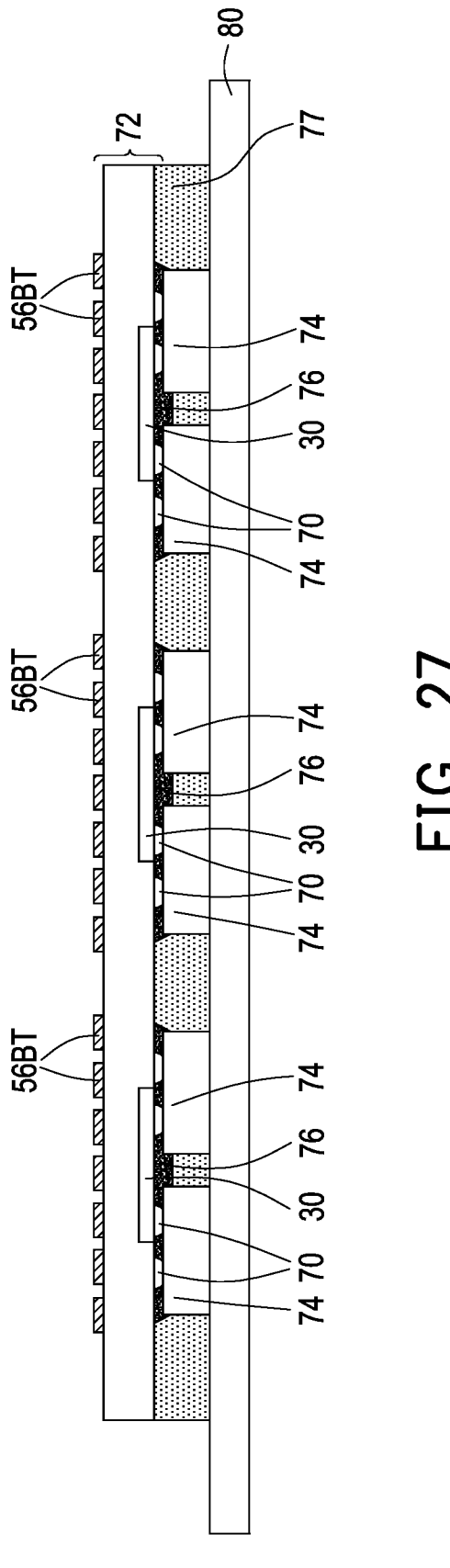

Next, InFO package substrate 72 is de-bonded (demounted) from carrier 58, for example, by projecting a laser beam to decompose release film 60. InFO package substrate 72 is then placed on tape 80, which may be fixed on a frame (not shown). The resulting structure is shown in FIG. 27. The backsides of package components 74 face toward, and may be in contact with, tape 80. Conductive features 56BT are exposed.

FIG. 28 illustrates the formation of solder regions 82 on conductive features 56BT. Device dies 84, which may be IPDs or may include active device dies, are then bonded to InFO package substrate 72 through some of solder regions 82. The resulting structure including InFO package substrate 72, package components 74, and encapsulant 77 is referred to as reconstructed wafer 79 hereinafter.

Figure 29:
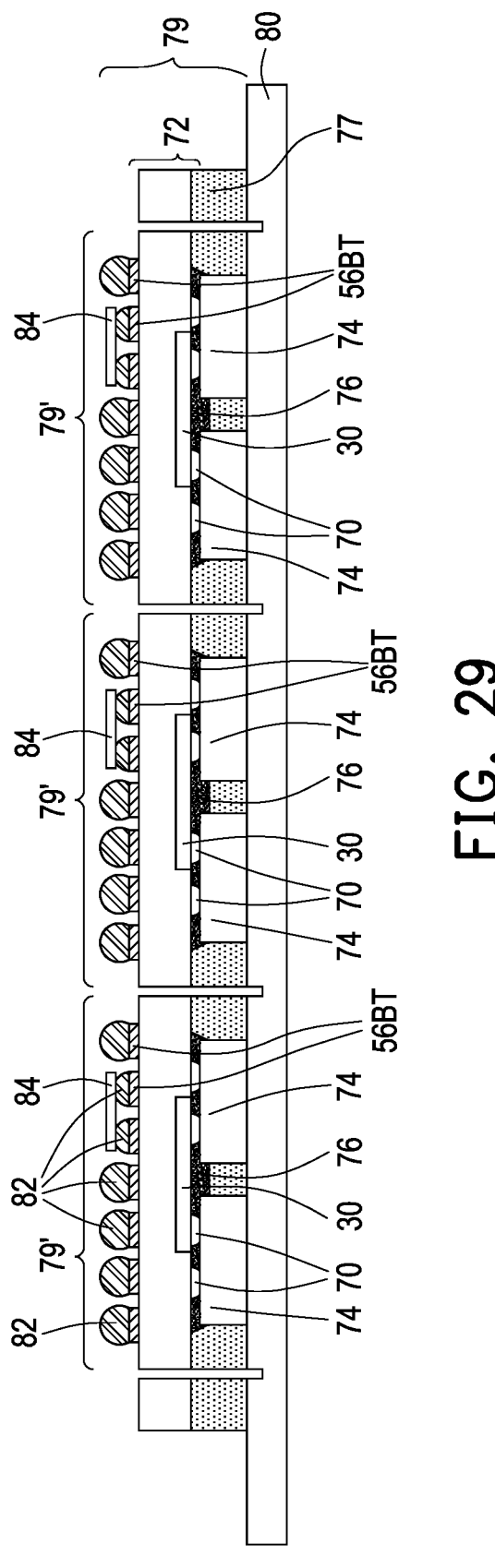

Next, as shown in FIG. 29, a singulation process is performed to saw reconstructed wafer 79, so that discrete packages 79' are formed. In a subsequent process, a plurality of packages 79' are bonded to wafer-level package substrate 86W (not shown), which may have the same structure as shown in FIG. 22. In accordance with some embodiments, the bonding is performed through die-to-wafer bonding, wherein packages 79' are in the form of dies. After the bonding process, packages 79' are laterally spaced apart from each other by gaps.

Figure 30:
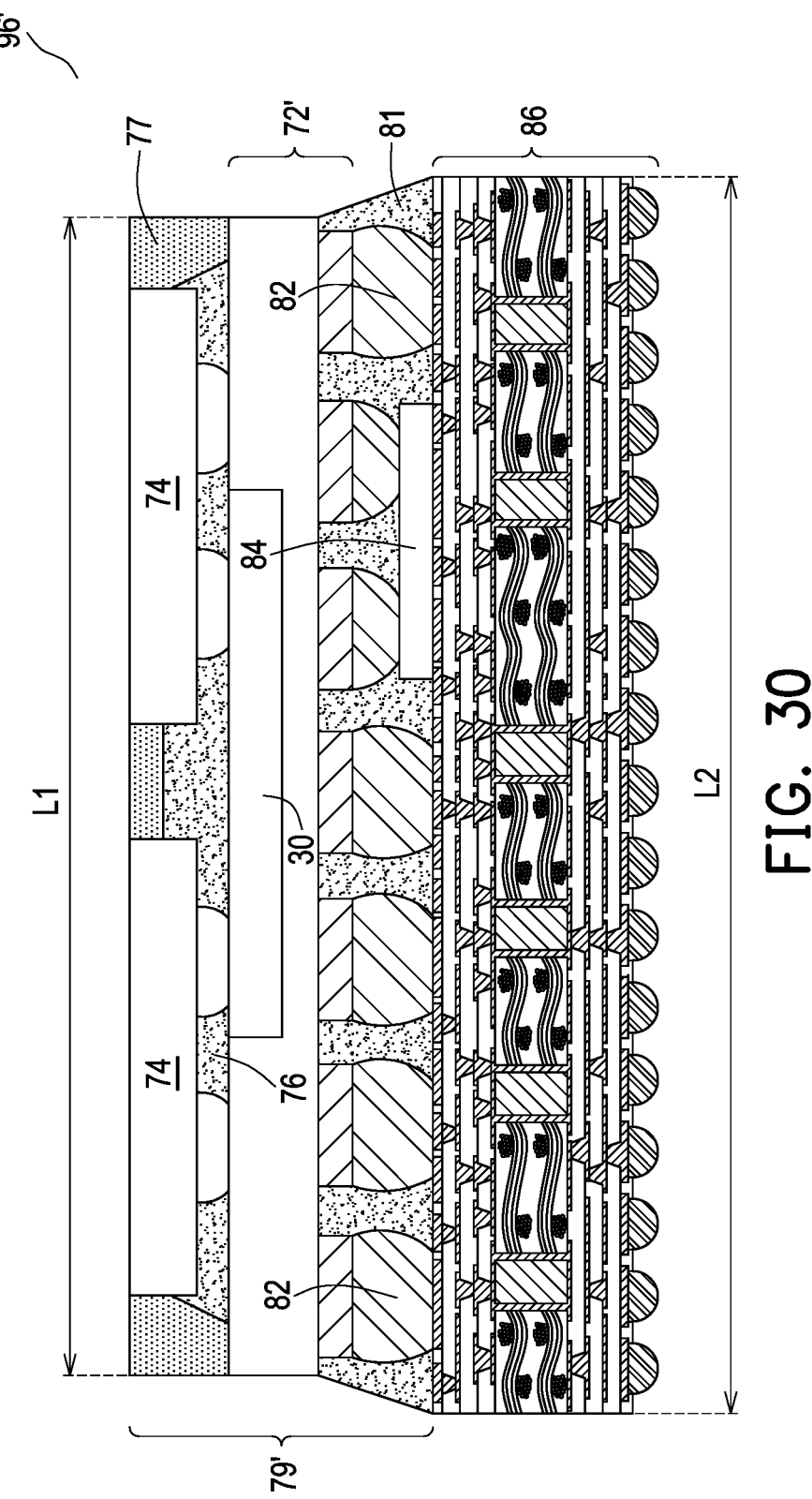

In a subsequent process, underfill 81 (FIG. 30) is dispensed into the gaps between the package substrates 86 and respective discrete packages 79'. A singulation process may then be performed to separate the package substrates 86 in wafer-level package substrate 86W from each other. Packages 96' are thus formed, as shown in FIG. 30. In the resulting package 96', the edges of package substrate 86 extend laterally beyond the respective edges of package substrate 72' and encapsulant 77. Also, InFO package substrate 72' has lateral dimension L1, and package substrate 86 has lateral dimension L2 greater than lateral dimension L1.

Figure 31:
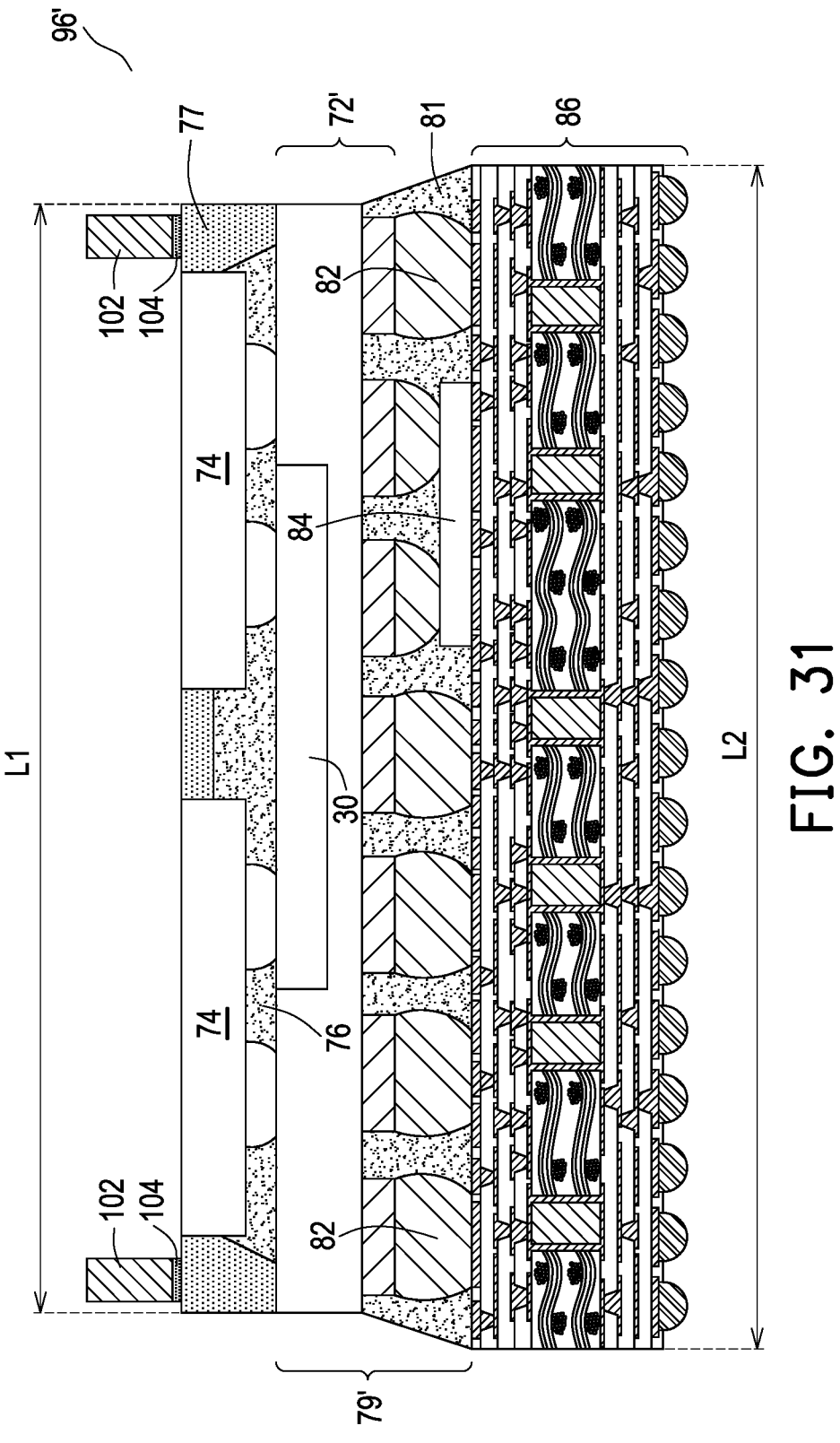

FIG. 31 illustrates the cross-sectional view of package 96' in accordance with some embodiments, wherein stiffener ring 102 is attached to the top surface of package 96' through adhesive film 104. It is appreciated that although the illustrated example package 96' has length L1 smaller than length L2, the package 96', over which the stiffener ring 102 is attached, may have any of the structures shown in preceding embodiments, and length L1 may be equal to or greater than length L2. Stiffener ring 102 has the function of reducing the warpage of the resulting package 96'. In accordance with some embodiments, stiffener ring 102 is formed of a rigid metallic material such as copper, stainless steel, or the like. Stiffener ring 102 may have a top-view shape of a full ring without break therein in accordance with some embodiment. Stiffener ring 102 may also include four portions, each being parallel to and adjacent to one edge of package 79'. Alternatively, stiffener ring 102 has a top-view shape of a circle.

Figure 32:
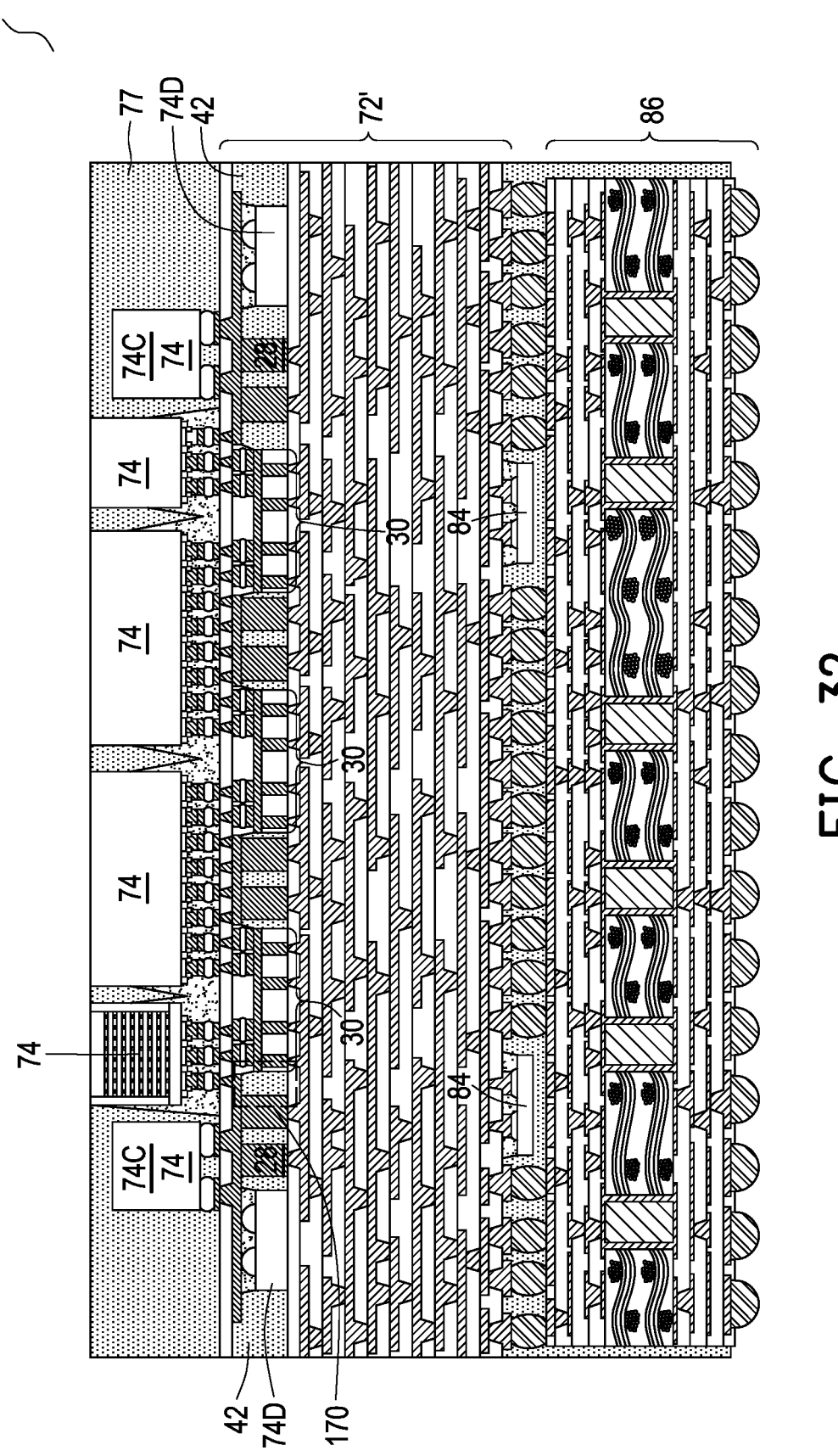
FIGS. 32-37 illustrate the cross-sectional views of some packages in accordance with some embodiments.
Figure 33:
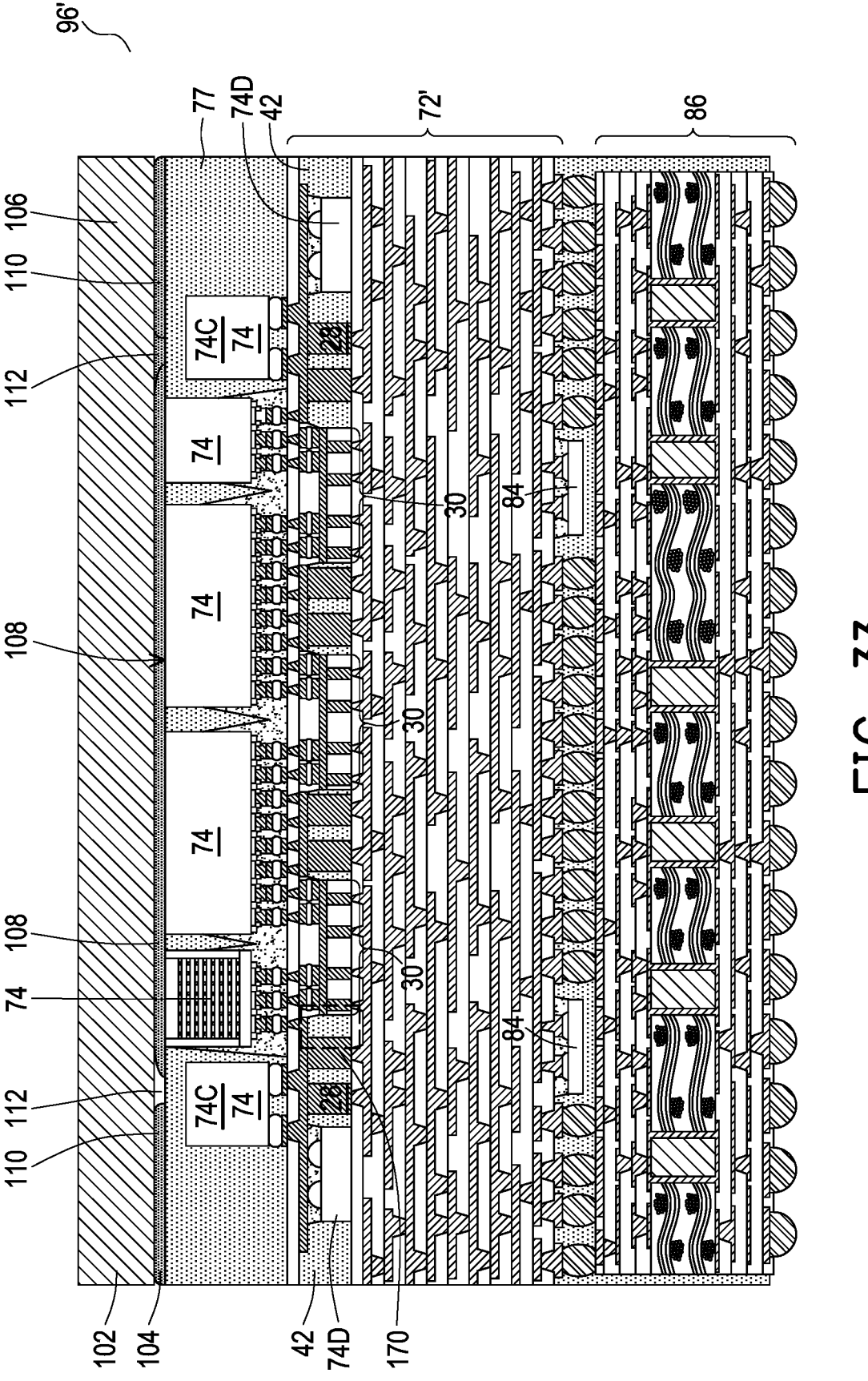

FIGS. 32 and 33 illustrate the cross-sectional views of intermediate stages in the formation of a package including a metal lid in accordance with some embodiments of the present disclosure. Referring to FIG. 32, package 96' is formed. Package 96' may have any of the structures shown in preceding embodiments, although one of the embodiments is illustrated. The top surfaces of at least some, and may be all, of package components 74 are exposed. For example, the silicon substrates of the package components 74 may be exposed.

Referring to FIG. 33, lid (heat sink) 106 is attached to package 96'. The attachment is made through Thermal Interface Material (TIM) 108, which is in contact with the top surfaces of package components 74. TIM 108 is an adhesive that has a high thermal conductivity, for example, higher than about 1 watt/(k*m), 5 watt/(k*m), or higher. Lid 106 may be formed of or comprise a metal such as copper, aluminum, stainless steel, or the like, or alloys thereof. In accordance with some embodiments, package 96' is a large package. Adhesive 110 may thus be dispensed to improve the adhesion of lid 106 to package 96'. In accordance with some embodiments, adhesive 110 has a stronger adhesion to package 96' than TIM 108, while its thermal conductivity is lower than the thermal conductivity of TIM 108. In accordance with some embodiments, adhesive 110 is dispensed to regions where no package components 74 are located. Accordingly, an entirety of adhesive 110 may be spaced apart from all of package components 74. Furthermore, adhesive 110 may encircle TIM 108, with adhesive 110 having a top-view shape of a full ring.

As shown in FIG. 33, adhesive 110 may be spaced apart from TIM 108 by gap 112. In accordance with some embodiments, gap 112 form a full gap-ring encircling TIM 108 and encircled by adhesive 110. This allows the process margin for dispensing adhesive 110 and TIM 108.

Figure 34:
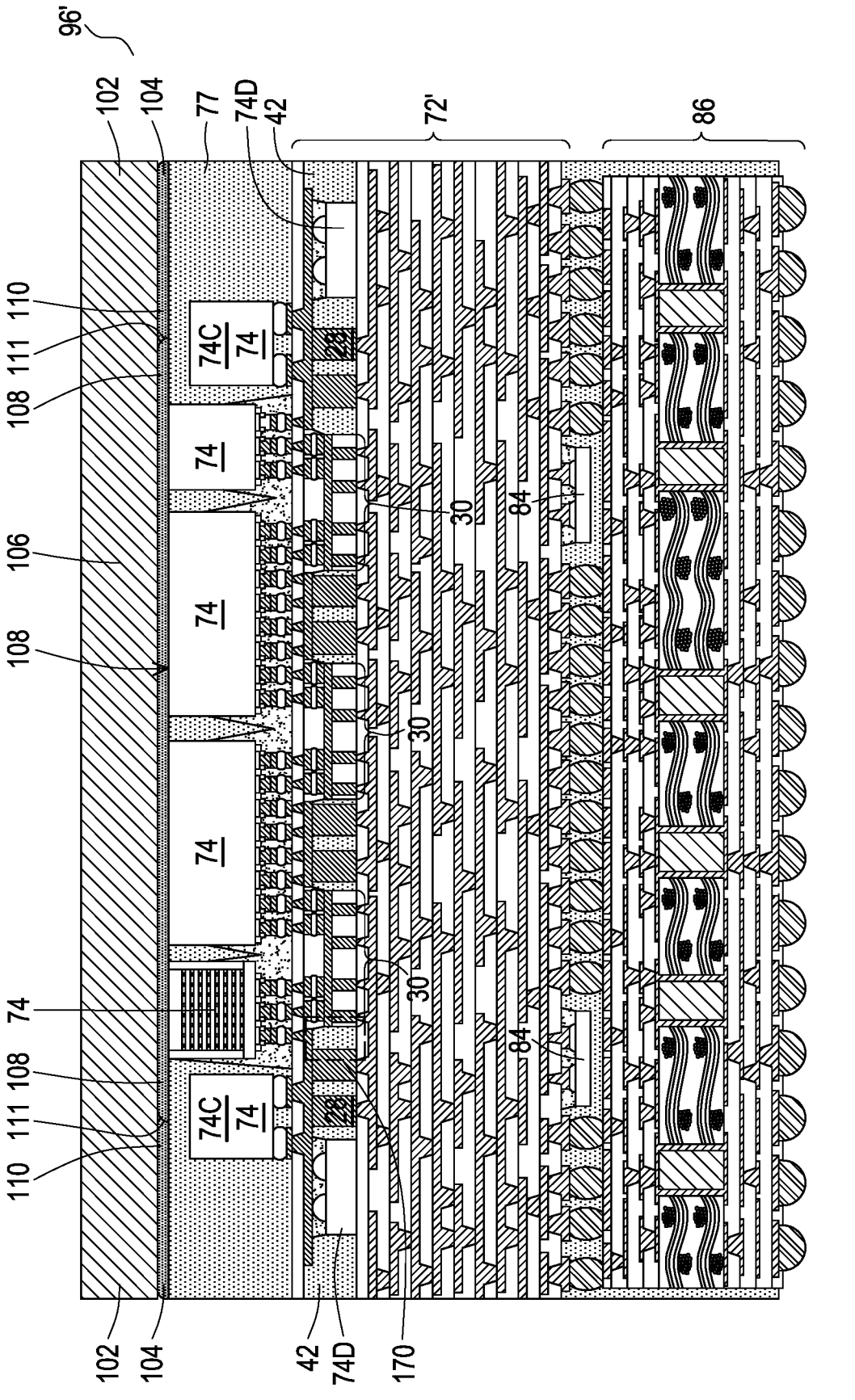

FIG. 34 illustrates a package in accordance with some embodiments of the present disclosure. The package in FIG. 34 is similar to the structure shown in FIG. 33. In accordance with these embodiments, adhesive 110 is in physical contact with, and encircles, TIM 108, with no gap in between. Adhesive 110 and TIM 108 form interface 111 in between. In FIGS. 33 and 34, there are some device dies such as IPDs 74 (marked as 74C) that are covered by a top surface layer of encapsulant 77. IPDs 74C may be overlapped by either one, or both (with partial overlapping), of TIM 108 and adhesive 110.

Figure 35:
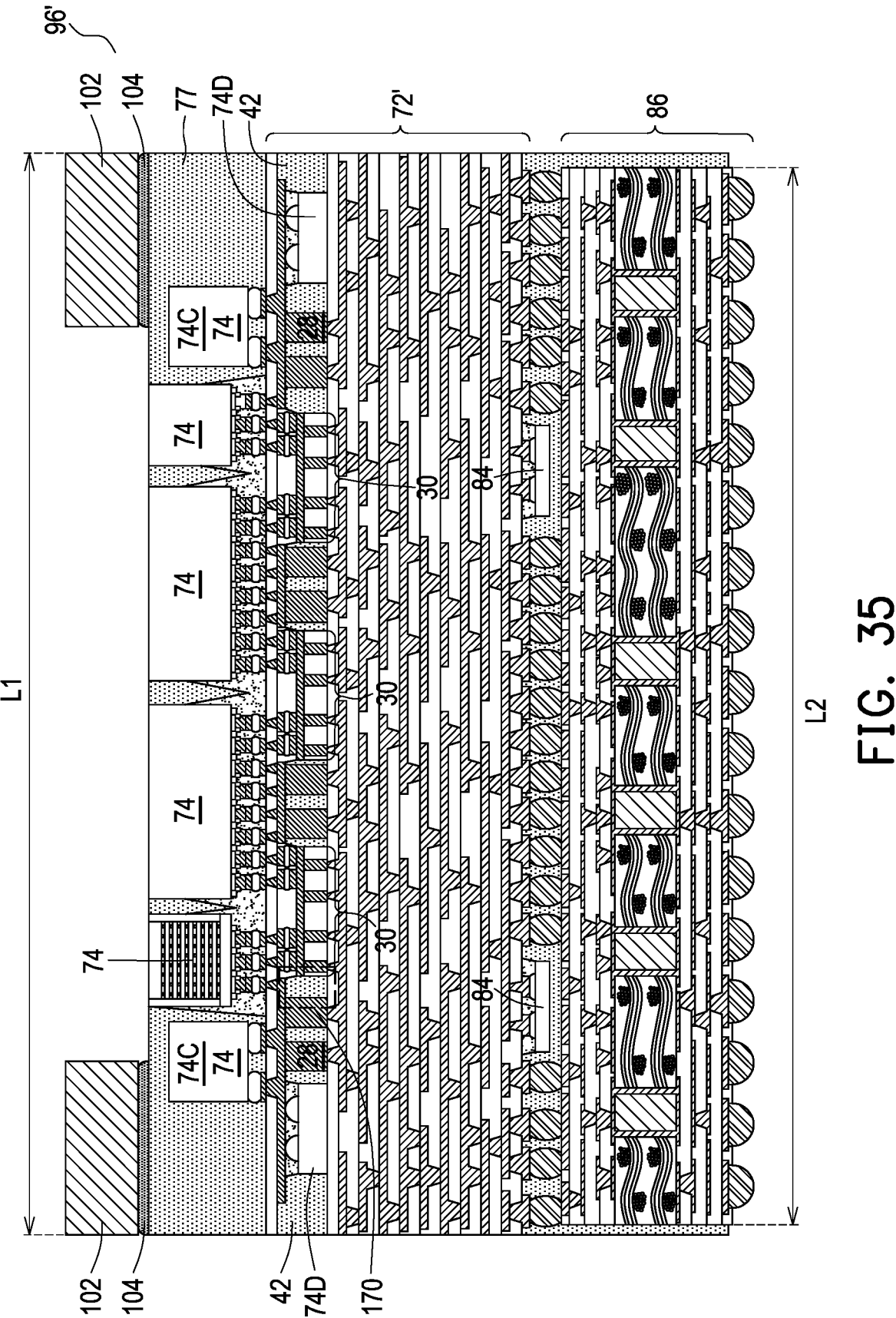

FIG. 35 illustrates a cross-sectional view of package 96' in accordance with some embodiments of the present disclosure. These embodiments are similar to the embodiments as shown in FIG. 31, except that some details are illustrated, and that the relative lateral dimension L1 of package 79' and lateral dimension L2 of package substrate 86 are different from what are shown in FIG. 31. For example, in FIG. 35, InFO package substrate 72' has lateral dimension L1, and package substrate 86 has lateral dimension L2 smaller than lateral dimension L1. As a comparison, in the embodiments as shown in FIG. 31, InFO package substrate 72' has lateral dimension L1, and package substrate 86 has lateral dimension L2 greater than lateral dimension L1.

In accordance with some embodiments, there are some device dies such as IPDs 74C that are covered by a top surface layer of encapsulant 77. In accordance with some embodiments, IPDs 74C are overlapped fully or partially by stiffener ring 102. In accordance with alternative embodiments, stiffener ring 102 does not overlap any of IPDs 74C.

Figure 36:
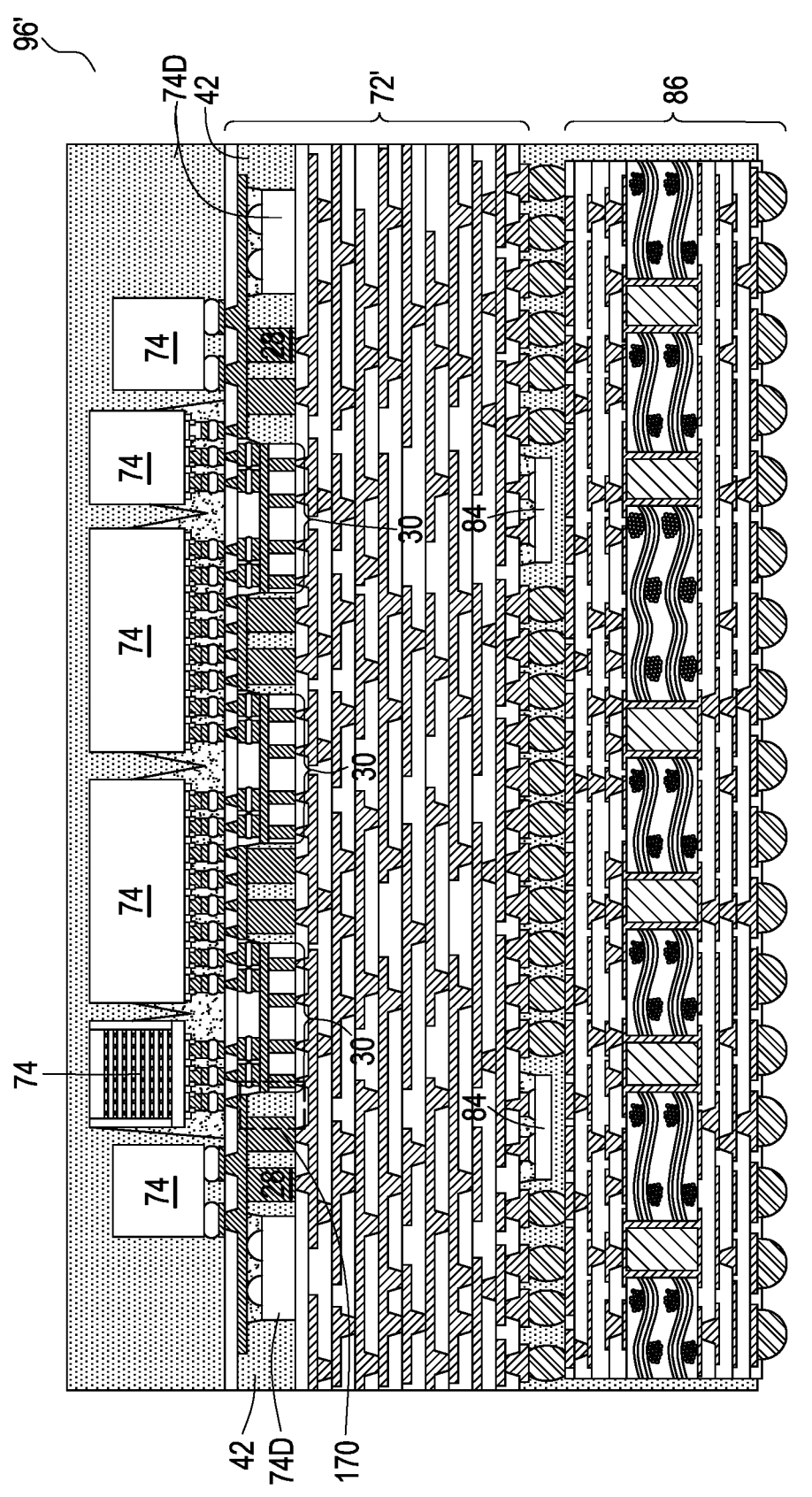

FIG. 36 illustrates a cross-sectional view of package 96' in accordance with some embodiments of the present disclosure. These embodiments are similar to the embodiments as shown in FIG. 17, except that encapsulant 77, after being planarized, includes a top surface portion covering all of package components 74.

Figure 37:
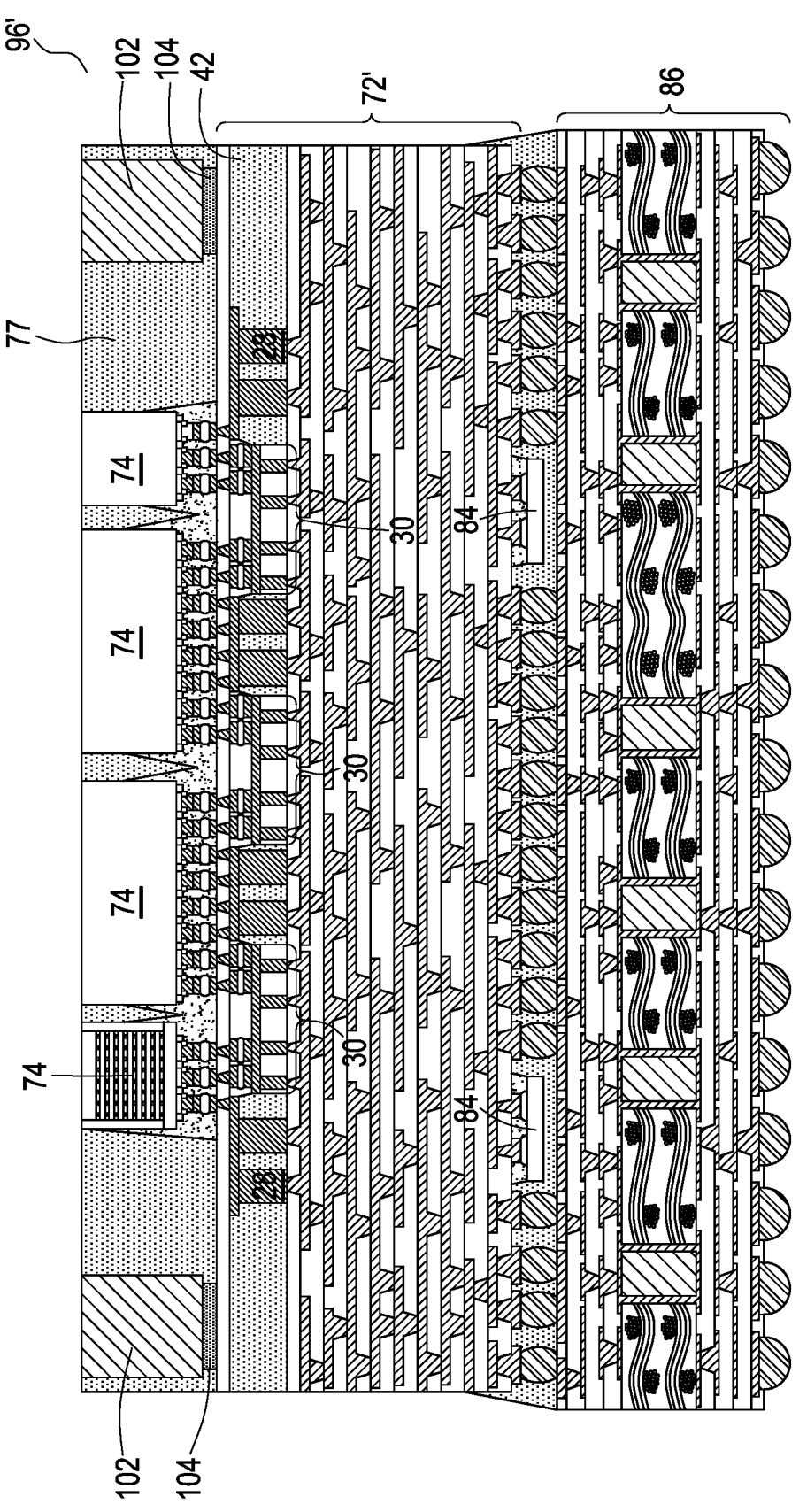

FIG. 37 illustrates a cross-sectional view of package 96' in accordance with some embodiments of the present disclosure. These embodiments are similar to the embodiments as shown in FIG. 17, except that stiffener ring 102 is included. Stiffener ring 102 may be attached to InFO package substrate 72' through adhesive 104. The attachment may be performed in a process that is performed after the process shown in FIG. 10, and before the process shown in FIG. 11. In accordance with some embodiments, in the planarization of encapsulant 77, stiffener ring 102 is planarized, and is revealed after the planarization, as shown in FIG. 37. In accordance with alternative embodiments, stiffener ring 102 is buried in encapsulant 77 after encapsulant 77 is planarized. A layer of encapsulant 77 thus covers and overlaps stiffener ring 102.

FIGS. 38 through 43 illustrate the cross-sectional views of intermediate stages in the formation of packages including through-vias for electrical connection in accordance with some embodiments of the present disclosure. The through-vias are used for electrically connecting InFO package substrates 72' to additional package components. These embodiments are similar to the embodiments in FIGS. 1 through 17, except that in these embodiments (FIGS. 38-43), an InFO package substrate 72 and the corresponding encapsulant 77 are sawed apart first to form discrete packages, and then the discrete packages are bonded to package substrates 86, either through die-to-wafer bonding or die-to-die bonding. As a comparison, in the embodiments as shown in FIGS. 1 through 17, InFO package substrate 72 and the corresponding encapsulant 77 are sawed after, not before, bonding to package substrates 86. These embodiments (FIGS. 38-43) are also similar to the embodiments in FIGS. 24 through 30, with additional through-vias being formed.

Figure 38:
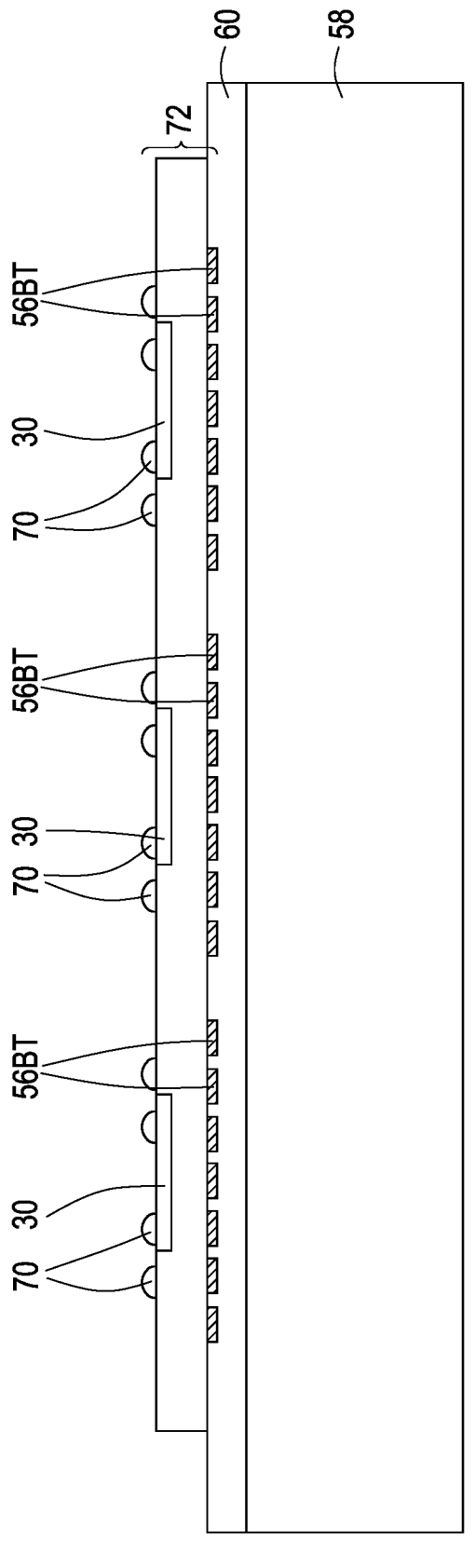
FIGS. 38-43 illustrate the cross-sectional views of intermediate stages in the formation of a package in accordance with some embodiments.

Again, in FIGS. 38 through 43, the details of InFO package substrate 72 are not shown, while the details may be found referring to the embodiments shown in FIG. 8. The surface conductive features 56BT, LSI dies 30, and electrical connectors 70 are illustrated schematically to illustrate the front side (the side having electrical connectors 70) and the back side (the side having conductive features 56BT) of InFO package substrate 72. FIG. 38 illustrates the simplified view of the structure shown in FIG. 8, with the details in InFO package substrate 72 not shown. InFO package substrates 72 is formed over carrier 58 and release film 60.

Figure 39:
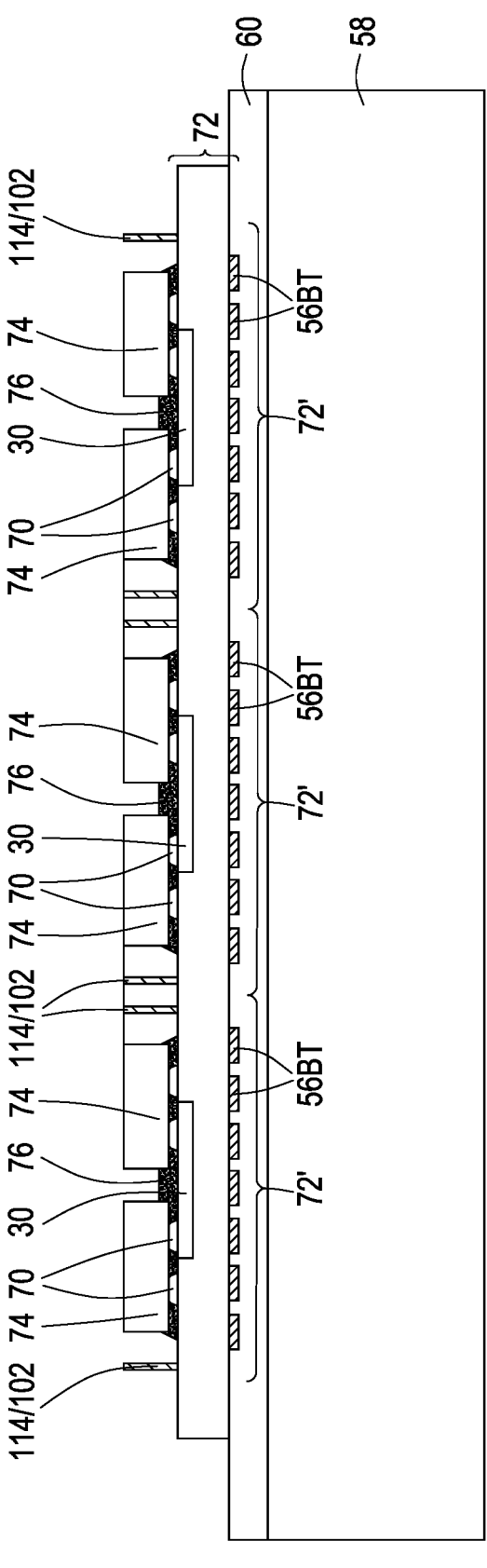

Referring to FIG. 39, a plurality of through-vias 114 are formed over InFO package substrate 72, and electrically connected to the RDLs inside InFO package substrate 72. The formation of through-vias 114 may include depositing a metal seed layer (not shown) over an exposed top surface layer and exposed RDLs in InFO package substrate 72, forming a patterned plating mask (not shown) such as a photoresist over the metal seed layer, and then performing a metal plating process to deposit a metallic material on the exposed metal seed layer. In accordance with some embodiments of the present disclosure, the metal seed layer includes a titanium layer and a copper layer over the titanium layer. The metal seed layer may be formed using, for example, PVD or a like process. The plating may be performed using, for example, an electrochemical plating process. The patterned plating mask and the portions of the metal seed layer covered by the patterned plating mask are then removed, leaving through-vias 114 as shown in FIG. 39. Through-vias 114 are electrically connected to the RDLs inside InFO package substrate 72'.

In accordance with alternative embodiments, instead of forming through-vias 114 on InFO package substrate 72', stiffener rings 102 (also refer to FIG. 37) may be adhered to InFO package substrate 72' at this time. Accordingly, the corresponding features are marked as 114/102 to represent that these features may be either through-vias 114 or stiffener rings 102. In accordance with alternative embodiments, both of through-vias 114 and stiffener rings 102 are formed/attached, with stiffener rings 102 encircling through-vias 114. When stiffener rings 102 are adopted, adhesive films 104 are also adopted, while when through-vias 114 are formed, adhesive films 104 are not adopted.

Further referring to FIG. 39, a plurality of package components 74 are bonded to InFO package substrate 72. Package components 74 may include logic dies, memory dies, IPD dies, packages, or the like. The bonding may be performed through solder bonding, direct metal-to-metal bonding, hybrid bonding, or the like. Next, underfill 76 is dispensed into the gap between package components 74 and the underlying InFO package substrate 72'. Underfill 76 may be spaced apart from through-vias 114, when dispensed.

In accordance with some embodiments, there are a plurality of groups of package components 74 identical to each other, with the plurality of groups of package components 74 being spaced apart from each other to allow space for placing stiffener rings 102 and/or forming through-vias 114. The inter-group spacing between neighboring groups of package components 74 may be greater than the inner-group spacings between the package components 74 in the same group. Each of the stiffener rings 102 may encircle one group of package components 74. The resulting structure, when stiffener rings 102 are adopted, is the same as shown in FIG. 37.

Figure 40:
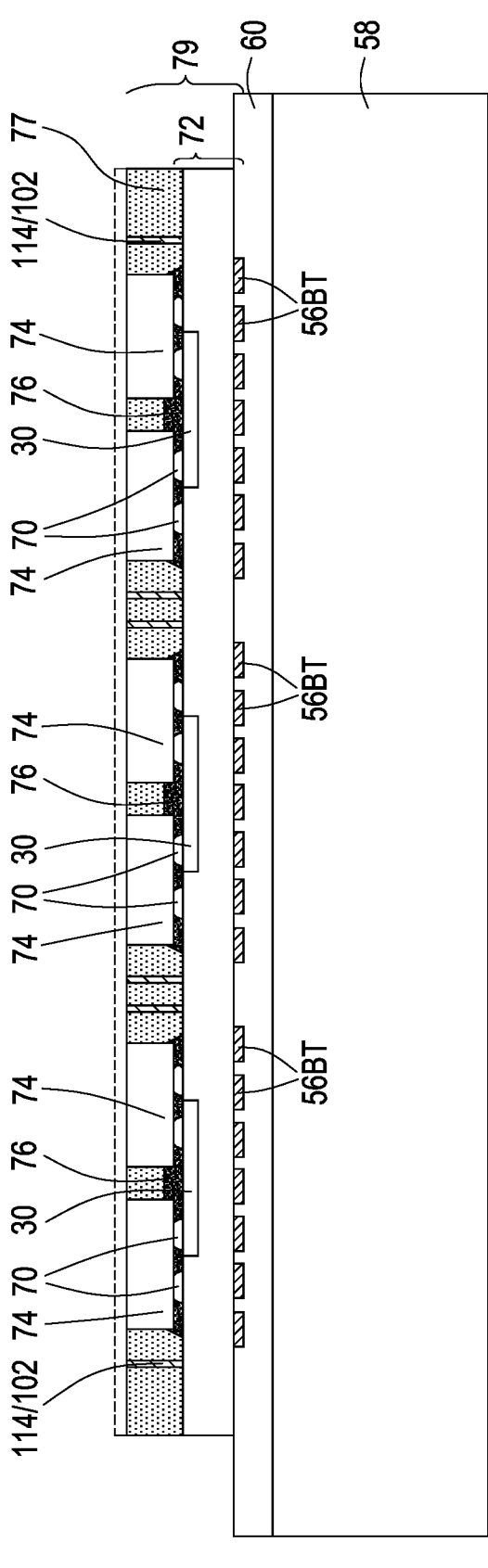

Referring to FIG. 40, package components 74, through-vias 114, and stiffener rings 102 (if adhered) are encapsulated in encapsulant 77. Encapsulant 77 may be or may include a molding compound, a molding underfill, an epoxy, a resin, and/or the like. Encapsulant 77 fills the gaps between neighboring package components 74, through-vias 114, and stiffener rings 102. A planarization process is then performed to level the top surface of encapsulant 77. In accordance with some embodiments, after the planarization process, the back surfaces of package components 74 are revealed. In accordance with alternative embodiments, after the planarization process, a layer of encapsulant 77 is left to cover package components 74, and a dashed line 77TS is shown to represent the top surface of the corresponding encapsulant 77. Through-vias 114 (when formed) are exposed after the planarization process. Stiffener ring 102, when formed, may be revealed after the planarization process. Alternatively, after the planarization process, stiffener ring 102 is still covered by a thin layer of encapsulant 77. Reconstructed wafer 79 is thus formed.

Figure 41:
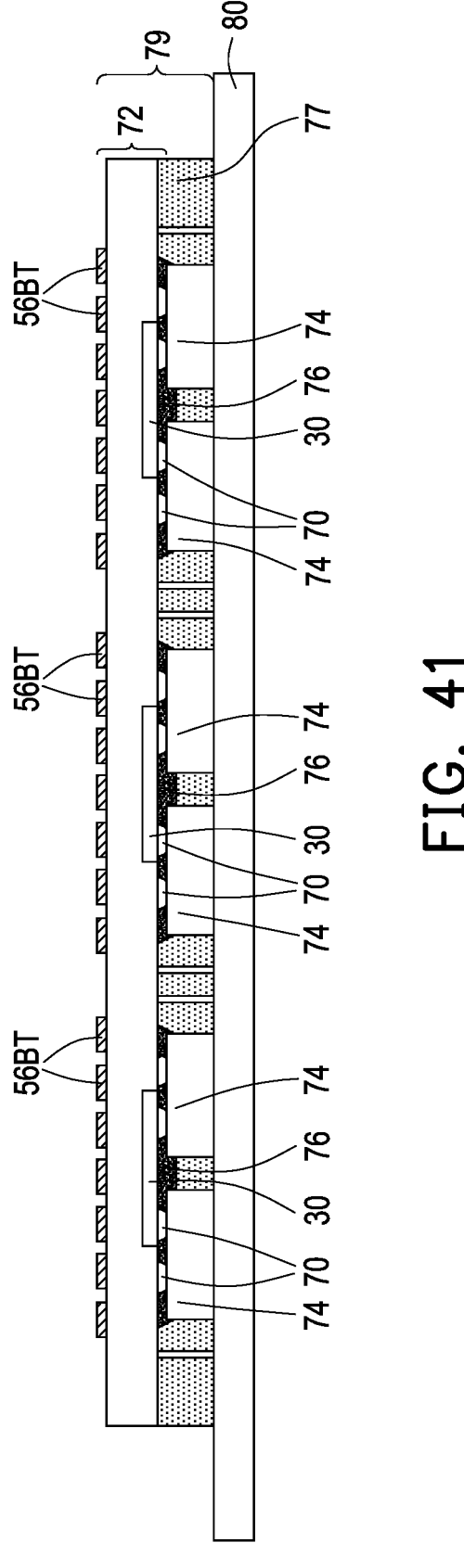

Next, reconstructed wafer 79 is de-bonded (demounted) from carrier 58. The de-bonding process may be performed, for example, by projecting a light beam (which may be a laser beam) on release film 60, and the light beam penetrates through the transparent carrier 58. Release film 60 is thus decomposed. Carrier 58 is lifted off from InFO package substrate 72, and hence InFO package substrate 72 is de-bonded (demounted) from carrier 58. InFO package substrate 72 is then placed on tape 80, which may be fixed on a frame (not shown). The resulting structure is shown in FIG. 41. The backsides of package components 74 face toward, and may be in contact with, tape 80. Conductive features 56BT are exposed.

Figure 42:
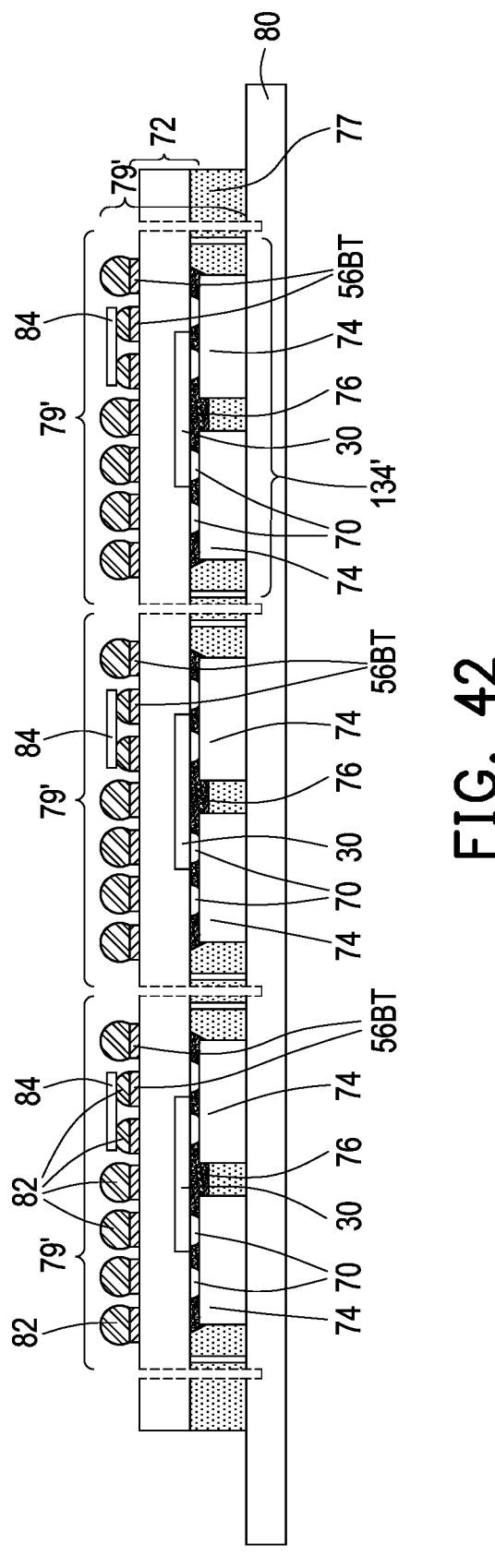

Referring to FIG. 42, solder regions 82 are formed on conductive features 56BT, and are then reflowed. Next, device dies 84 are bonded to InFO package substrate 72 through some of solder regions 82. In accordance with some embodiments, device dies 84 are IPD dies, which may include passive devices such as capacitors, resistors, inductors, and/or the like. In accordance with alternative embodiments, device dies 84 may include active devices. Reconstructed wafer 79 is thus formed.

Next, as also shown in FIG. 42, a singulation process is performed to saw reconstructed wafer 79, so that discrete packages 79' are formed. In a subsequent process, a plurality of packages 79' are bonded to wafer-level package substrate 86W (not shown, refer to FIG. 22) that includes a plurality of un-sawed package substrates 86 therein. The bonding may be performed through die-to-wafer bonding, wherein each of packages 79', which are in the form of dies, is bonded to one of the package substrates 86 in the wafer-level package substrate 86'. After being bonded, packages 79' are laterally spaced apart from each other by gaps.

Figure 43:
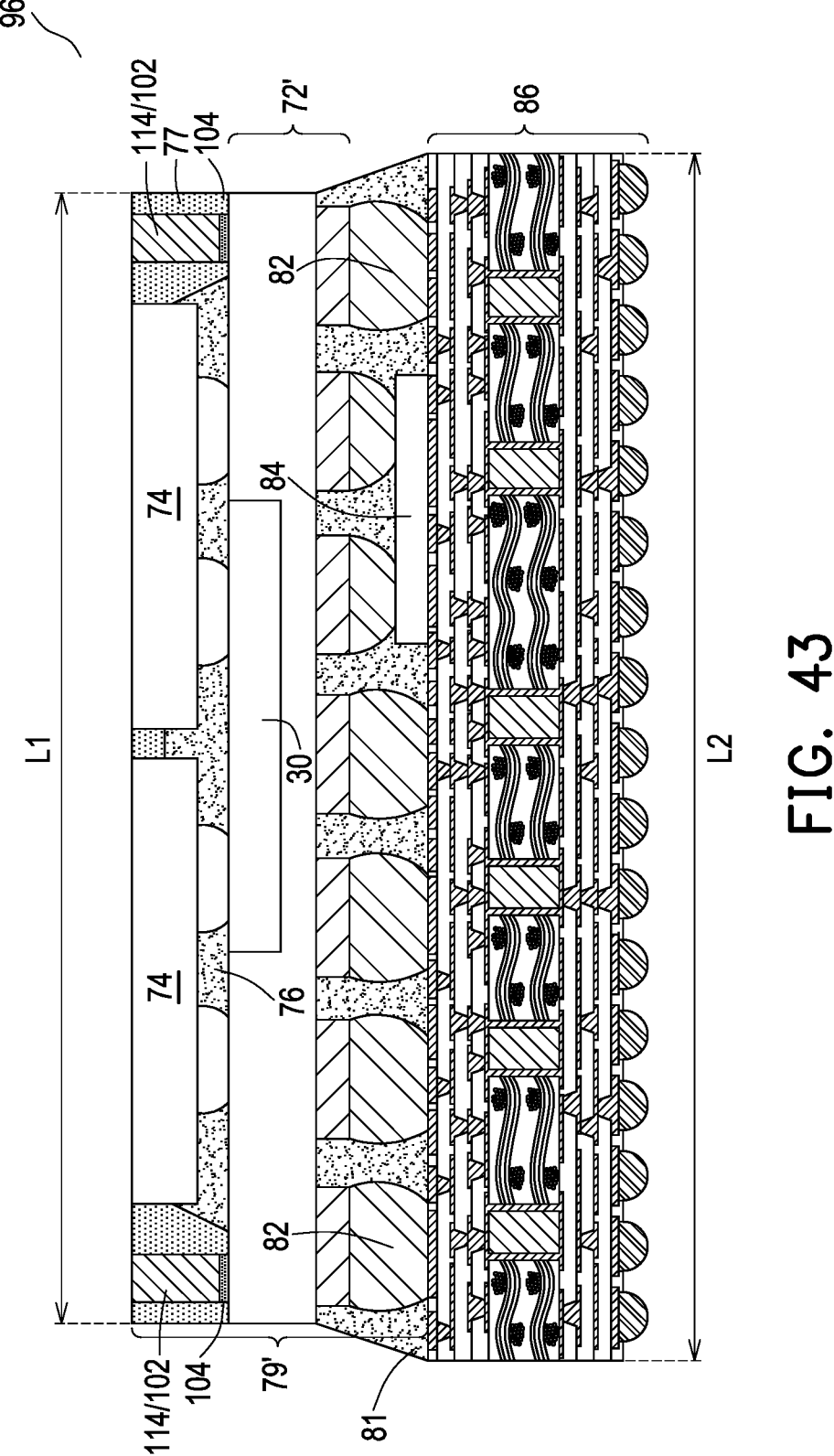

In a subsequent process, underfill 81 (FIG. 43) is dispensed into the gaps between the package substrates 86 and the respective discrete packages 79'. A singulation process may then be performed to separate the package substrates 86 in wafer-level package substrate 86W from each other. Packages 96' are thus formed, with FIG. 43 illustrating one of packages 96'. In the resulting package 96', the edges of package substrate 86 extend laterally beyond the respective edges of package substrate 72' and encapsulant 77. Also, InFO package substrate 72' has lateral dimension L1, and package substrate 86 has lateral dimension L2 greater than lateral dimension L1. In FIG. 43, the feature marked as 114/102 represent either one, or both, of through-vias 114 and stiffener ring 102. Since adhesive film 104 is used to adhere stiffener ring 102, when through-vias 114 are formed, adhesive films 104 are not formed. Accordingly, in FIG. 43, adhesion films 104 are marked using dashed lines to represent that adhesive films 104 may or may not be used.

FIGS. 44 through 47 illustrate the cross-sectional views of intermediate stages in the formation of packages, in which through-vias 114 are formed for electrical connection purpose in accordance with some embodiments of the present disclosure. The through-vias 114 are used for electrically connecting InFO package substrates 72' to additional package components. These embodiments are similar to the embodiments in FIGS. 38 through 42, except that in FIGS. 38 through 42, an InFO package substrate 72 and the corresponding encapsulant 77 are sawed apart first to form discrete packages, and then the discrete packages are bonded to package substrates 86, either through die-to-wafer bonding or die-to-die bonding. As a comparison, in the embodiments as shown in FIGS. 44 through 47, InFO package substrate 72 and the corresponding encapsulant 77 are sawed after, not before, bonding to package substrates 86.

The initial processes of these embodiments are essentially the same as shown in FIGS. 38 through 42, except that the singulation process shown in FIG. 42 is not performed.

Accordingly, the structure as shown in FIG. 42 (before being singulated) is the initial structure in accordance with the present embodiments.

Figure 44:
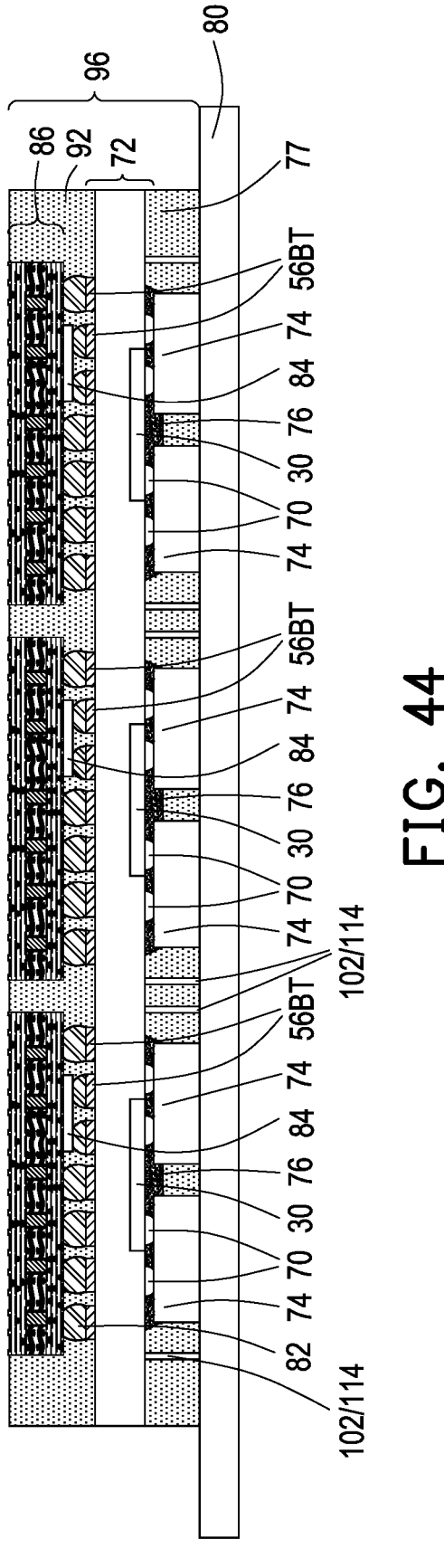
FIGS. 44-47 illustrate the cross-sectional views of intermediate stages in the formation of a package in accordance with some embodiments.

Next, FIG. 44 illustrates the bonding of a plurality of package substrates 86 to InFO package substrate 72. Package substrates 86 may include organic dielectric layers, and are sometimes referred to as organic package substrates. Package substrates 86 may be cored package substrates including cores and PTHs therein. In accordance with some embodiments, as shown in FIG. 44, package substrates 86 are discrete package substrates physically separated from each other. In accordance with alternative embodiments, package substrates 86 are in an un-sawed wafer 86W (FIG. 22), and are bonded to InFO package substrate 72 through wafer-to-wafer bonding.

Further referring to FIG. 44, encapsulant 92 is dispensed. Encapsulant 92 fills the gaps between package substrates 86 and the underlying InFO package substrate 72. In accordance with some embodiments in which discrete package substrates 86 are adopted, encapsulant 92 also fills the gaps between neighboring package substrates 86. Encapsulant 92 may include a molding underfill, which is also filled into the gap between InFO package substrate 72 and the overlying package substrates 86. Reconstructed wafer 96 is thus formed.

Figure 45:
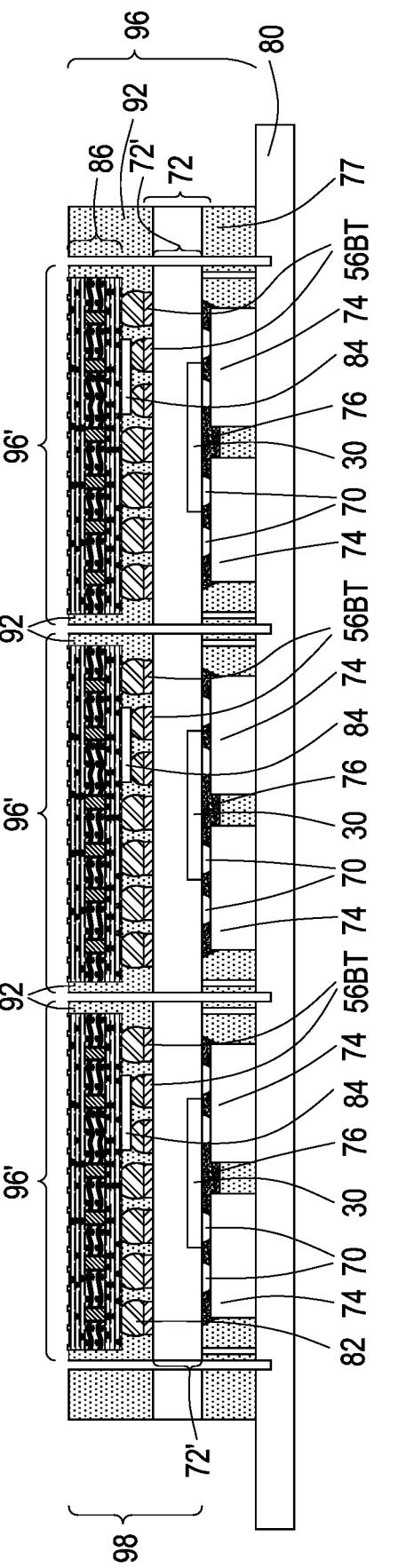

FIG. 45 illustrates a singulation process for separating reconstructed wafer 96 into discrete packages 96'. The InFO package substrates 72' and the corresponding package substrates 86 in combination function as integrated package substrates. The singulation process may be performed using a blade, or through a laser ablation process. In accordance with some embodiments, as shown in FIG. 45, the singulation process is performed by cutting through the middle parts of the portions of encapsulant 92 between neighboring package substrates 86, with no package substrate 86 being cut-through. Accordingly, in each of packages 96', encapsulant 92 may fully encircle package substrate 86. In accordance with alternative embodiments, the singulation process is performed by cutting through encapsulant 92 and the edge portions of package substrates 86. Accordingly, in each of packages 96', encapsulant 92 may be removed from the sidewalls of package substrates 86, and the sidewalls of package substrates 86 are exposed after the singulation process.

Figure 46:
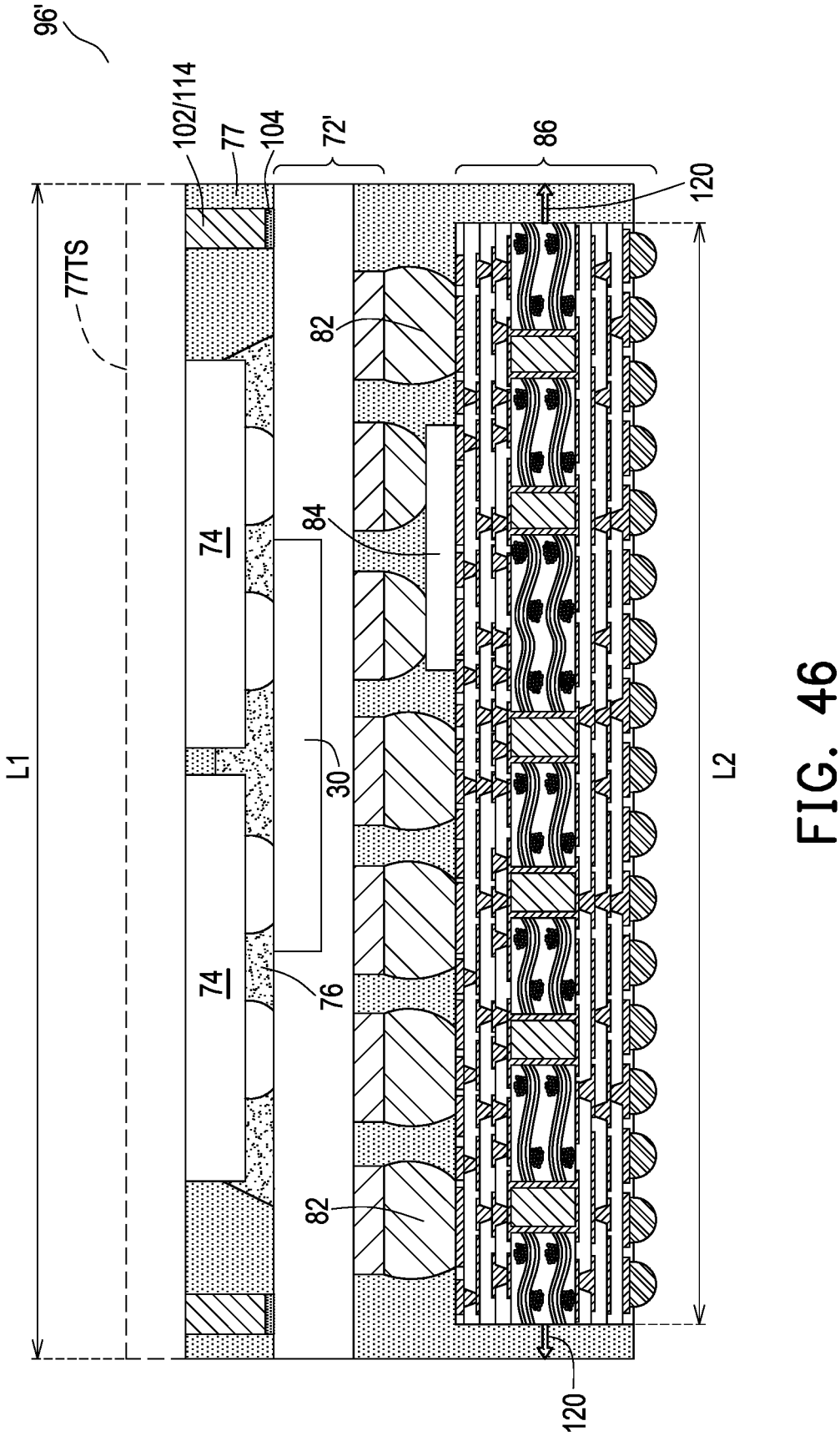

FIG. 46 illustrates the cross-sectional view of one of packages 96' in accordance with some embodiments. The example embodiment as shown in FIG. 46 shows that the edges of package substrate 86 are laterally recessed from the respective edges of InFO package substrate 72'. As a result, in package 96', the remaining encapsulant 92 may form a full ring encircling package substrate 86. In accordance with alternative embodiments, the edges of package substrate 86 may be vertically aligned to the respective edges of InFO package substrate 72'. Accordingly, in the structure shown in FIG. 46, InFO package substrate 72' has lateral dimension L1, and package substrate 86 has lateral dimension L2 smaller than lateral dimension L1.

FIG. 46 illustrates arrows 120, which represent that the edges of package substrates 86 may also be extended to be vertically aligned to the edges of InFO package substrate 72'. In the corresponding package 96', package substrate 86 will have lateral dimension L2 equal to the lateral dimension L1 of InFO package substrate 72'.

Figure 47:
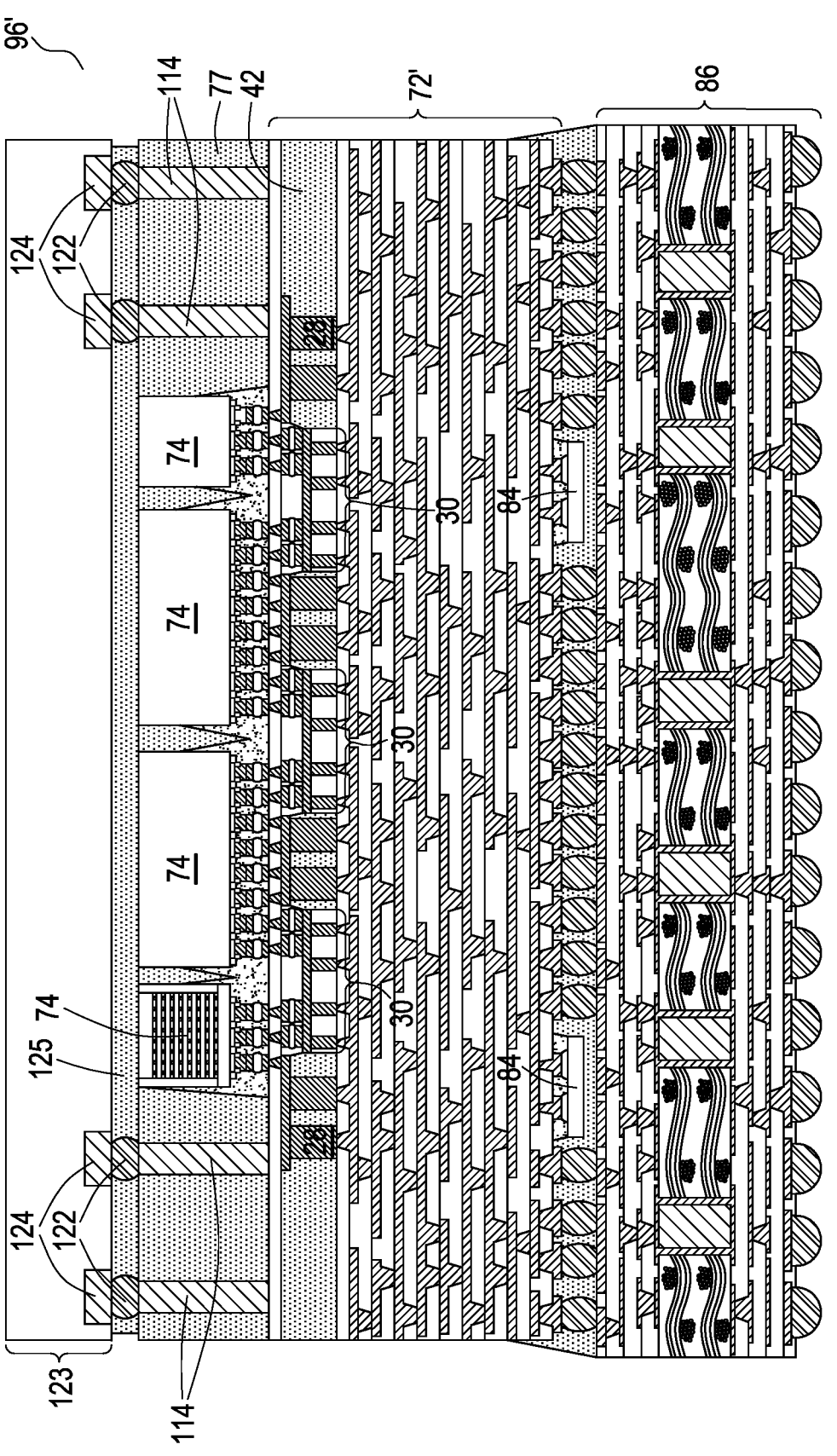

FIG. 47 illustrates the cross-sectional view of an embodiment in which through-vias 114 are formed. Accordingly, package 96' is bonded with package component 123 in accordance with some embodiments. The bonding may be performed, for example, through solder regions 122. Solder regions 122 may be in physical contact with through-vias 114 and the conductive features 124 in package component 123. Conductive features 124 may be or may comprise metal pads, metal pillars, Under-Bump Metallurgies (UBMs), or the like. Underfill 125 may be dispensed between package 96' and package component 123. In accordance with some embodiments, package component 123 comprises a memory die(s), a logic die(s), an IPD die(s), a package(s), or the like, or combinations thereof. Package component 123 may be electrically connected to packages components 74 through through-vias 114 and the RDLs in InFO package substrate 72'. Package component 123 may also be electrically connected to package substrate 86 through LSI dies 30, and possibly through through-vias 28.

Figure 48:
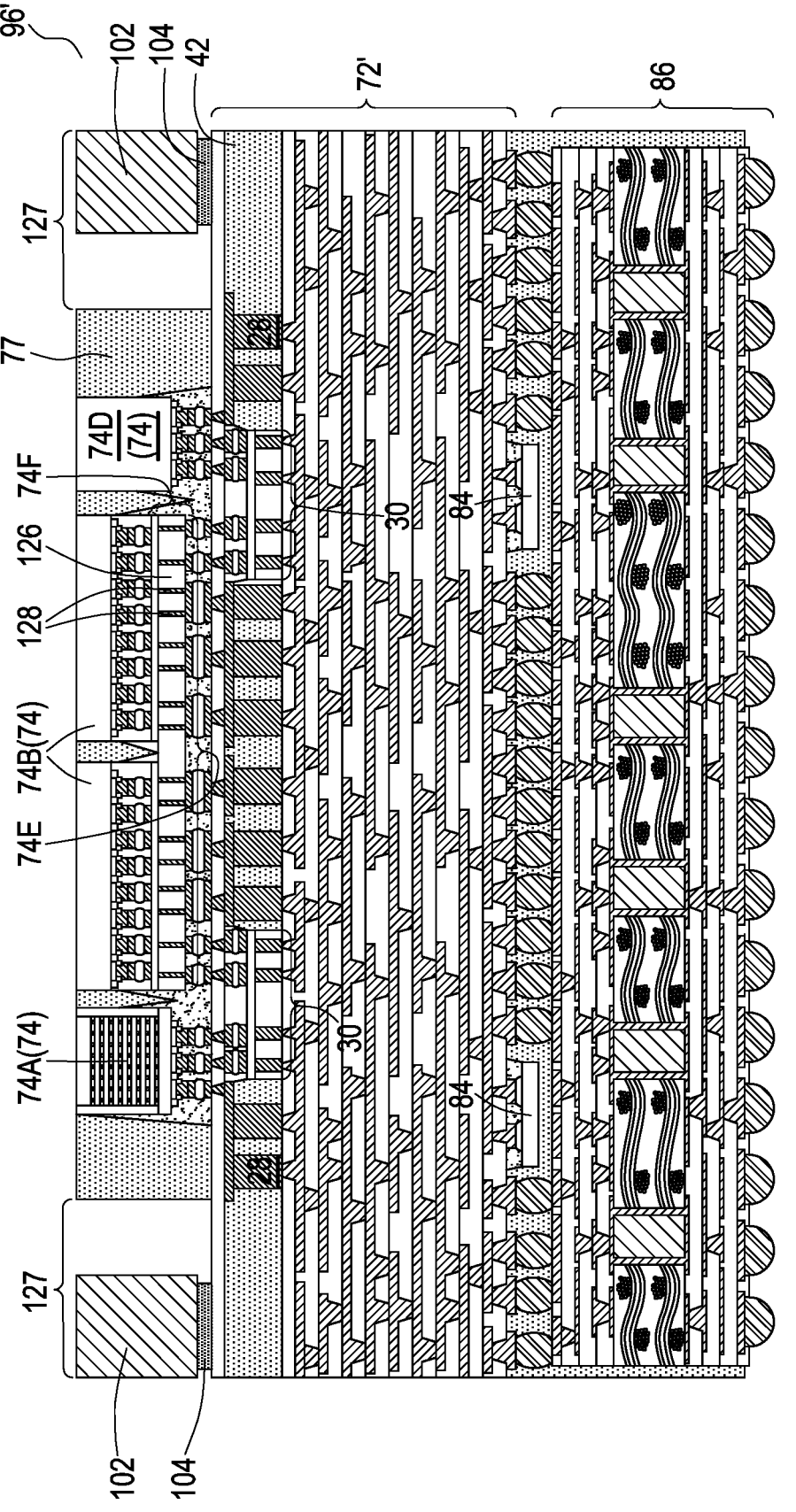
FIGS. 48-50 illustrate the cross-sectional views of some packages in accordance with some embodiments.

FIG. 48 illustrates the cross-sectional view of package 96' in accordance with alternative embodiments of the present disclosure. In accordance with some embodiments, encapsulant 77 has their edges laterally recessed from the edges of InFO package substrate 72' to allow room for the placement of stiffener ring 102. This may be achieved, for example, by using a designed mold chase for dispensing encapsulant 77. The Mold chase may have some portions occupying regions (spaces) 127, so that encapsulant 77 is not filled into regions 127. After encapsulant 77 is dispensed, stiffener ring 102 is attached to InFO package substrate 72' through adhesive films 104.

In accordance with some embodiments, a package 74E is bonded to InFO package substrate 72' directly, along with other package components 74A and 74D. In accordance with some embodiments, package component 74E includes interposer 74F and package components 74B (such as device dies) bonded to interposer 74F. Interposer 74F may be a silicon interposer including a silicon substrate 126 and through-vias 128 penetrating through the silicon substrate 126.

As shown in the FIG. 48 (and the preceding embodiments), LSI dies 30 are built in InFO package substrate 72. LSI dies 30 are used to electrically and signally interconnect package components 74. It is appreciated that LSI dies 30 are not in package 74E. Rather, LSI dies 30 are inside InFO package substrate 72'. As a comparison, in related structures, an LSI die 30 would have been built in the package 74E, and will be bonded to the bottom side of interposer 74F. The package components that are to be electrically interconnected through the LSI die 30 will be bonded to the top side of interposer 74F. For example, in the related structure in which LSI dies 30 are not in InFO package substrate 72', package component 74A will also be built in package 74E along with package component 74B, so that LSI die 30 may electrically interconnect package components 74A and 74B. Package 74E will thus be larger. The yield of the bonding will be degraded due to the significant warpage of the large package components.

Figure 49:
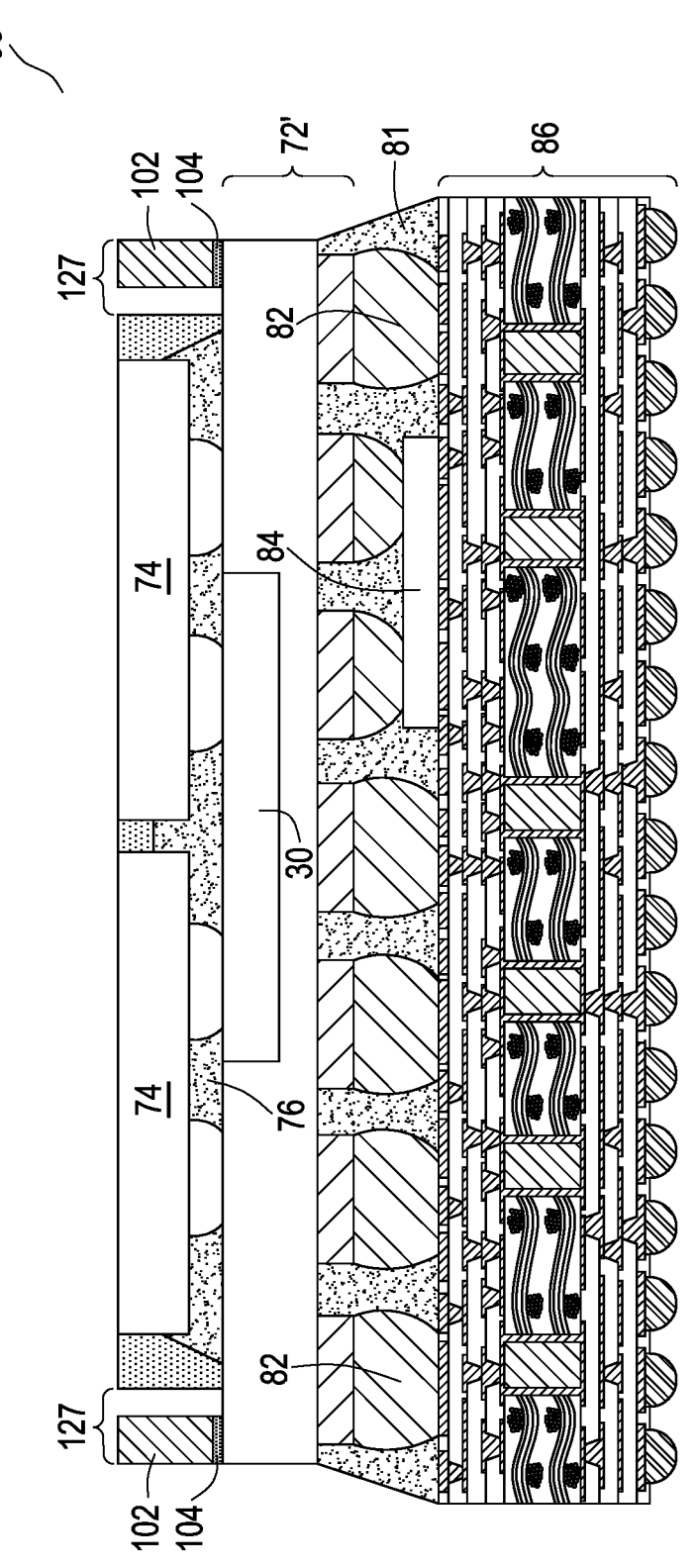

FIG. 49 illustrates the cross-sectional view of package 96' formed in accordance with some embodiments. This embodiment is similar to the embodiment as shown in FIG. 48, except that package substrate 86 is wider than, and extends laterally beyond the edges of, InFO package substrate 72'. In accordance with some embodiments, encapsulant 77 has their edges laterally recessed from the edges of InFO package substrate 72' to allow room for the placement of stiffener ring 102. This may be achieved, for example, by using a mold chase that has some portions occupying the regions (spaces) 127 that are not intended to be filled with encapsulant 77. Stiffener ring 102 is attached to InFO package substrate 72' through adhesive films 104, and is located in regions 127.

Figure 50:
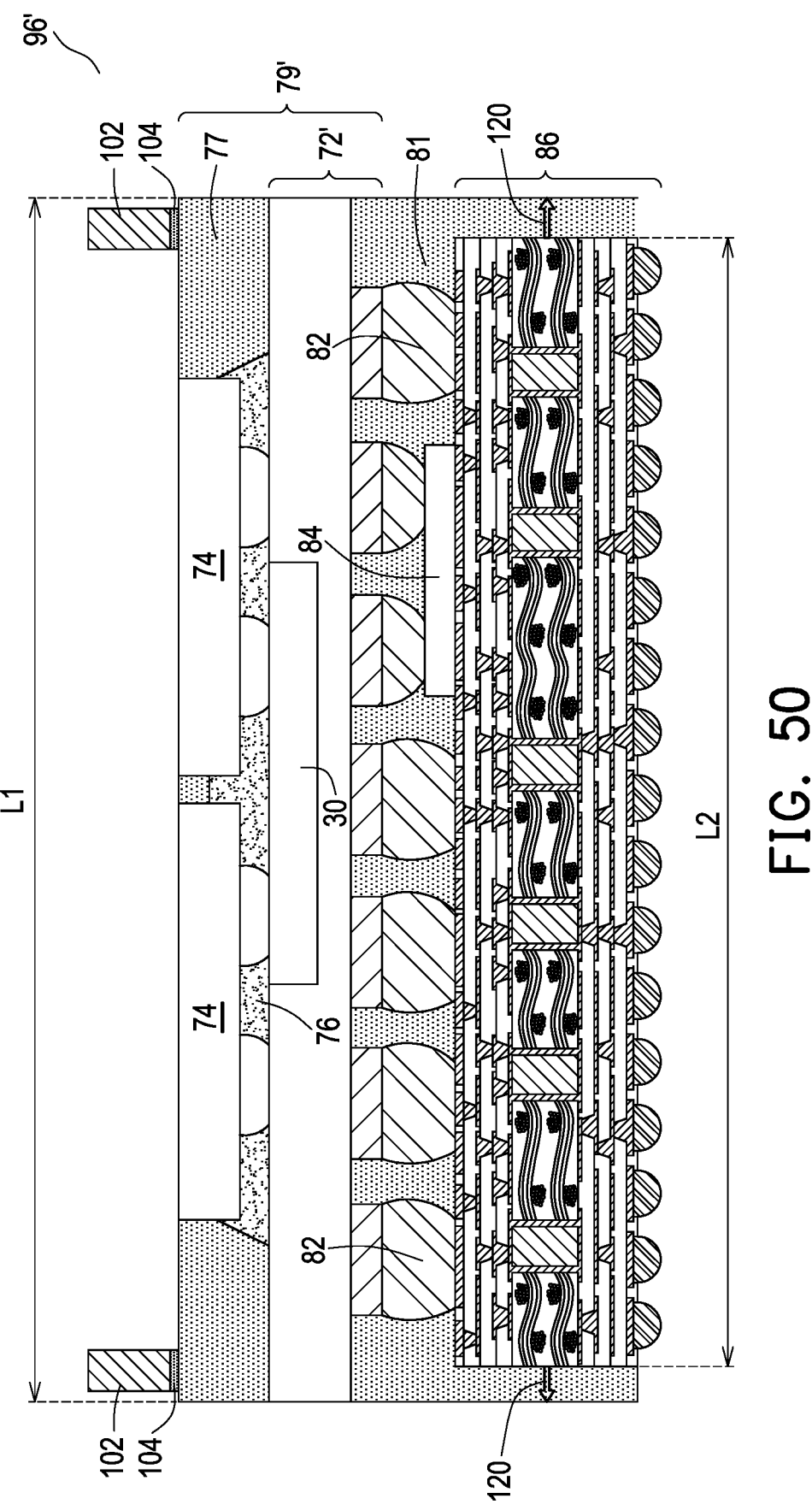

FIG. 50 illustrates the cross-sectional view of package 96' formed in accordance with some embodiments. This embodiment is similar to the embodiment as shown in FIG. 31, except that in the embodiment shown in FIG. 31, the lateral dimension L1 of InFO package substrate 72' is smaller than the lateral dimension L2 of package substrate 86, while in the embodiment shown in FIG. 50, the lateral dimension L1 of InFO package substrate 72' is greater than the lateral dimension L2 of package substrate 86. Arrows 120 are also shown in FIG. 50 to represent that the edges of package substrate 86 may be vertically aligned to the corresponding edges of InFO package substrate 72'. In FIG. 50, the four side portions of stiffener ring 102 may be parallel to and adjacent to the edges of package 79', which includes InFO package substrate 72' and package components 74 therein. The outer edges of stiffener ring 102 may be vertically aligned to (or may be laterally recessed from) the respective edges of InFO package substrate 72'.

FIGS. 51 through 60 illustrate the cross-sectional views of intermediate stages in the formation of packages in accordance with some embodiments of the present disclosure. These embodiments are similar to the embodiments as shown in FIGS. 1 through 17, except that in the embodiments shown in FIGS. 51 through 60, package components 74 are encapsulated in encapsulant 77 first to form a reconstructed wafer, and the reconstructed wafer is bonded to InFO package substrate 72 through wafer-to-wafer bonding. As a comparison, in the preceding embodiments as shown in FIGS. 1 through 17, package components 74 are bonded to InFO package substrate 72 first through die-to-wafer bonding, and the bonded package components 74 are then encapsulated in encapsulant 77.

Figure 51:
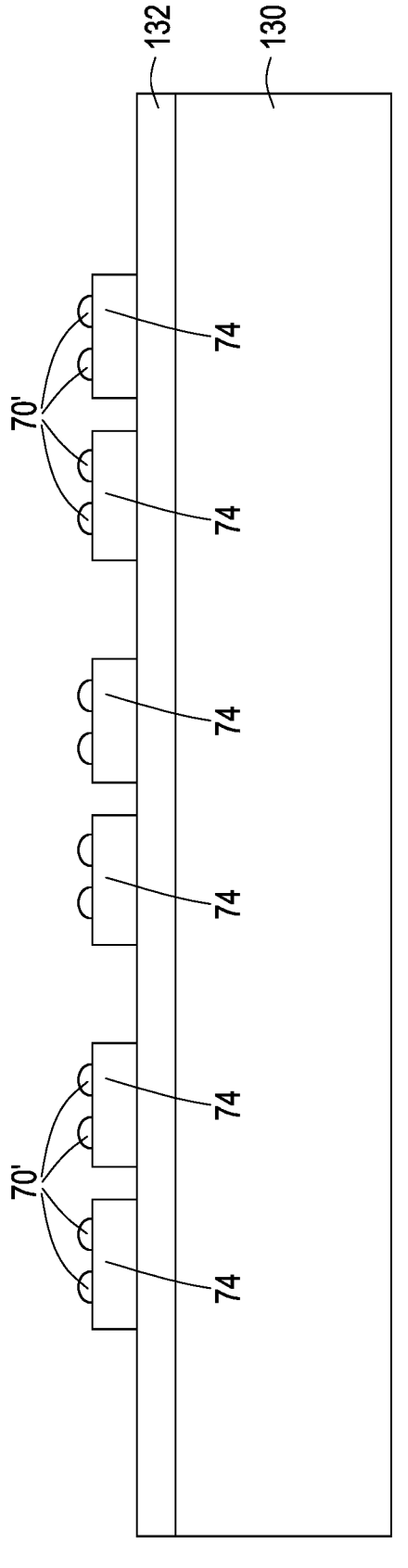
FIGS. 51-60 illustrate the cross-sectional views of intermediate stages in the formation of a package in accordance with some embodiments.

Referring to FIG. 51, carrier 130 is provided, and release film 132 is coated on carrier 130. Carrier 130 is formed of a transparent material, and may be a glass carrier, a ceramic carrier, or the like. Release film 132 may be formed of an LTHC coating material. Release film 132 may be applied onto carrier 130 through coating. In accordance with some embodiments, the LTHC coating material is capable of being decomposed under the heat of light/radiation (such as a laser beam), and hence can release carrier 130 from the structure formed thereon.

Figure 54:
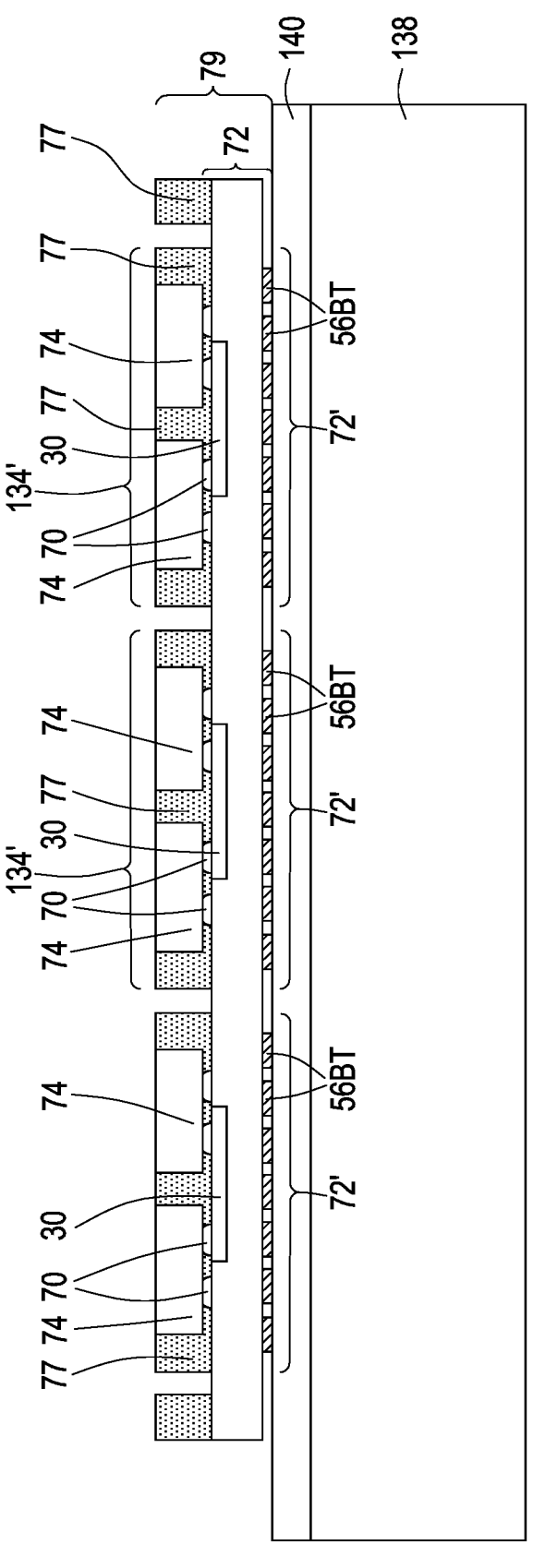

Next, as also shown in FIG. 51, package components 74 are placed over carrier 130. In accordance with some embodiments, package components 74 are placed with their front sides facing up, so that the electrical connectors 70', such as solder regions, metal pillars, metal pads, and/or the like, are on the top sides of package components 74. Package components 74 may include logic dies, memory dies, IPD dies, and/or the like. The spacings between package components 74 are arranged according to the positions of the electrical connectors 70 in InFO package substrate 72 (FIGS. 8 and 9), so that in the subsequent bonding process, the electrical connectors 70' are aligned to the electrical connectors 70 (FIG. 54).

Figure 52:
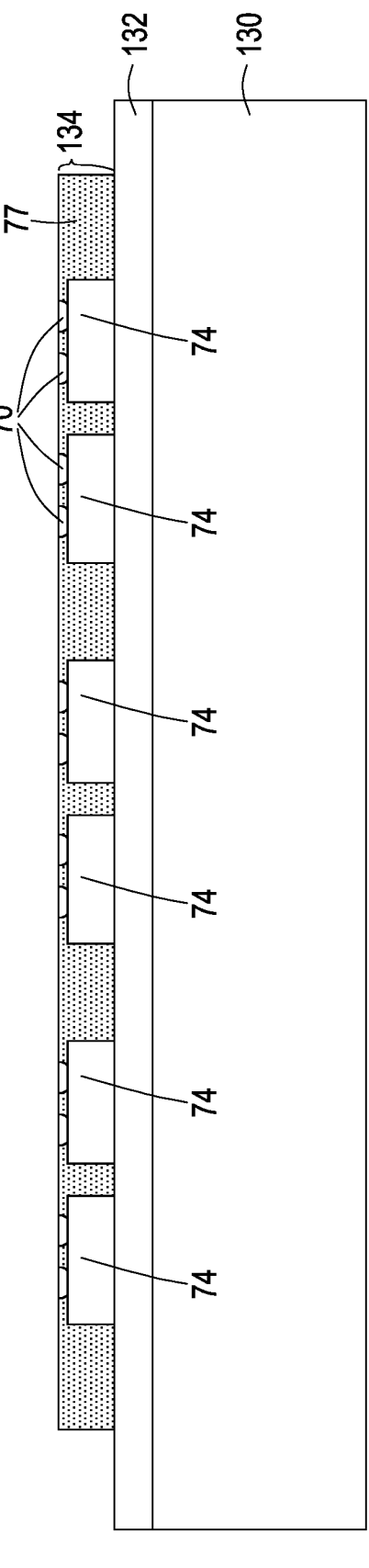

Referring to FIG. 52, package components 74 are encapsulated in encapsulant 77. Encapsulant 77 may be or may include a molding compound, a molding underfill, an epoxy, a resin, and/or the like. Encapsulant 77 may include a base material, which may be a polymer, a resin, an epoxy, or the like, and filler particles in the base material. The filler particles may be dielectric particles of silica, alumina, boron nitride, or the like, and may have spherical shapes. Encapsulant 77 fills the gaps between neighboring package components 74. The top surface of encapsulant 77 is higher than electrical connectors 70' when encapsulant 77 is dispensed. Next, encapsulant 77 is planarized in a planarization process such as a CMP process or a mechanical grinding process. Electrical connectors 70' are thus revealed after the planarization process. The resulting structure including package components 74 and encapsulant 77 are collectively referred to as reconstructed wafer 134.

Next, reconstructed wafer 134 is de-bonded (demounted) from carrier 130. The de-bonding may be performed, for example, by projecting a light beam (which may be a laser beam) on release film 132, and the light beam penetrates through the transparent carrier 130. Release film 132 is thus decomposed under the heat of the light beam. Reconstructed wafer 134 is then lifted from carrier 130.

Figure 53:
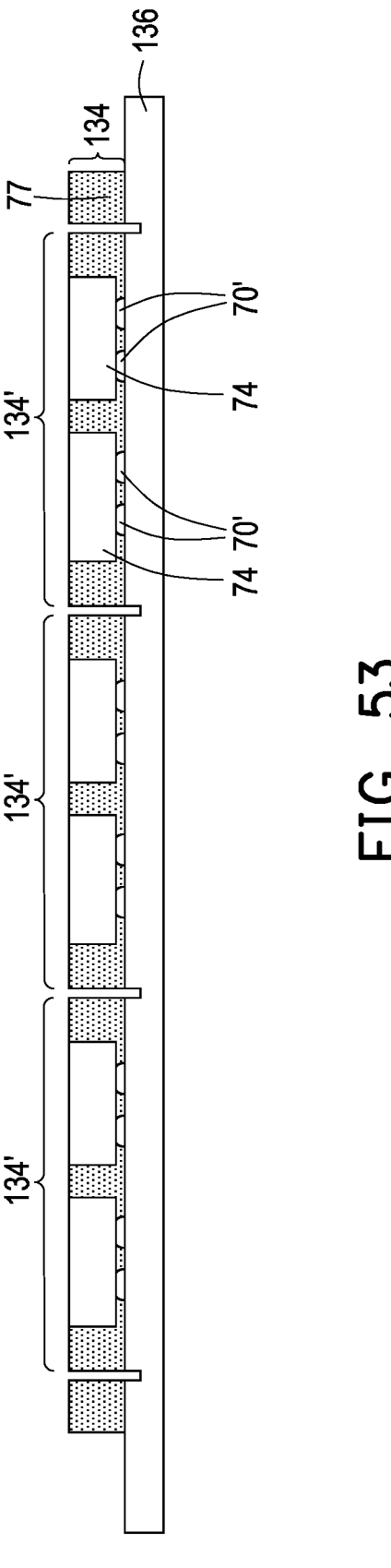

Next, referring to FIG. 53, reconstructed wafer 134 is placed on tape 80, which may be fixed on a frame (not shown). The front sides of package components 74 including electrical connectors 70' face toward, and may be in contact with, tape 136.

FIG. 53 further illustrates a singulation process for separating reconstructed wafer 134 into discrete packages 134'. The singulation process may be performed using a blade, or through a laser ablation process. In each of packages 134', encapsulant 77 may have a top surface coplanar with the back surfaces of package components 74, and a bottom surface coplanar with the bottom surfaces of electrical connectors 70'.

FIG. 54 illustrates the bonding of packages 134' to the InFO package substrates 72' in InFO package substrate 72. InFO package substrate 72 may be placed over carrier 138 through release film 140. Carrier 138 may be a transparent carrier such as a glass carrier. Release film 140 may be a thermal release film such as an LTHC film in accordance with some embodiments. The details of the materials, the structure, and the formation processes of InFO package substrate 72 are not repeated herein, while the details may be found referring to the embodiments shown in FIGS. 1 through 8. The surface conductive features 56BT, LSI dies 30, and electrical connectors 70 are illustrated schematically to illustrate the front side (the side having electrical connectors 70) and the back side (the side having conductive features 56BT) of InFO package substrate 72.

The bonding of packages 134' to the InFO package substrates 72' may be achieved through electrical connectors 70. The solder in electrical connectors 70' (FIG. 53) may be merged with the solder in electrical connectors 70, and hence electrical connectors 70' are not illustrated separately. In accordance with some embodiments, there is no underfill extending into the gaps between package components 74 and InFO package substrates 72'. The entire bottom surface of encapsulant 77 in the same package 134' may be coplanar, and may be in physical contact with, or higher than and spaced apart from, the respective underlying InFO package substrate 72'.

Figure 55:
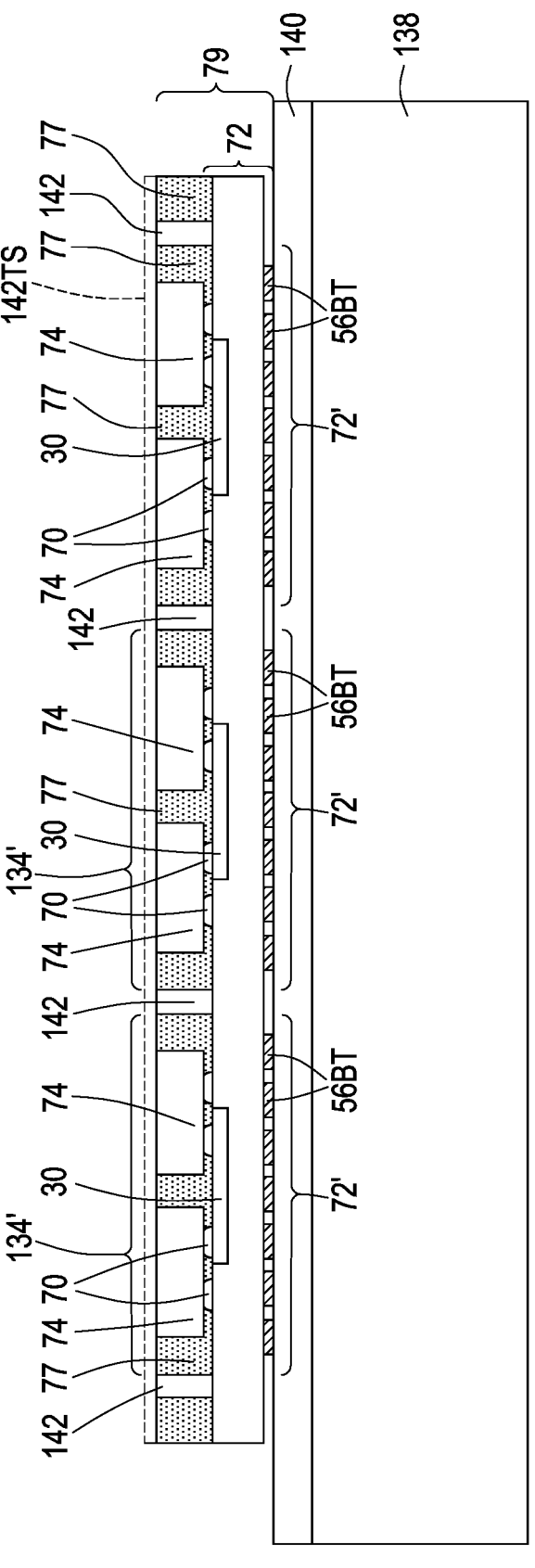

Next, referring to FIG. 55, another encapsulating process is performed. So that packages 134' are encapsulated in encapsulant 142. Encapsulant 142 may also be a molding compound, a molding underfill, a resin, an epoxy, and/or the like. Encapsulant 142 may also include a base material, which may be a polymer, a resin, an epoxy, or the like, and filler particles in the base material. The filler particles may be dielectric particles of silica, alumina, boron nitride, or the like, and may have spherical shapes. Since encapsulant 77 has been sawed in the process shown in FIG. 53, and some of the filler particles in encapsulant 77 have been sawed into partial spherical particles, the interfaces between encapsulants 77 and 142 are distinguishable. In accordance with some embodiments, encapsulants 77 and 142 are the same type of encapsulant such as the same type of molding compound. In accordance with alternative embodiments, encapsulants 77 and 142 are different from each other, for example, with the different types of base materials, different materials of filler particles, and/or different sizes of filler particles, etc.

I accordance with some embodiments, no stiffener ring is used in packages 134', as shown in FIG. 55. In accordance with alternative embodiments, stiffener rings 102 may also be attached to InFO package substrates 72'. Stiffener rings 120 may be attached at a time after the formation of the structure shown in FIG. 54, and before the dispensing of encapsulant 142. Accordingly, the stiffener rings 102 will be encapsulated in encapsulant 142, and may be in contact with, or may be spaced apart from, the sidewalls of encapsulant 77. The resulting package 96' is similar to what is shown in FIG. 37, except both of encapsulant 77 and 142 will exist, and stiffener ring 102 is encapsulated in encapsulant 142. In accordance with alternative embodiments, encapsulant 142 is not dispensed, and the resulting structure is the same as shown in FIG. 48.

After the encapsulant 142 is applied, a planarization process such as a CMP process or a mechanical grinding process may be performed to polish encapsulant 142. In accordance with some embodiments, both of encapsulant 77 and package components 74 are revealed after the planarization process. In accordance with alternative embodiments, after the planarization process, a layer of encapsulant 142 may cover encapsulant 77 and package components 74, with the layer of encapsulant 142 having top surface 142'. Throughout the description, the structure over release film 140, which structure includes package components 74, encapsulant 142, and InFO package substrate 72 are collectively referred to reconstructed wafer 79.

Next, reconstructed wafer 79 is de-bonded (demounted) from carrier 138. The de-bonding may be performed, for example, by projecting a light beam (which may be a laser beam) on release film 140, and the light beam penetrates through the transparent carrier 138. Release film 140 is thus decomposed. Reconstructed wafer 79 may thus be de-bonded (demounted) from carrier 138.

Figure 56:
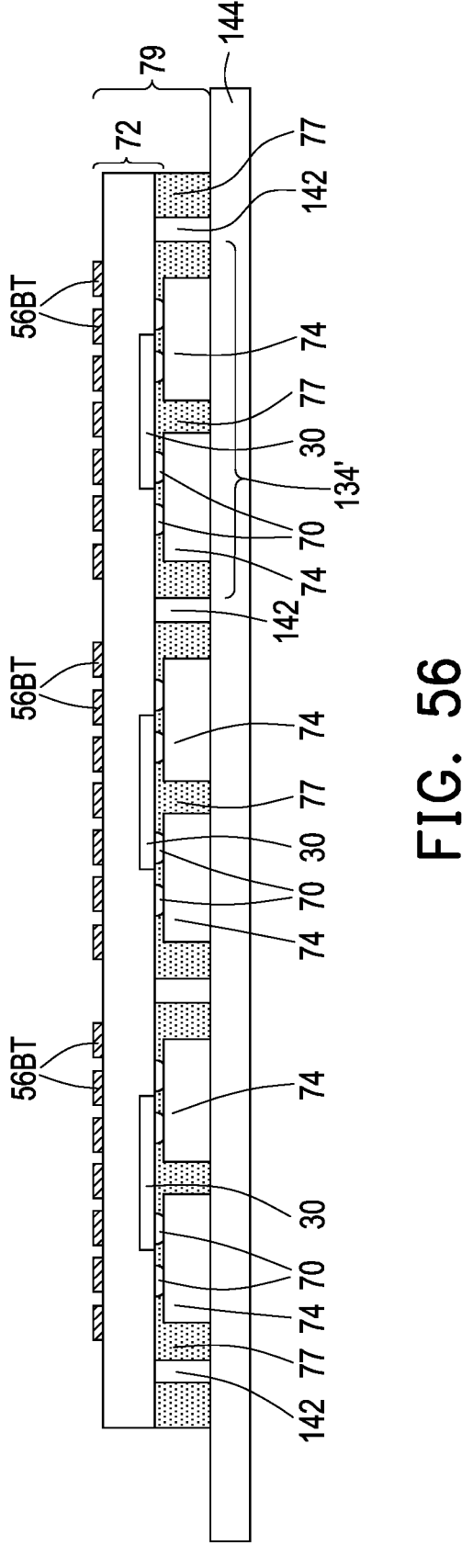

Reconstructed wafer 79 is then placed on tape 144, which may be fixed on a frame (not shown). The resulting structure is shown in FIG. 56. Package components 74 may be in contact with tape 144 in accordance with some embodiments. Metal pads 56BT are exposed.

Figure 57:
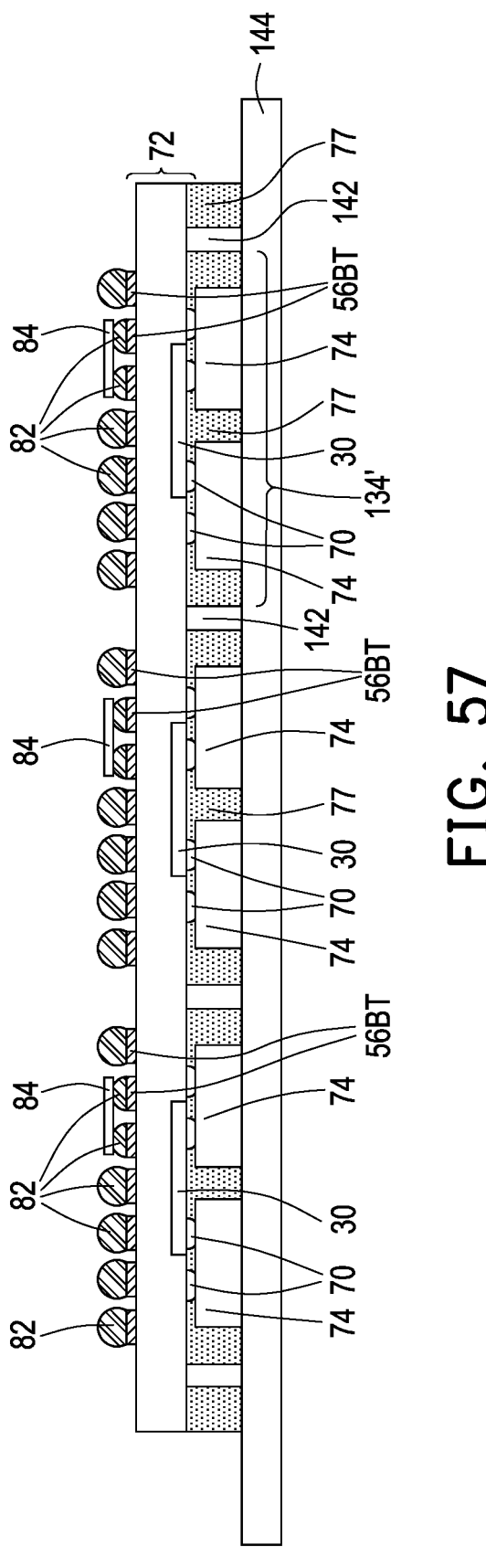

Referring to FIG. 57, solder regions 82 are formed on conductive features 56BT, which may be metal pads, metal pillars, UBMs, or the like. Solder regions 82 are reflowed. Next, device dies 84 are bonded to InFO package substrate 72 through some of solder regions 82. In accordance with some embodiments, device dies 84 are IPD dies, which may include passive devices such as capacitors, resistors, inductors, and/or the like therein. In accordance with alternative embodiments, device dies 84 may include active devices.

Figure 58:
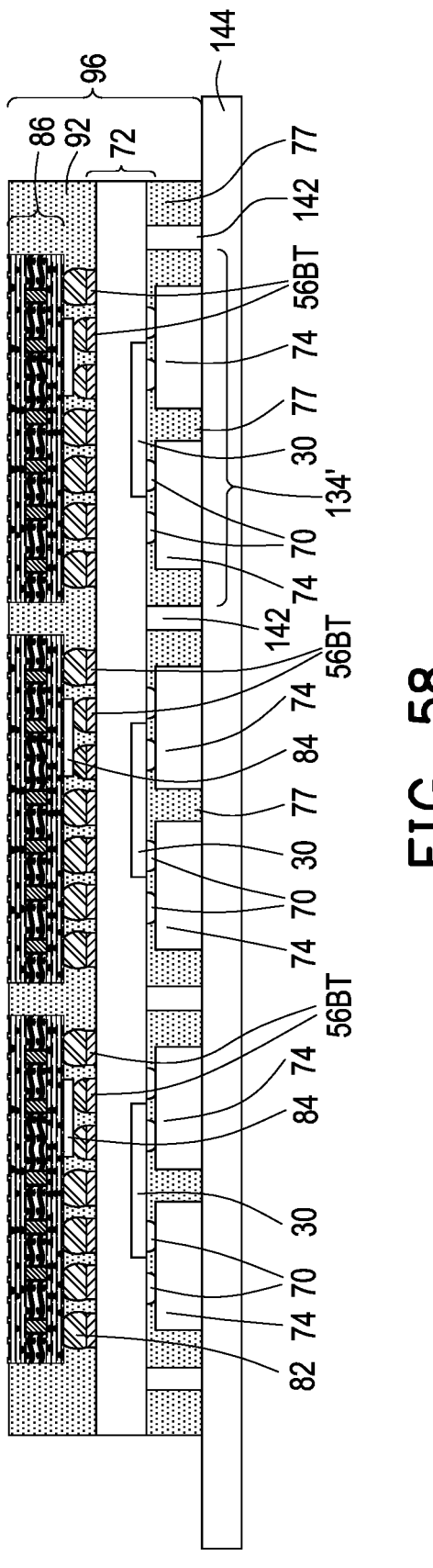

FIG. 58 illustrates the bonding of package substrates 86 to InFO package substrate 72. Package substrates 86 may include organic dielectric layers, and are sometimes referred to as organic package substrates. Package substrates 86 may be cored package substrates including cores (which includes a dielectric core and PTHs therein), or may be core-less package substrates that do not have cores therein. In accordance with some embodiments, package substrate 86 are discrete package substrates, and are bonded to InFO package substrate 72 through die-to-wafer bonding. In accordance with alternative embodiments, package substrates 86 are in an un-sawed wafer, and are bonded to InFO package substrate 72 through wafer-to-wafer bonding. Package substrates 86 are free from active devices such as transistors and diodes therein. The bonding may be achieved through solder regions 82. The back surfaces (the illustrated top surfaces) of device dies 84 may be spaced apart from, or may be in contact with, the corresponding underlying package substrates 86.

Further referring to FIG. 58, encapsulant 92 is dispensed to encapsulate package substrates 86 therein. Encapsulant 92 fills the gaps between neighboring package substrates 86. Encapsulant 92 may include a molding underfill, which is also filled into the gaps between InFO package substrate 72 and the overlying package substrates 86. Encapsulant 92 may include a base material, which may be a polymer, a resin, an epoxy, or the like, and filler particles in the base material. The filler particles may be dielectric particles of silica, alumina, boron nitride, or the like, and may have spherical shapes. Throughout the description, the structure over tape 144 is referred to as reconstructed wafer 96.

Figure 59:
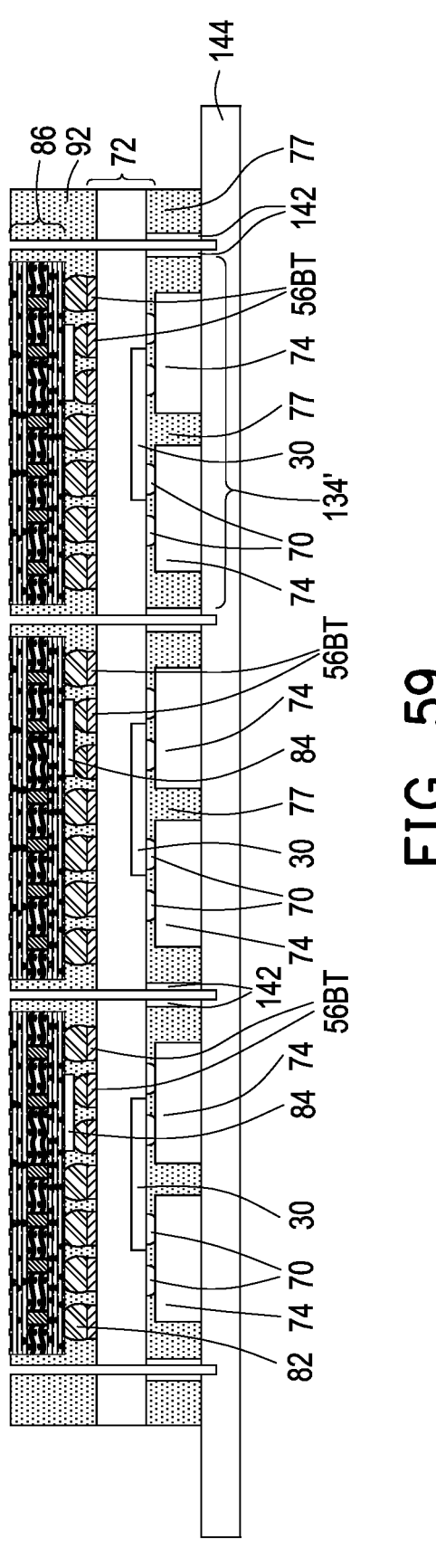

FIG. 59 illustrates a singulation process for separating reconstructed wafer 96 into discrete packages 96'. The singulation process may be performed using a blade, or through a laser ablation process. In accordance with some embodiments, in packages 96', some remaining portions of encapsulant 92 may be left on the sidewalls of package substrates 86 to fully encircle package substrates 86. In accordance with alternative embodiments, encapsulant 92 and the edge portions of package substrates 86 are cut-through in the singulation process, and encapsulant 92 is removed from the sidewalls of package substrates 86. Accordingly, the sidewalls of package substrates 86 may be revealed.

In accordance with some embodiments, as shown in FIG. 59, encapsulant 142 is sawed in middle, and the portions of encapsulant 142 on opposite sides of the sawing lines are left. Accordingly, in package 96', encapsulant 142 is left. Encapsulant 142 may form a full ring encircling encapsulant 77 in accordance with some embodiments. In accordance with alternative embodiments, in the singulation process, encapsulant 142 may be fully removed, and the resulting package 96' is free from encapsulant 142.

Figure 60:
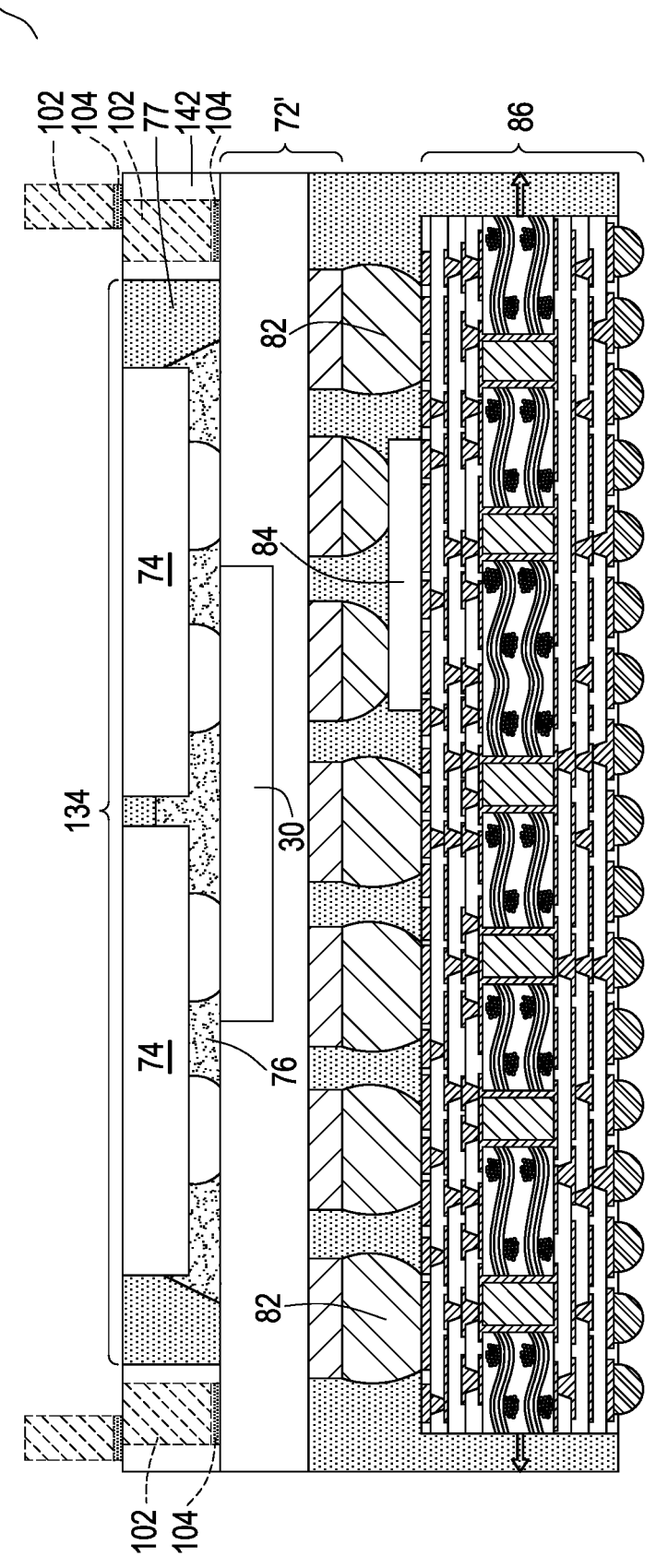

FIG. 60 illustrates the cross-sectional view of package 96' in accordance with some embodiments. These embodiments are similar to the embodiments in FIG. 17, except that encapsulant 142 and stiffener ring 102 may be added. Package 96' may include encapsulant 77, and may or may not include encapsulant 142. In accordance with some embodiments, stiffener ring 102 may be attached on top of package 96'. In accordance with yet alternative embodiments, no stiffener ring 102 is adopted. Accordingly, the stiffener ring 102 on top of package 96' is illustrated as being dashed to indicate it may or may not be attached.

Furthermore, as addressed in preceding embodiments, stiffener ring 102 may (or may not) be attached to InFO package substrate 72' before encapsulant 142 is dispensed. Accordingly, stiffener ring 102 may be in encapsulant 142 in accordance with some embodiments. The corresponding stiffener ring 102 is also shown as being dashed to indicate that it may or may not be adopted.

Figure 61:
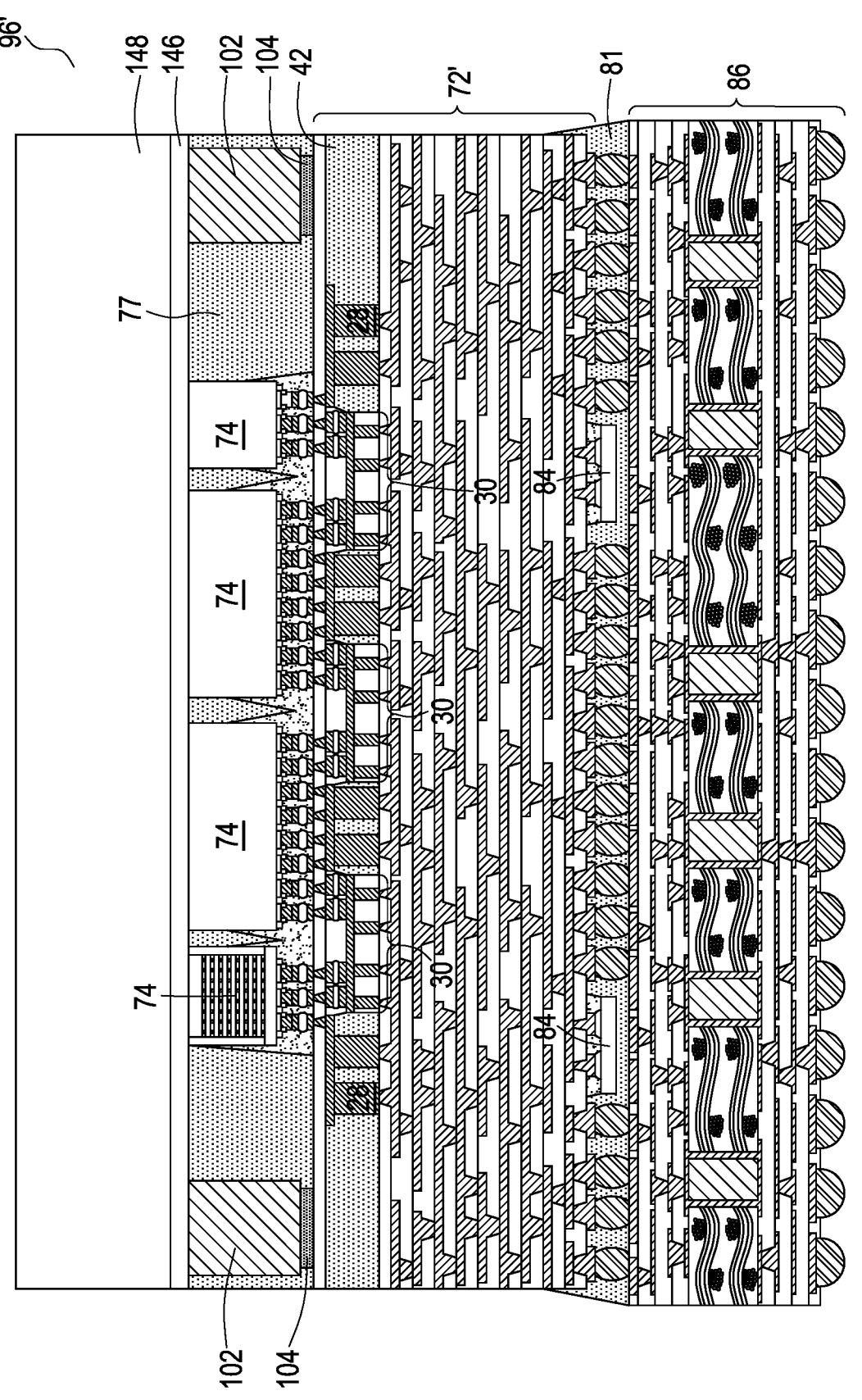
FIGS. 61-62 illustrate the cross-sectional views of some packages in accordance with some embodiments.

FIG. 61 illustrates the cross-sectional view of package 96' in accordance with some embodiments. These embodiments are similar to the embodiments in FIG. 17, except that both of stiffener ring 102 and heat sink 148 are added. Heat sink 148 is attached to package 96' through TIM 146. Heat sink 148 may be formed of or comprises a metallic material such as copper, stainless steel, nickel, aluminum, or the like, or alloys thereof. In accordance with some embodiments, stiffener ring 102 may be attached to InFO package substrate 72, and may be in contact with TIM 146. In accordance with alternative embodiments, stiffener ring 102 is not attached.

Figure 62:
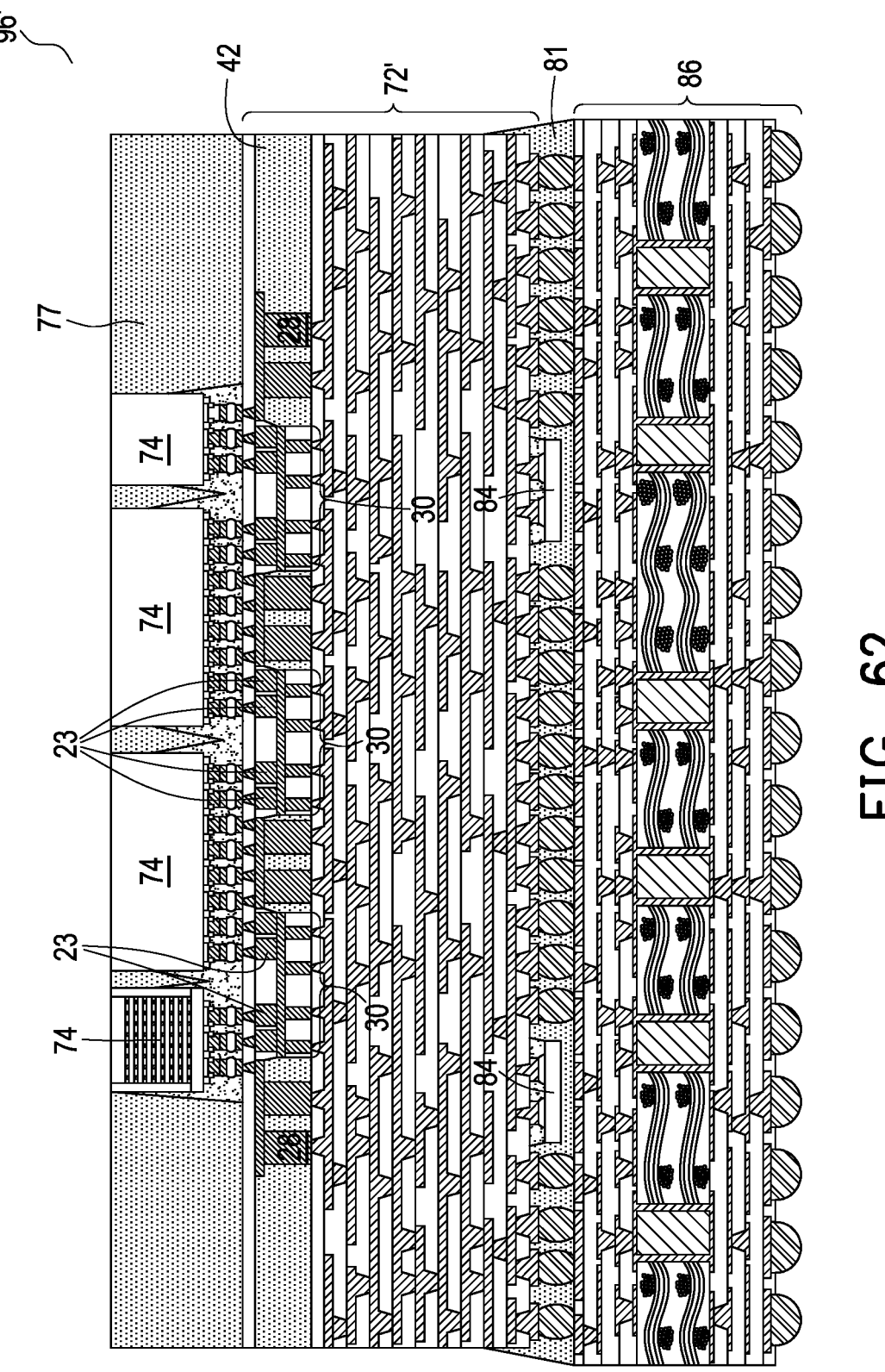

FIG. 62 illustrates the cross-sectional view of package 96' in accordance with some embodiments. These embodiments are similar to the embodiments in FIG. 17, except that the joining of LSI dies 30 to the overlying structure is not through solder regions. Rather, non-solder joints are made through metal pillars 23. As a result, the joint of LSI die 30 to both of overlying structures and underlying structures are through non-solder joints.

FIGS. 63 through 69 illustrate the cross-sectional views of intermediate stages in the formation of a package 96' as shown in FIG. 62 in accordance with some embodiments. The details of the features as discussed below, unless specified otherwise, may be the same as disclosed in FIGS. 1 through 17. Accordingly, the corresponding details are not repeated herein.

Figure 63:
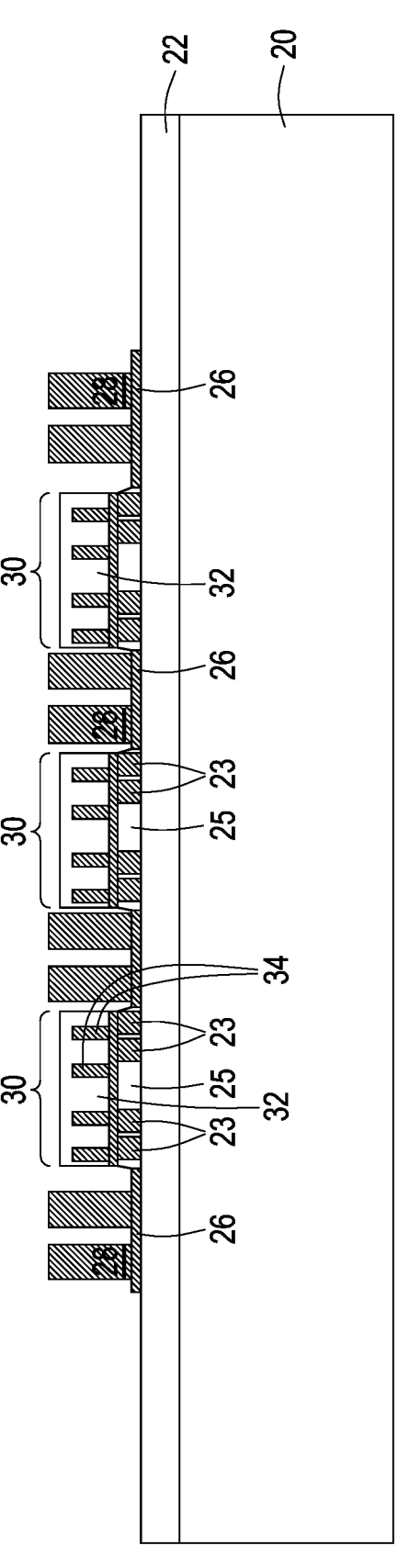
FIGS. 63-69 illustrate the cross-sectional views of intermediate stages in the formation of a package in accordance with some embodiments.

Referring to FIG. 63, carrier 20 is provided, and release film 22 is coated on carrier 20. RDLs 26 are then formed on release film 22. There may be (or may not be) a buffer dielectric layer (such as PBO, polyimide, or the like, not shown) over release film 22, with RDLs 26 being formed over and contacting the buffer dielectric layer in accordance with some embodiments. In accordance with some embodiments, RDLs 26 include line portions and do not include via portions. RDLs 26 may be formed through plating. Alternatively, RDLs 26 may be formed by depositing a blanket metallic layer and then patterning the blanket metallic layer. It is appreciated that although one layer of RDLs 26 is illustrated, there may be a plurality of RDLs 26 formed.

After the formation of RDLs 26, metal posts 28 may be formed. The formation of metal posts 28 may include depositing a metal seed layer over RDLs 26, and forming a patterned plating mask (not shown), through which some portions of the metal seed layer are exposed. A plating process is then performed to plate a metallic material into the openings in the patterned plating mask. The patterned plating mask is then removed, followed by the etching of the exposed portions of the metal seed layer. The plated metallic material and the remaining portions of the metal seed layer in combination form metal posts 28.

LSI dies 30 are placed over release film 22. The front sides of LSI dies 30 face release film 22, and the semiconductor substrates 32 of LSI dies 30 face up. Furthermore, LSI dies 30 are not placed on RDLs 26. In accordance with some embodiments, each of LSI dies 30 includes metal pillars 23, and dielectric layer 25 embedding metal pillars 23 therein. Dielectric layer 25 may be in contact with release film 22 (or the buffer dielectric layer, if adopted).

Figure 64:
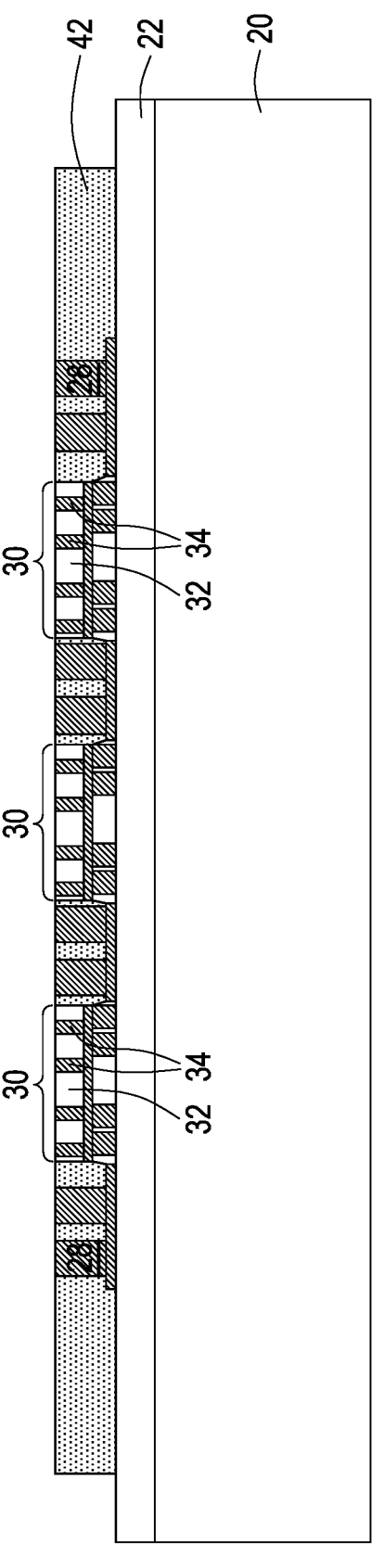

Referring to FIG. 64, metal posts 28 and LSI dies 30 are encapsulated in encapsulant 42. Encapsulant 42 may include a molding compound, a molding underfill, an epoxy, and/or a resin. A planarization process such as a CMP process or a mechanical grinding process is then performed to thin encapsulant 42 and LSI dies 30, until metal posts 28 are revealed. Furthermore, the through-vias 34 in LSI dies 30 are also revealed. The resulting structure is shown in FIG. 64. Metal posts 28 are alternatively referred to as through-vias 28 hereinafter since they penetrate through encapsulant 42.

Figure 65:
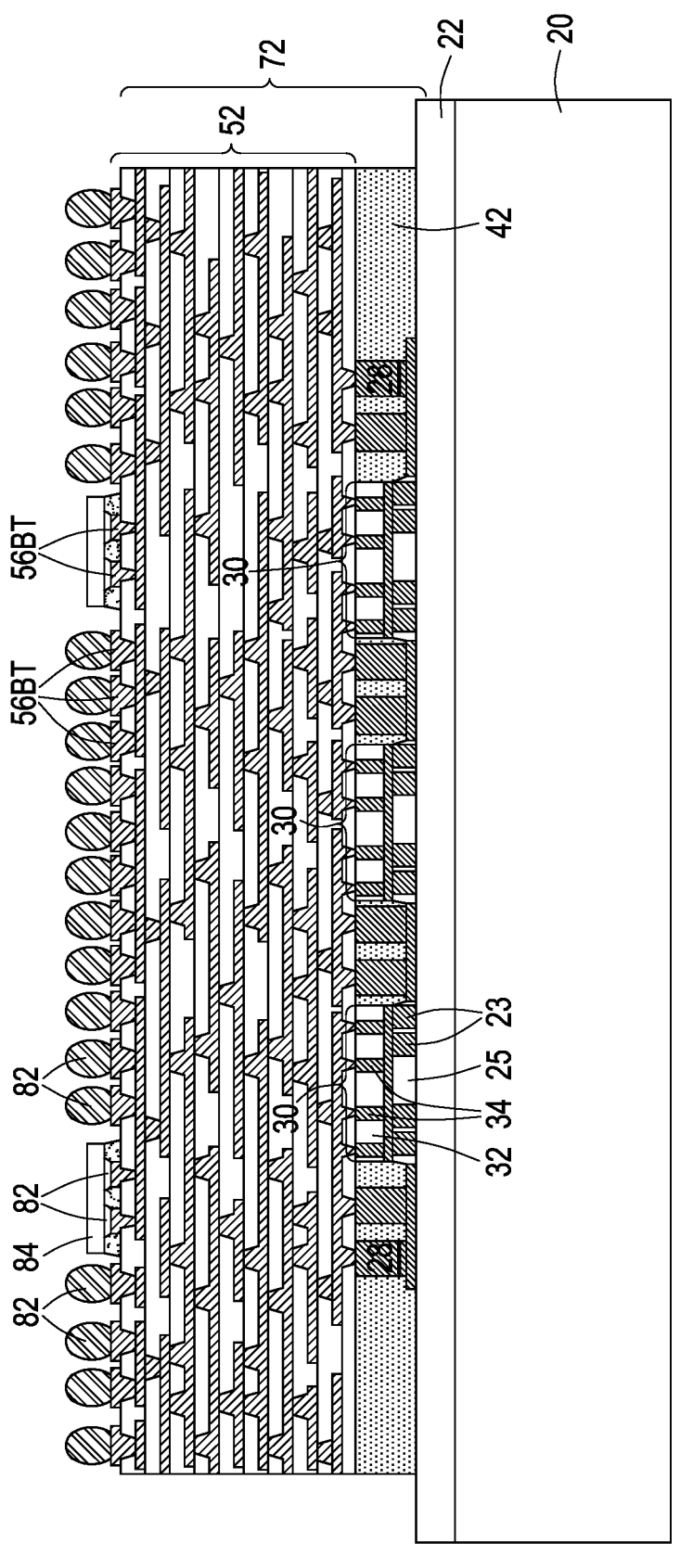

FIG. 65 illustrates the formation of redistribution structure 52 over and electrically connected to LSI dies 30. The formation processes and the detailed structures may be found referring to the embodiments shown in FIGS. 5 and 6. A part of InFO package substrate 72 is thus formed.

Further referring to FIG. 65, solder regions 82 are formed on conductive features 56BT, which are the surface conductive features of redistribution structure 52. Next, device dies 84 are bonded to InFO package substrate 72 through some of solder regions 82. In accordance with some embodiments, device dies 84 are IPD dies, which may include passive devices such as capacitors, resistors, inductors, and/or the like therein. Device dies 84 may also include active dies in accordance with some embodiments.

Figure 66:
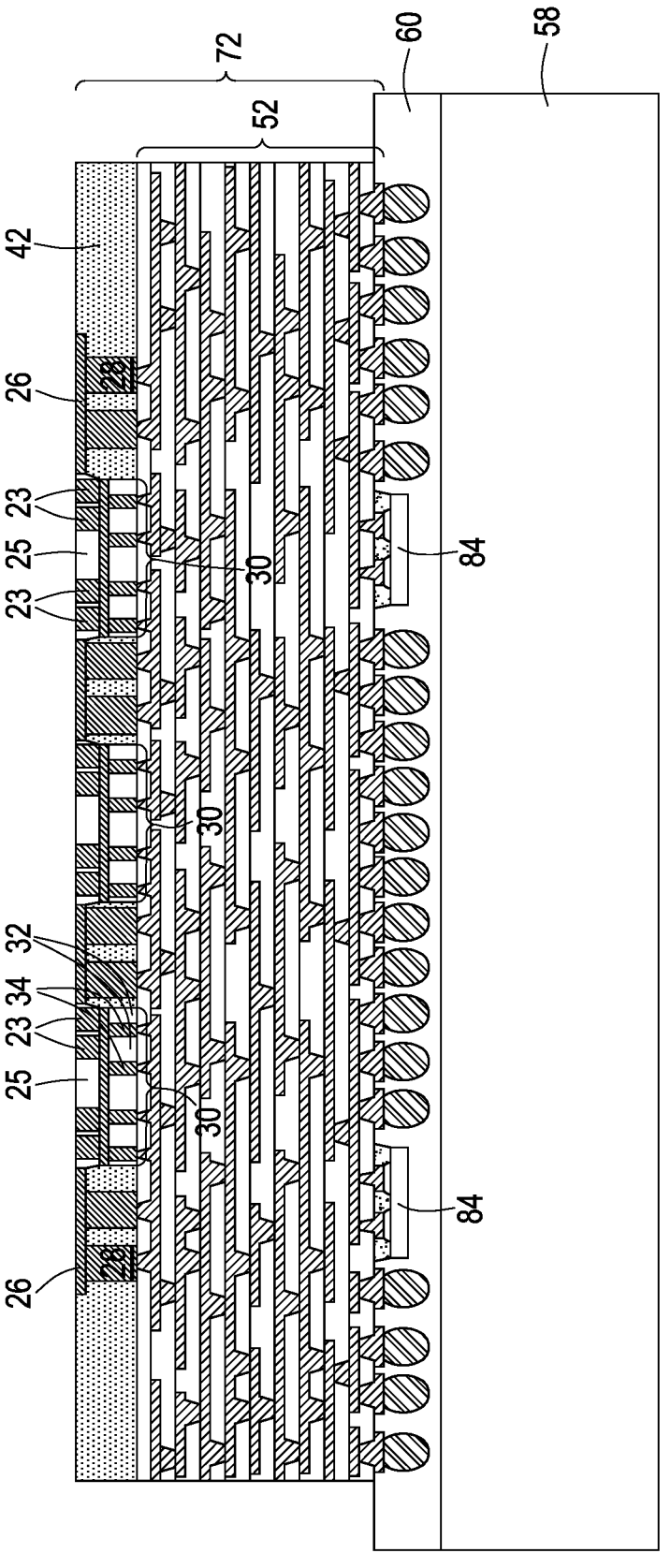

In a subsequent process, a carrier-switch process is performed. In the carrier-switch process, the structure over release film 22 is first attached to carrier 58 (FIG. 66) through release film 60. Carrier 20 is then de-bonded from redistribution structure 52. In the de-bonding process, a light beam (which may be a laser beam) is projected on release film 22, and the light beam penetrates through the transparent carrier 20. Release film 22 is thus decomposed. Carrier 20 may be lifted off from InFO package substrate 72, and hence InFO package substrate 72 is de-bonded (demounted) from carrier 20. The resulting structure is shown in FIG. 66.

Figure 67:
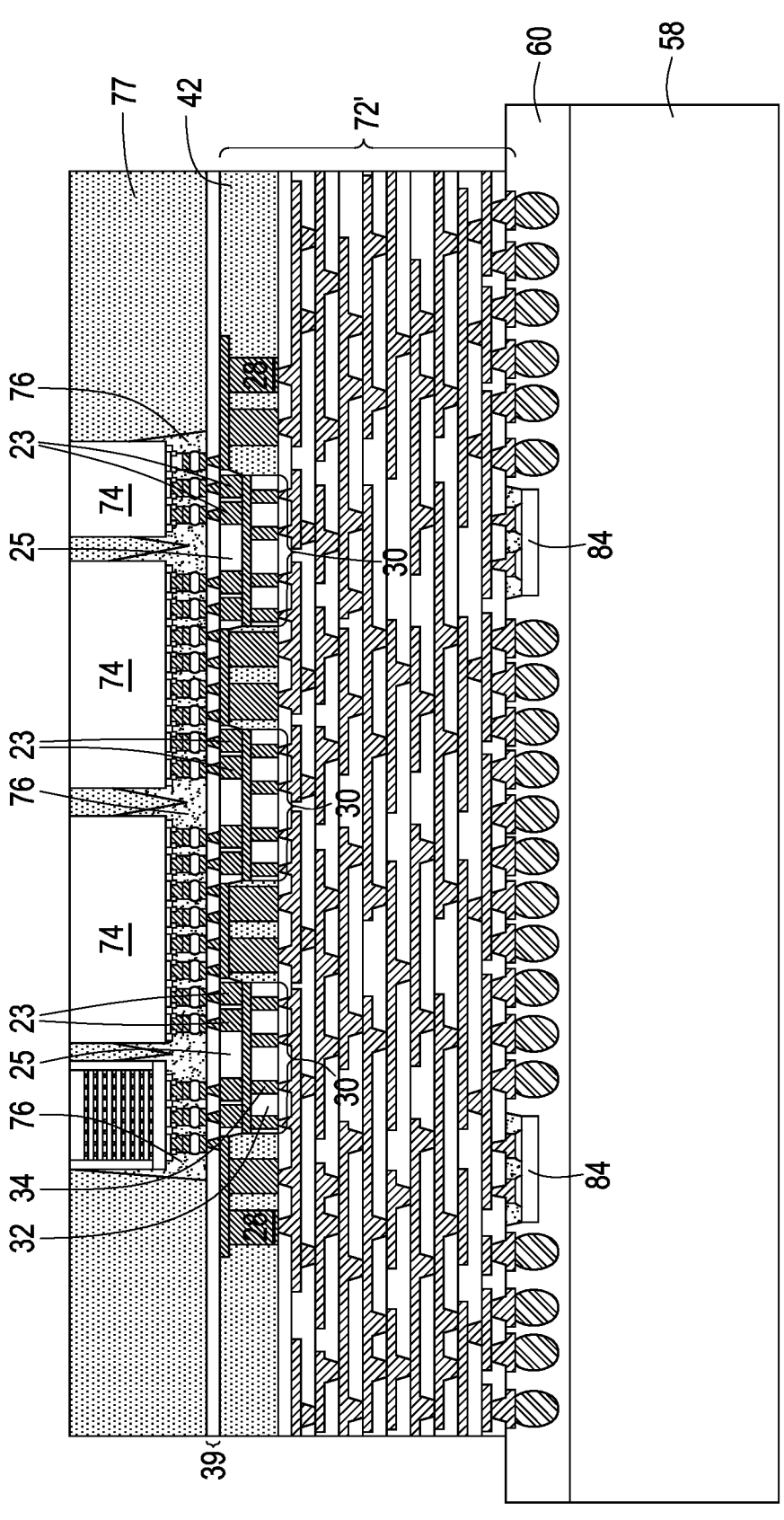

In accordance with some embodiments, dielectric layers and RDLs are formed on the front-side of LSI dies 30. FIG. 67 illustrates the formation of a front-side interconnect structure 39, which are overlying and connecting to LSI dies 30 and the underlying redistribution structure 52. The front-side interconnect structure 39 may include RDLs and electrical connectors. Also, front-side interconnect structure 39 may include one RDL layer or a plurality of RDL layers. The formation of InFO package substrate 72 is thus finished.

Further referring to FIG. 67, package components 74 are bonded to InFO package substrate 72. Next, underfill 76 is dispensed into the gaps between package components 74 and the underlying InFO package substrate 72. Package components 74 are then encapsulated in encapsulant 77, followed by a planarization process, after which package components 74 may be revealed or may remain to be covered by encapsulant 77.

Figure 68:
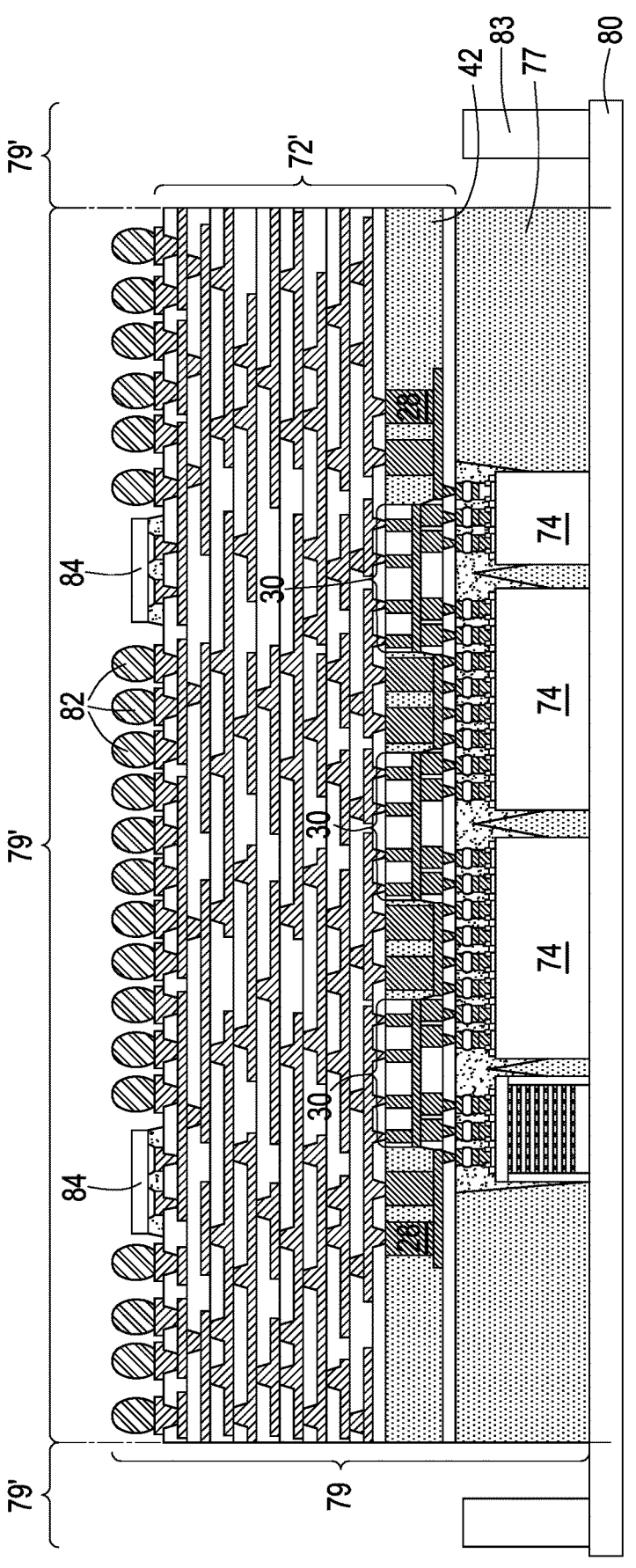

Next, InFO package substrate 72 is de-bonded (demounted) from carrier 58. In a subsequent process, as shown in FIG. 68, InFO package substrate 72 is placed on tape 80, which may be fixed on a frame 83. The backsides of package components 74 face toward, and may be in contact with, tape 80. Solder regions 82 and device dies 84 are exposed. Reconstructed wafer 79 is thus formed. In a subsequent process, reconstructed wafer 79 is singulated to form packages 79'.

Figure 69:
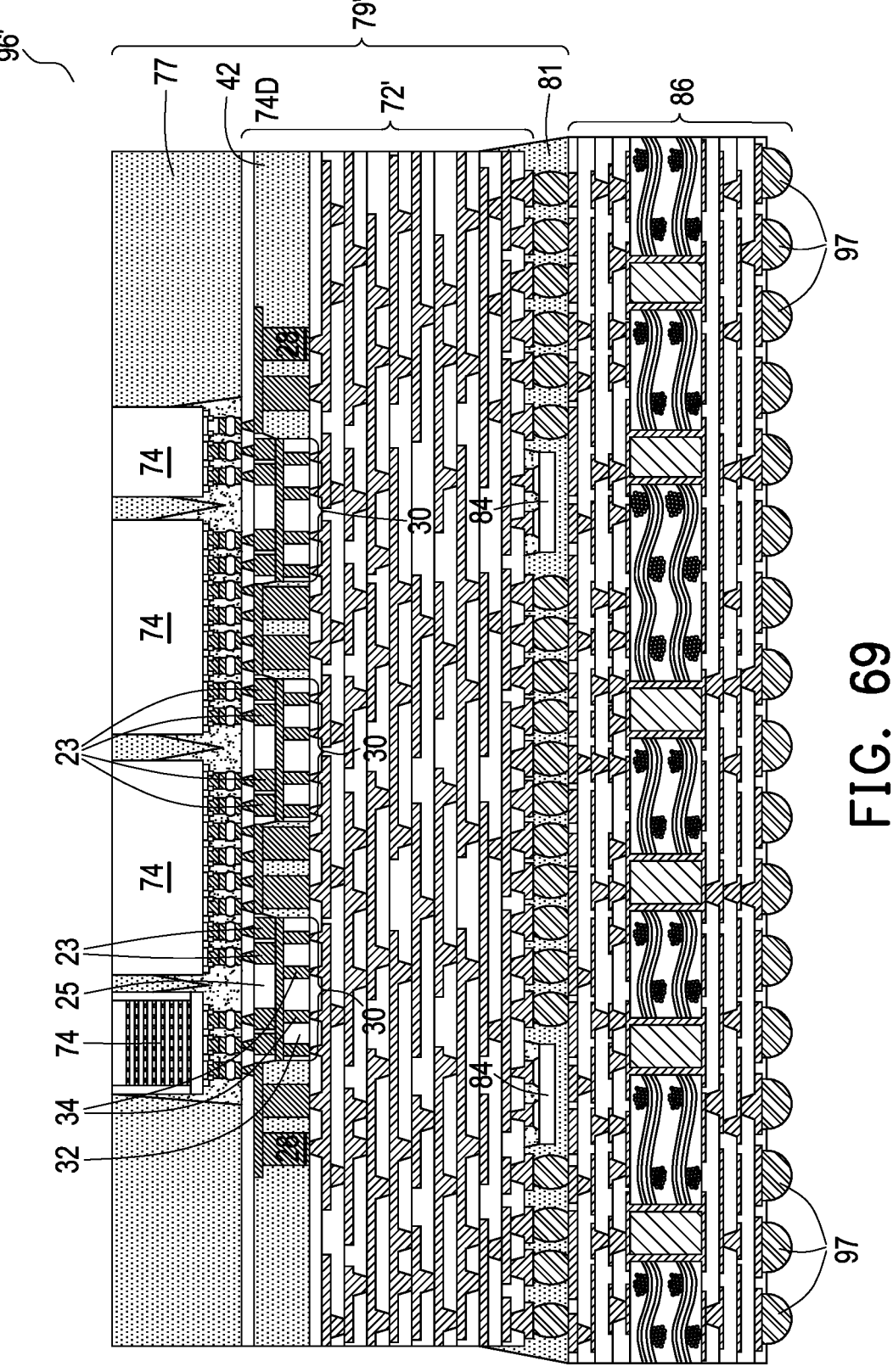

In accordance with some embodiments, package 79' may be bonded to package substrate 86 through die-to-die bonding, forming the package 96' as shown in FIG. 69. The bonding may be achieved through solder regions. The back surfaces (the illustrated bottom surfaces) of device dies 84 may be spaced apart from, or may be in contact with, the corresponding underlying package substrates 86. Underfill 81 is then dispensed between package 79' and package substrate 86. Solder regions 97 may be formed on package substrate 86, and are electrically connected to the overlying package substrate 86 and InFO package substrate 72'. Solder regions 97 may be electrically connected to package components 74.

In accordance with alternative embodiments, the bonding is performed through die-to-wafer bonding, with a plurality of packages 79' being bonded to a wafer-level package substrate 86W (refer to FIG. 22). Underfill 81 is then dispensed between the plurality of packages 96' and the underlying wafer-level package substrate 86W. Solder regions 97 are formed on wafer-level package substrate 86W, and are electrically connected to package substrates 86 and InFO package substrates 72'. Solder regions 97 may be electrically connected to package components 74. A singulation process is then performed to separate the wafer-level package substrate 86W into discrete package substrates 86, thus forming a plurality of packages 96'. One of the packages 96' is shown in FIG. 69.

Figure 70:
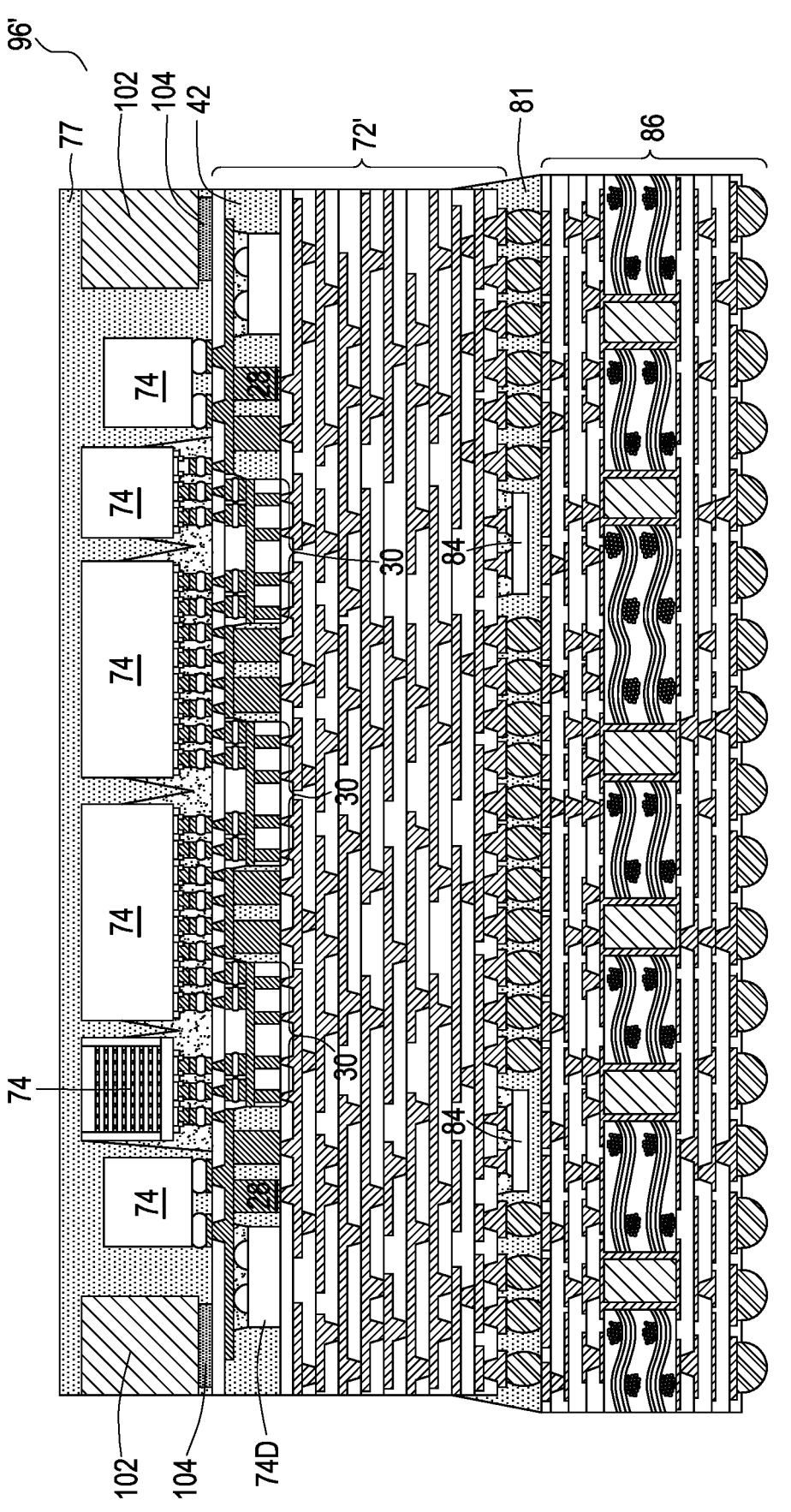
FIGS. 70-71 illustrate the cross-sectional views of some packages in accordance with some embodiments.

FIG. 70 illustrates the cross-sectional view of package 96' formed in accordance with some embodiments. This embodiment is similar to the embodiment as shown in FIG. 69, except that stiffener ring 102 is formed, and is embedded in encapsulant 77. The top surface of stiffener ring 102 may be lower than the top surface of encapsulant 77 in accordance with some embodiments. The outer sidewalls of stiffener ring 102 may be exposed. This may be achieved, for example, by cutting through stiffener ring 102 in the respective singulation process. Alternatively, the outer sidewall of stiffener ring 102 are not exposed, and are in contact with encapsulant 77.

Figure 71:
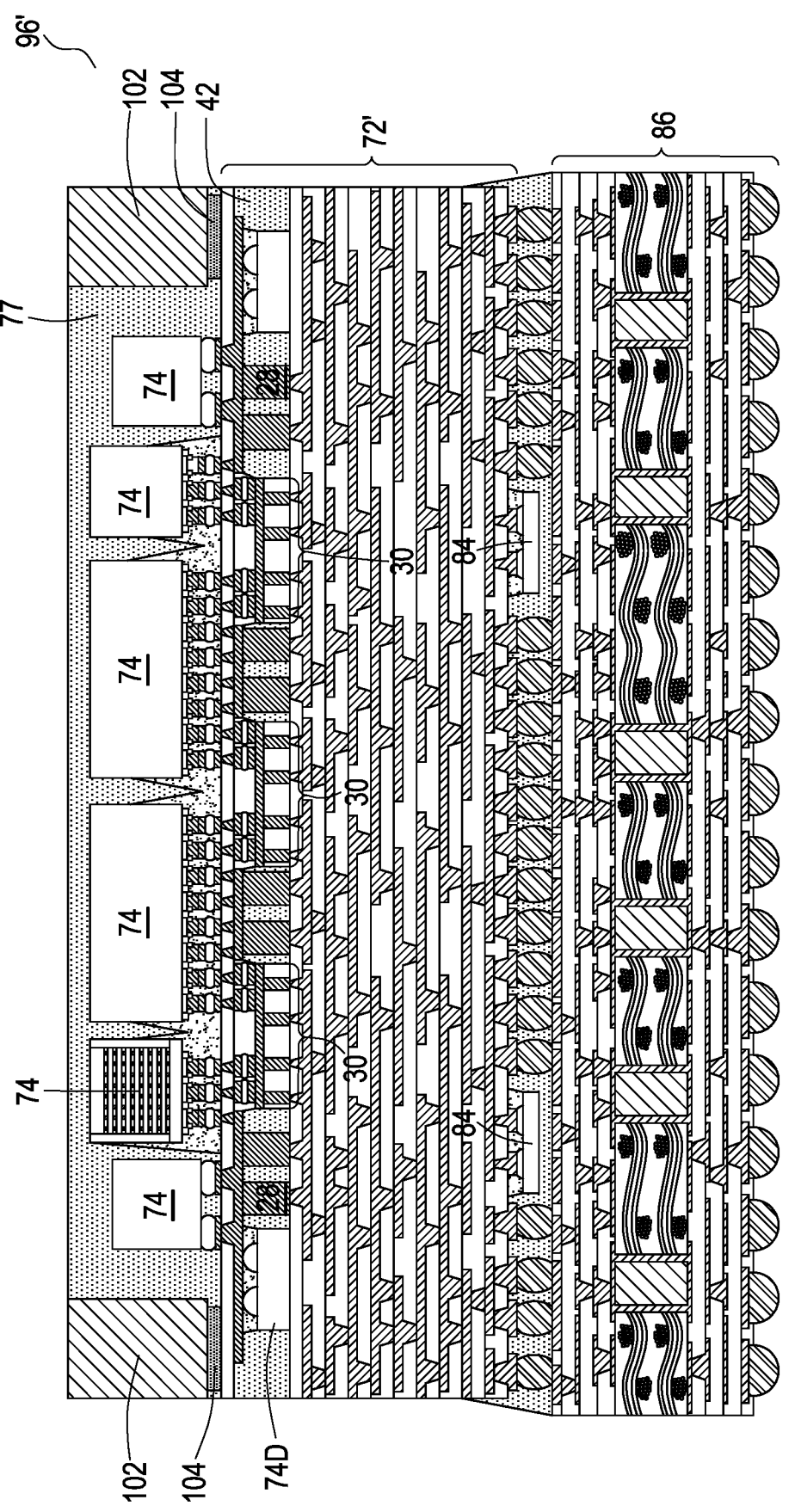

FIG. 71 illustrates the cross-sectional view of package 96' formed in accordance with some embodiments. This embodiment is similar to the embodiment as shown in FIG. 70, except that the top surface of stiffener ring 102 is exposed, and is coplanar with the top surface of encapsulant 77. This may be achieved, for example, by controlling the planarization process of encapsulant 77, until stiffener ring 102 is exposed.

Figure 72:
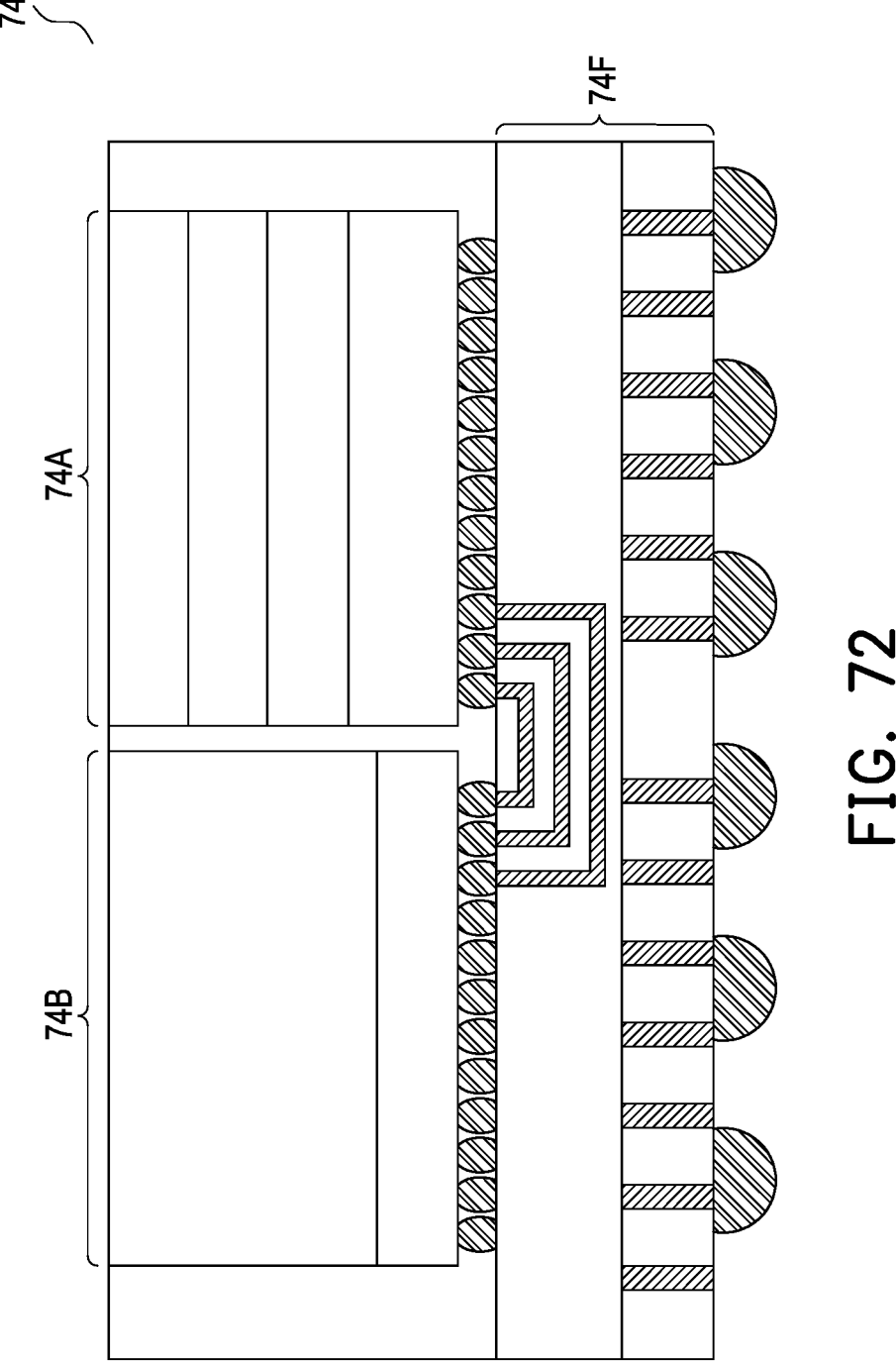
FIGS. 72-75 illustrate the cross-sectional views of some package components in packages in accordance with some embodiments.

Package components 74 may be in various forms. For example, FIGS. 72 through 75 illustrate some example package components 74 in accordance with some embodiments. FIG. 72 illustrates a chip-on-wafer package 74E in accordance with some embodiments. An example chip-on-wafer package 74E is also illustrated in the package 96' as shown in FIG. 48. Chip-on-wafer package 74 includes interposer 74F and package components 74A and 74B bonded to interposer 74F. In accordance with some embodiments, package component 74A may include an HBM, and package component 74B may include logic dies such as CPU, GPU, or the like.

Figure 73:
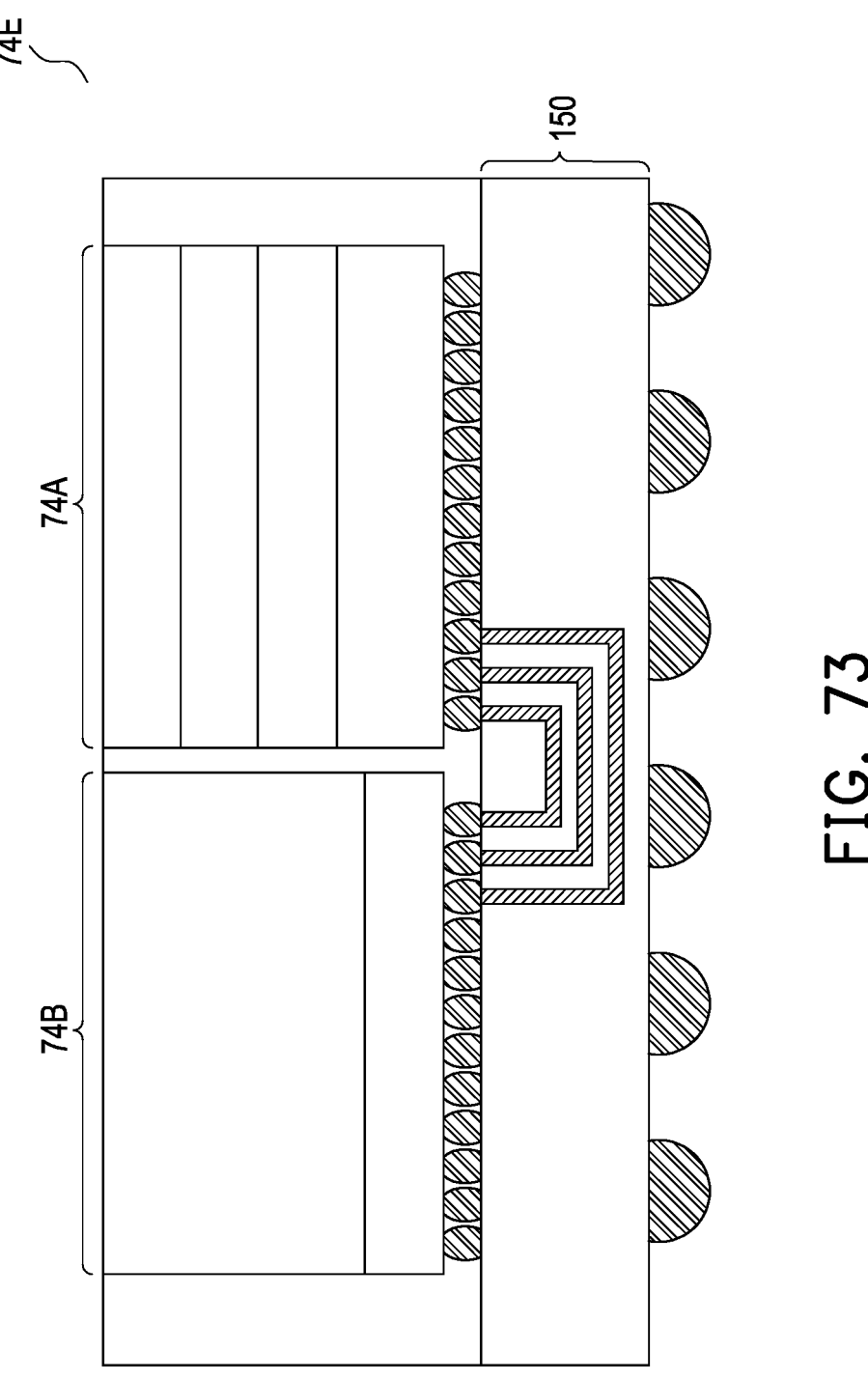

FIG. 73 illustrates an Integrated Fanout (InFO) package 74E in accordance with some embodiments. In accordance with these embodiments, fan-out redistribution structure 150 is formed layer-by-layer starting from package components 74A and 74B. Redistribution structure 150 includes a plurality of RDLs therein, which may interconnect package components 74A and 74B.

Figure 74:
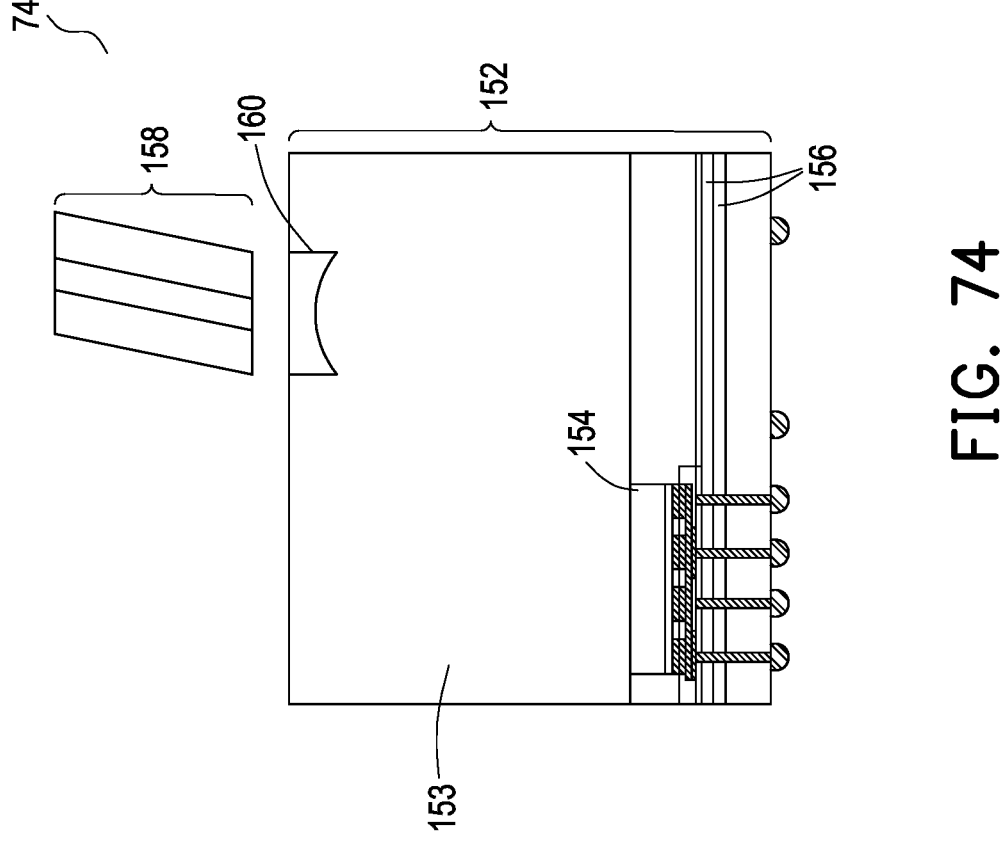

FIG. 74 illustrates an example package component 74 in accordance with alternative embodiments, wherein package component 74 includes an optical device die 152. In accordance with some embodiments, optical device die 152 may include electrical-to-optical converters and/or optical-to-electrical converters such as image sensors, grating coupler, and the like. Optical device die 152 may also include waveguides 154. Also, micro-lens 160 may be formed in semiconductor substrate 153. Optical fiber 158 may be attached to optical device die 152, and aligned to micro-lens 160.

Figure 75:
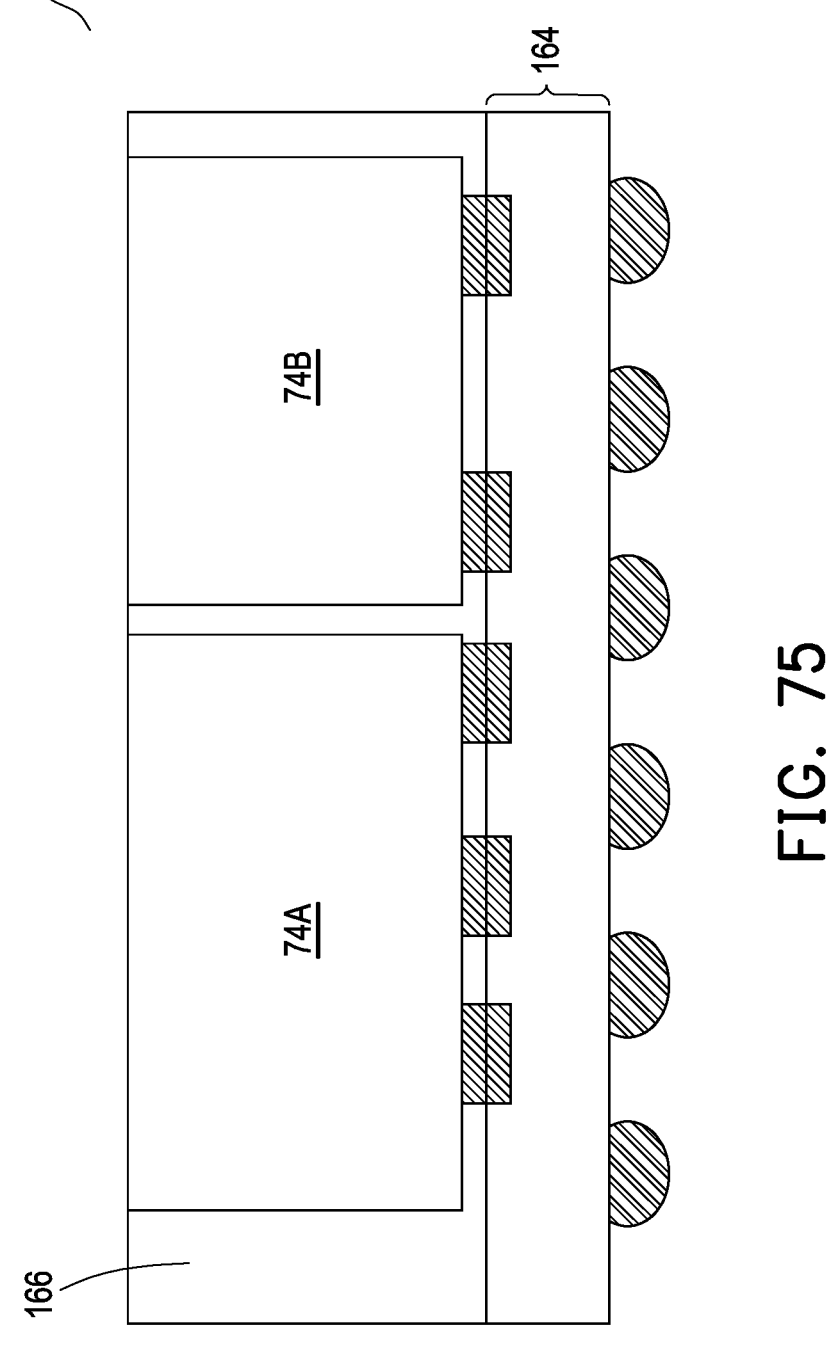

FIG. 75 illustrates package component 74 formed through hybrid bonding in accordance with some embodiments. Device dies or packages 74A and 74B may be bonded to device die 164 through hybrid bonding, while direct metal-to-metal bonding may also be used. Gap-filling material 166 is formed to fill the gap between package components 74A and 74B. Gap-filling material 166 may be formed of or comprises a silicon nitride etch stop layer and an oxide filling material. In accordance with alternative embodiments, gap-filling material 166 may comprise a molding compound, a molding underfill, or the like.

Figure 76:
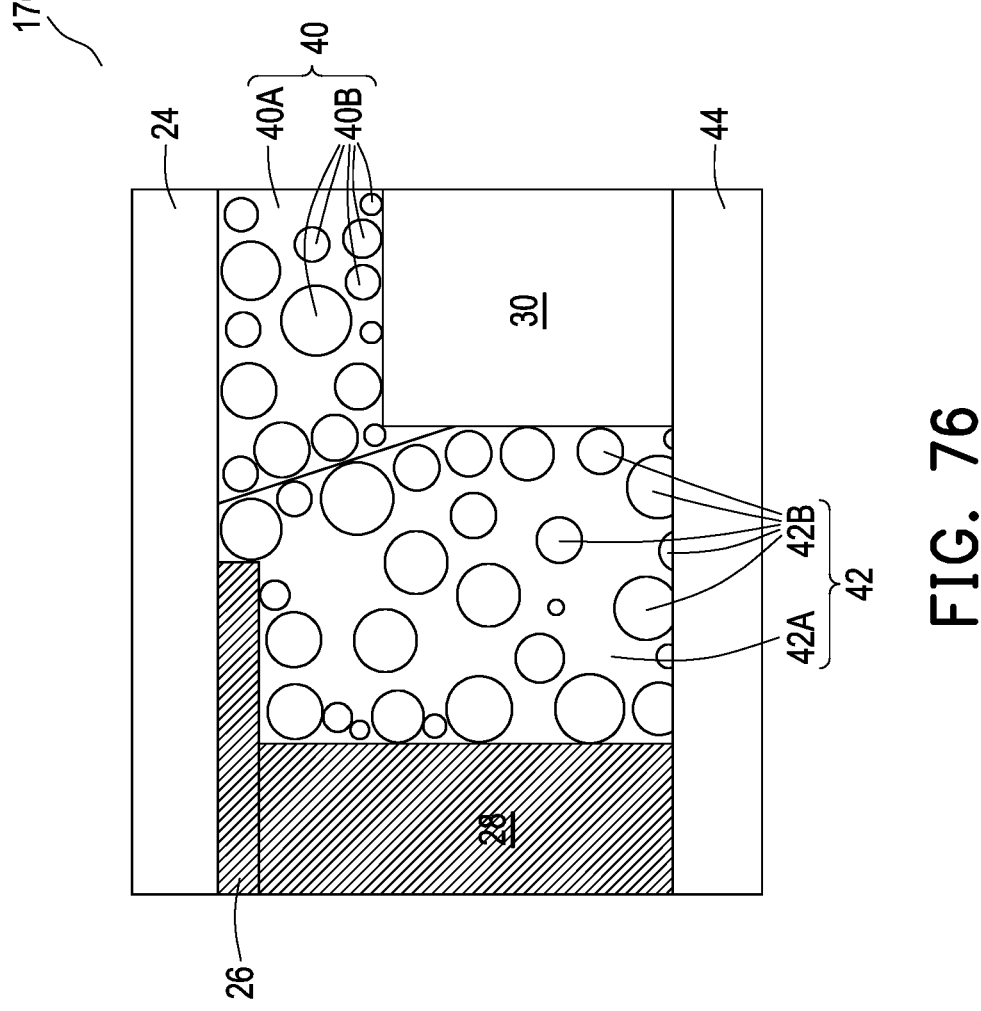
FIG. 76 illustrates a magnified view of a portion of a package in accordance with some embodiments.

FIG. 76 illustrates an amplified view of a portion 170 of the package 96' as shown in FIG. 17. LSI die 30 and dielectric layers 24 and 44 are illustrated. Encapsulant 42 may include base material 42A and filler particles 42B. Since encapsulant 42 is polished in the process shown in FIG. 4, some filler particles 42B are polished to form partial particles. The partial particles 42B may have planar bottom surfaces in contact with dielectric layer 44. As a comparison, the filler particles 40B that are in contact with dielectric layer 24, through-vias 28, and LSI die 30 are full spherical particles that are not polished, and may have rounded top surfaces.

In above-illustrated embodiments, some processes and features are discussed in accordance with some embodiments to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By embedding the local interconnect die in an InFO package substrate, package components (such as device dies and packages) may be directly bonded to the InFO package substrate, and may be electrically interconnected by the interconnect die. The size of the bonded package components thus may be reduced since they don't include the local interconnect die therein. The sizes of the packages bonded to package substrates are thus reduced. The warpage of the resulting packages is reduced, and manufacturing yield is improved. Also, the insertion loss may be reduced. Furthermore, a compound package substrate including the LSI die and another package substrate may be formed, and IPD dies may be bonded to the opposite sides of the compound package substrate. The flexibility in the design of the packages is thus improved.

In accordance with some embodiments of the present disclosure, a method comprises forming a composite package substrate comprising encapsulating an interconnect die in a first encapsulant, wherein the interconnect die comprises a first plurality of through-vias therein; and forming a first plurality of RDLs and a second plurality of RDLs on opposite sides of the interconnect die; bonding an organic package substrate to the composite package substrate; and bonding a first package component and a second package component to the first plurality of RDLs, wherein the first package component and the second package component are electrically interconnected through the interconnect die and the first plurality of RDLs.

In an embodiment, the first plurality of RDLs and the second plurality of RDLs are interconnected through the first plurality of through-vias. In an embodiment, the method further comprises forming a second plurality of through-vias, wherein the second plurality of through-vias are encapsulated in the first encapsulant, and wherein the first plurality of RDLs and the second plurality of RDLs are further interconnected through the second plurality of through-vias. In an embodiment, the organic package substrate and the first package component are on opposite sides of the composite package substrate. In an embodiment, the second plurality of RDLs are formed after the first plurality of RDLs are formed, and wherein the method further comprises bonding the interconnect die to the first plurality of RDLs.

In an embodiment, the interconnect die and the first encapsulant collectively form a part of a reconstructed wafer, and wherein both of the first plurality of RDLs and the second plurality of RDLs are formed starting from opposite sides of the reconstructed wafer. In an embodiment, the method further comprises, after the organic package substrate is bonded to the composite package substrate, encapsulating the organic package substrate in a second encapsulant. In an embodiment, the method further comprises encapsulating a stiffener ring in the second encapsulant. In an embodiment, the method further comprises attaching a stiffener ring on the second encapsulant.

In an embodiment, the method further comprises forming an additional plurality of through-vias on the first plurality of RDLs, wherein the additional plurality of through-vias are further encapsulated in the second encapsulant. In an embodiment, the method further comprises, before the organic package substrate is bonded to the composite package substrate, bonding a passive device die to the composite package substrate, wherein the passive device die is between the organic package substrate and the composite package substrate. In an embodiment, the organic package substrate is a cored substrate comprising a dielectric core and conductive pipes in the dielectric core.

In accordance with some embodiments of the present disclosure, a package comprises a composite package substrate comprising a first plurality of RDLs; an interconnect die bonded to the first plurality of RDLs, wherein the interconnect die comprises a semiconductor substrate; and a first plurality of through-vias penetrating through the semiconductor substrate; a first encapsulant encapsulating the interconnect die therein; and a second plurality of RDLs on an opposite side of the first encapsulant than the first plurality of RDLs, wherein the first plurality of RDLs are electrically connected to the second plurality of RDLs through the first plurality of through-vias; a first package component and a second package component over and bonding to the composite package substrate, wherein the first package component and the second package component are electrically interconnected through the interconnect die; and a package substrate underlying and bonding to the composite package substrate.

In an embodiment, the package further comprises a second plurality of through-vias penetrating through the first encapsulant, wherein the first plurality of RDLs are further electrically connected to the second plurality of RDLs through the second plurality of through-vias. In an embodiment, the package further comprises a second encapsulant comprising portions on opposite sidewalls of the package substrate. In an embodiment, first sidewalls of the package substrate are vertically aligned to respective second sidewalls of the composite package substrate. In an embodiment, the composite package substrate comprises first sidewalls laterally recessed from respective second sidewalls of the package substrate.

In accordance with some embodiments of the present disclosure, a package comprises a first device die and a second device die; a composite package substrate underlying the first device die and the second device die, the composite package substrate comprising an interconnect die electrically interconnecting the first device die and the second device die; and a molding compound encapsulating the interconnect die therein; a package substrate underlying and bonded to the composite package substrate, wherein the package substrate is electrically connected to the first device die through the interconnect die; and solder regions bonding the composite package substrate to the package substrate, wherein the solder regions are in physical contact with both of the composite package substrate and the package substrate. In an embodiment, the package further comprises a plurality of through-vias encapsulated in the molding compound, wherein the plurality of through-vias electrically connect a plurality of conductive features over the interconnect die to the package substrate. In an embodiment, the package further comprises a stiffener ring attached to the composite package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
  forming a composite package substrate comprising:
    encapsulating an interconnect die in a first encapsulant, wherein the interconnect die comprises a first plurality of through-vias therein; and
    forming a first plurality of redistribution lines (RDLs) and a second plurality of RDLs on opposite sides of the interconnect die;
  bonding an organic package substrate to the composite package substrate; and
  bonding a first package component and a second package component to the first plurality of RDLs, wherein the first package component and the second package component are electrically interconnected through the interconnect die and the first plurality of RDLs.

2. The method of claim 1, wherein the first plurality of RDLs and the second plurality of RDLs are interconnected through the first plurality of through-vias.

3. The method of claim 1 further comprising:
  forming a second plurality of through-vias, wherein the second plurality of through-vias are encapsulated in the first encapsulant, and wherein the first plurality of RDLs and the second plurality of RDLs are further interconnected through the second plurality of through-vias.

4. The method of claim 1, wherein the organic package substrate and the first package component are on opposite sides of the composite package substrate.

5. The method of claim 1, wherein the second plurality of RDLs are formed after the first plurality of RDLs are formed, and wherein the method further comprises bonding the interconnect die to the first plurality of RDLs.

6. The method of claim 1, wherein the interconnect die and the first encapsulant collectively form a part of a reconstructed wafer, and wherein both of the first plurality of RDLs and the second plurality of RDLs are formed starting from opposite sides of the reconstructed wafer.

7. The method of claim 1 further comprising, after the organic package substrate is bonded to the composite package substrate, encapsulating the organic package substrate in a second encapsulant.

8. The method of claim 7 further comprising encapsulating a stiffener ring in the second encapsulant.

9. The method of claim 7 further comprising attaching a stiffener ring on the second encapsulant.

10. The method of claim 7 further comprising:
  forming an additional plurality of through-vias on the first plurality of RDLs, wherein the additional plurality of through-vias are further encapsulated in the second encapsulant.

11. The method of claim 1 further comprising, before the organic package substrate is bonded to the composite package substrate, bonding a passive device die to the composite package substrate, wherein the passive device die is between the organic package substrate and the composite package substrate.

12. The method of claim 1, wherein the organic package substrate is a cored substrate comprising a dielectric core and conductive pipes in the dielectric core.

13. A method comprising:
  forming a composite package substrate comprising:
    forming a first plurality of redistribution lines (RDLs);
    bonding an interconnect die to the first plurality of RDLs, wherein the interconnect die comprises:
      a semiconductor substrate; and
      a first plurality of through-vias penetrating through the semiconductor substrate;
    encapsulating the interconnect die in a first encapsulant; and
    forming a second plurality of RDLs on an opposite side of the first encapsulant than the first plurality of RDLs, wherein the first plurality of RDLs are electrically connected to the second plurality of RDLs through the first plurality of through-vias;
  bonding a first package component and a second package component over the composite package substrate, wherein the first package component and the second package component are electrically interconnected through the interconnect die; and
  bonding a package substrate underlying the composite package substrate.

14. The method of claim 13 further comprising encapsulating a second plurality of through-vias in the first encapsulant, wherein the first plurality of RDLs are further electrically connected to the second plurality of RDLs through the second plurality of through-vias.

15. The method of claim 13 further comprising disposing a second encapsulant comprising portions on opposite sidewalls of the package substrate.

16. The method of claim 13, wherein first sidewalls of the package substrate are vertically aligned to respective second sidewalls of the composite package substrate.

17. The method of claim 13, wherein the composite package substrate comprises first sidewalls laterally recessed from respective second sidewalls of the package substrate.

18. A method comprising:
  bonding a composite package substrate underlying a first device die and a second device die, the composite package substrate comprising:
    an interconnect die electrically interconnecting the first device die and the second device die; and
    a molding compound encapsulating the interconnect die therein; and joining a package substrate underlying the composite package substrate, wherein the package substrate is electrically connected to the first device die through the interconnect die, wherein the composite package substrate is joined to the package substrate through solder regions, and wherein the solder regions are in physical contact with both of the composite package substrate and the package substrate.

19. The method of claim 18 further comprising molding a plurality of through-vias in the molding compound, wherein the plurality of through-vias electrically connect a plurality of conductive features over the interconnect die to the package substrate.

20. The method of claim 18 further comprising attaching a stiffener ring to the composite package substrate.

* * * * *